(12) United States Patent
Cheng et al.

(10) Patent No.: US 12,396,234 B2
(45) Date of Patent: Aug. 19, 2025

(54) METHOD FOR FORMING SEMICONDUCTOR DEVICE STRUCTURE WITH A CAP LAYER

(71) Applicant: Taiwan Semiconductor Manufacturing Company, Ltd., Hsinchu (TW)

(72) Inventors: Ming-Lung Cheng, Kaohsiung (TW); Huang-Hsuan Lin, Hsinchu (TW); Chih-Chieh Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 504 days.

(21) Appl. No.: 17/721,668

(22) Filed: Apr. 15, 2022

(65) Prior Publication Data
US 2023/0335600 A1   Oct. 19, 2023

(51) Int. Cl.
| | | |
|---|---|---|
| *H10D 64/01* | (2025.01) | |
| *H01L 21/02* | (2006.01) | |
| *H01L 21/28* | (2025.01) | |
| *H01L 21/3213* | (2006.01) | |
| *H10D 30/01* | (2025.01) | |

(Continued)

(52) U.S. Cl.
CPC ......... *H10D 64/01* (2025.01); *H01L 21/0259* (2013.01); *H01L 21/28088* (2013.01); *H01L 21/32133* (2013.01); *H10D 30/031* (2025.01); *H10D 30/6735* (2025.01); *H10D 30/6739* (2025.01); *H10D 30/6757* (2025.01); *H10D 62/118* (2025.01); *H10D 64/679* (2025.01)

(58) Field of Classification Search
CPC ............... H01L 29/401; H01L 21/0259; H01L 21/28088; H01L 21/32133; H01L 29/0665; H01L 29/42392; H01L 29/4908; H01L 29/4991; H01L 29/66742; H01L 29/78696; H01L 21/76834; H01L 21/76897; H01L 21/82345; H01L 27/088; H01L 21/823475; H01L 29/267; H01L 29/42376; H01L 29/4958; H01L 29/6656; H01L 29/66439; H01L 29/6653; H01L 29/66545; H01L 29/775; H01L 21/76224; H01L 29/165; H01L 29/4966; H01L 29/7848; H01L 29/0673; B82Y 10/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Caleb E Henry
(74) *Attorney, Agent, or Firm* — Birch, Stewart, Kolasch & Birch, LLP

(57) ABSTRACT

A method for forming a semiconductor device structure includes forming nanostructures over a substrate. The method also includes forming a work function layer surrounding the nanostructures. The method also includes forming spacers over opposite sides of the work function layer. The method also includes forming a first metal layer over the work function layer and sidewalls of the spacers. The method also includes forming a second metal layer surrounded by the first metal layer. The method also includes etching the first metal layer over opposite sides of the second metal layer. The method also includes forming a cap layer over a top surface and a sidewall of the second metal layer.

20 Claims, 57 Drawing Sheets

(51) Int. Cl.
    *H10D 30/67*     (2025.01)
    *H10D 62/10*     (2025.01)
    *H10D 64/66*     (2025.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,510,871 B1 * | 12/2019 | More | H01L 29/775 |
| 10,692,770 B2 * | 6/2020 | Wu | H01L 21/823456 |
| 10,714,598 B2 * | 7/2020 | Wang | H01L 29/66545 |
| 11,043,580 B2 * | 6/2021 | Wang | H01L 21/28176 |
| 11,302,816 B2 * | 4/2022 | Huang | H10D 30/6219 |
| 11,380,548 B2 * | 7/2022 | Chen | H01L 21/26586 |
| 11,677,012 B2 * | 6/2023 | Wang | H01L 21/28176 438/283 |
| 2015/0221884 A1 * | 8/2015 | Han | H10K 10/484 257/29 |
| 2016/0380056 A1 * | 12/2016 | Yeo | H01L 29/42392 438/283 |
| 2018/0277448 A1 * | 9/2018 | Chen | H01L 29/517 |
| 2020/0105932 A1 * | 4/2020 | Li | H01L 29/785 |
| 2020/0135889 A1 * | 4/2020 | Chien | H01L 29/66825 |
| 2020/0168507 A1 * | 5/2020 | Chang | H01L 21/324 |
| 2021/0050429 A1 * | 2/2021 | Lin | H01L 29/4991 |
| 2021/0057535 A1 * | 2/2021 | Chiang | H10D 64/017 |
| 2021/0159311 A1 * | 5/2021 | Lan | H10D 84/0158 |
| 2021/0313456 A1 * | 10/2021 | Wang | H01L 21/26586 |
| 2022/0052192 A1 * | 2/2022 | Huang | H10D 84/038 |
| 2023/0369493 A1 * | 11/2023 | Huang | H10D 30/62 |

* cited by examiner

METHOD FOR FORMING SEMICONDUCTOR DEVICE STRUCTURE WITH A CAP LAYER

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2P-1, 2Q-1, 2R-1, 2S-1, 2T-1, 2U-1, 2V-1, 2W-1, 2X-1, 2Y-1 are cross-sectional representations of various stages of forming a semiconductor device structure, in accordance with some embodiments of the disclosure.

FIGS. 2S-2, 2T-2, 2U-2, 2V-2, 2W-2, 2X-2, 2Y-2 are cross-sectional representations of various stages of forming a semiconductor device structure, in accordance with some embodiments of the disclosure.

DETAILED DESCRIPTION

Figure 1:
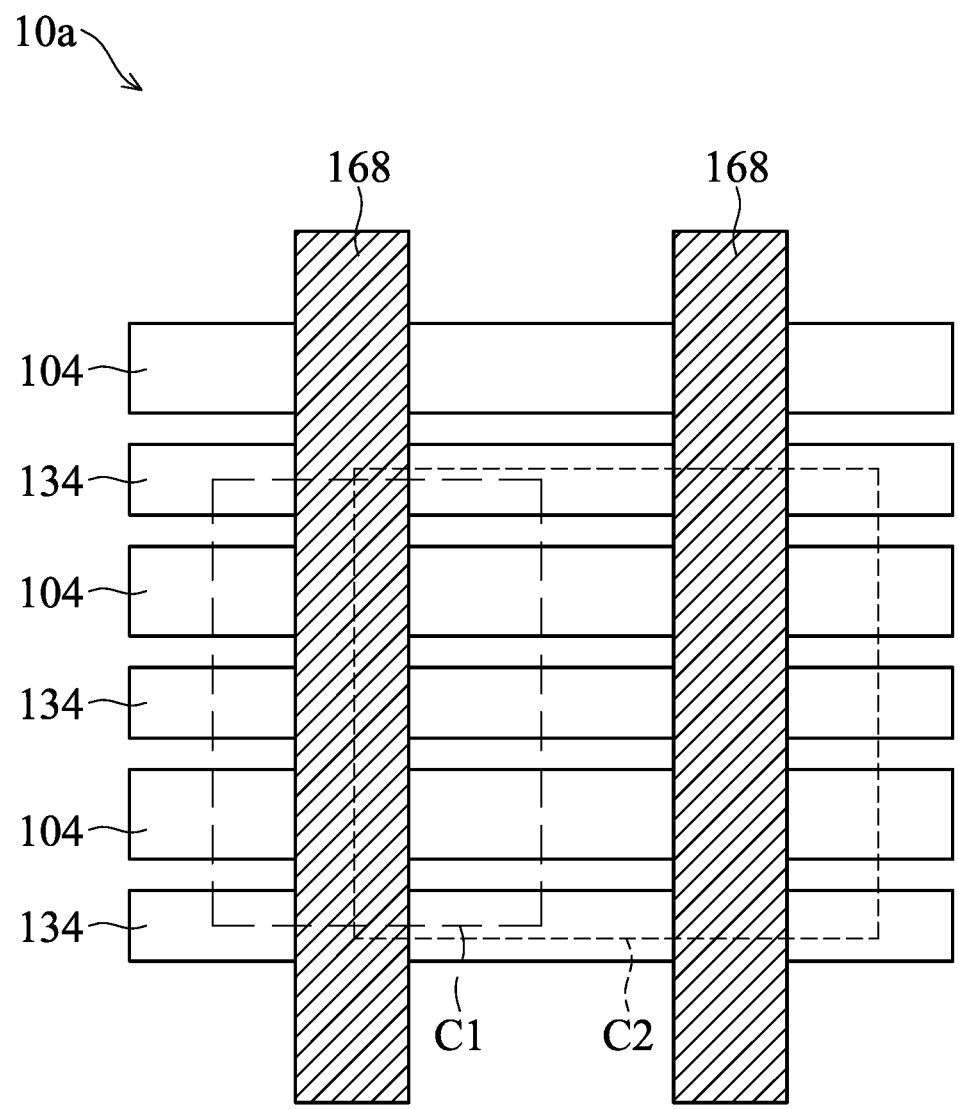
FIG. 1 is a top view of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The method for forming the semiconductor device structure may include forming an inverted T-shape gate structure by depositing different metal layers with different etching selectivity as the gate electrode. The cap layer may be formed between the gate electrode and the spacer layers. The parasitic capacitance may be reduced and device performance may be enhanced.

FIG. 1 is a top view of a semiconductor structure 10a in accordance with some embodiments. FIG. 1 has been simplified for the sake of clarity to better understand the inventive concepts of the present disclosure. Additional features may be added in the semiconductor structure 10a, and some of the features described below may be replaced, modified, or eliminated.

The semiconductor structure 10a may include multi-gate devices and may be included in a microprocessor, a memory, or other IC devices. For example, the semiconductor structure 10a may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LD MOS) transistors, high voltage transistors, high frequency transistors, other applicable component, or a combination thereof.

Figure 2A:
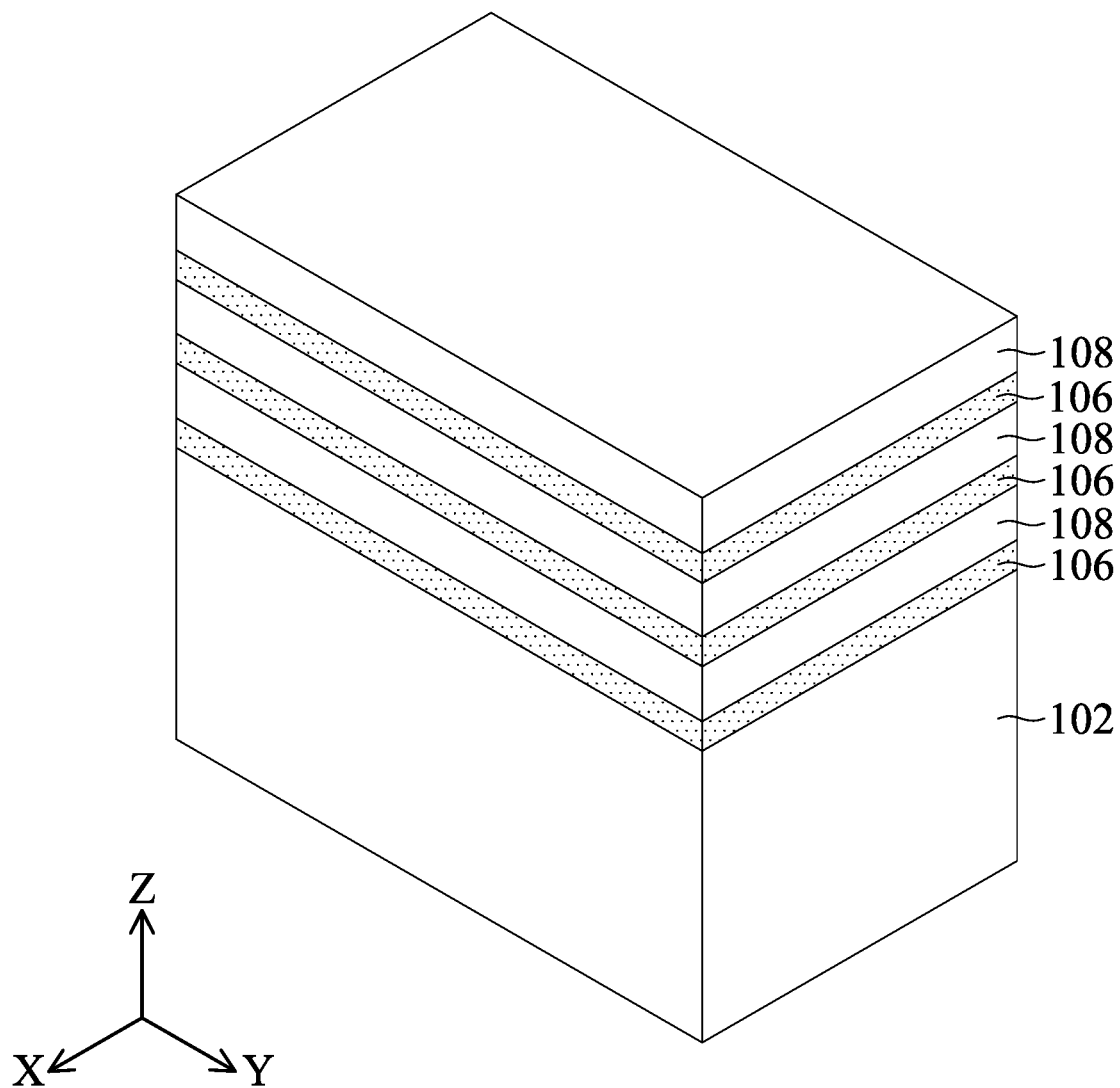
FIGS. 2A-2Y are perspective representations of various stages of forming a semiconductor device structure, in accordance with some embodiments of the disclosure.
Figure 2B:
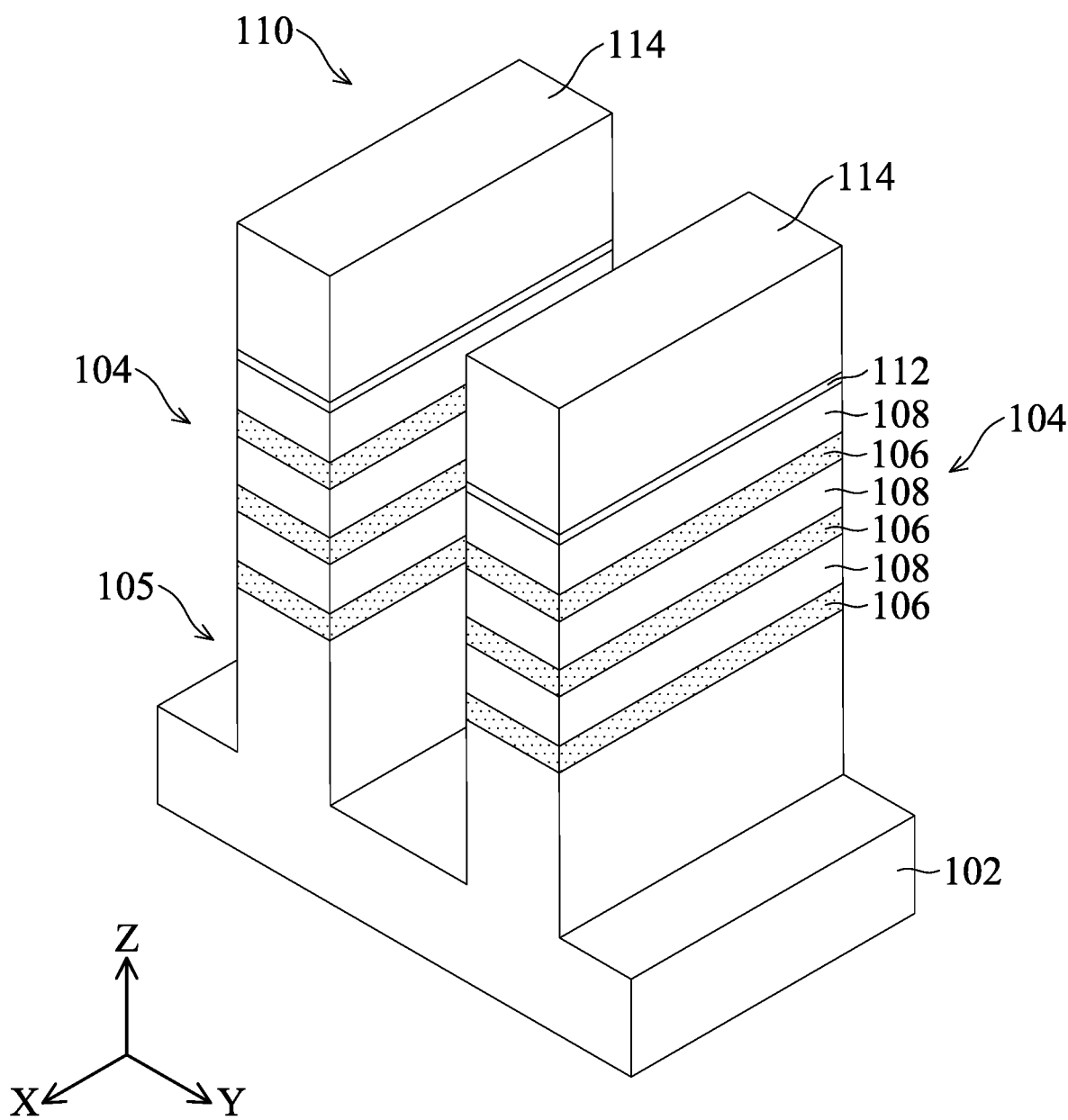
Figure 2C:
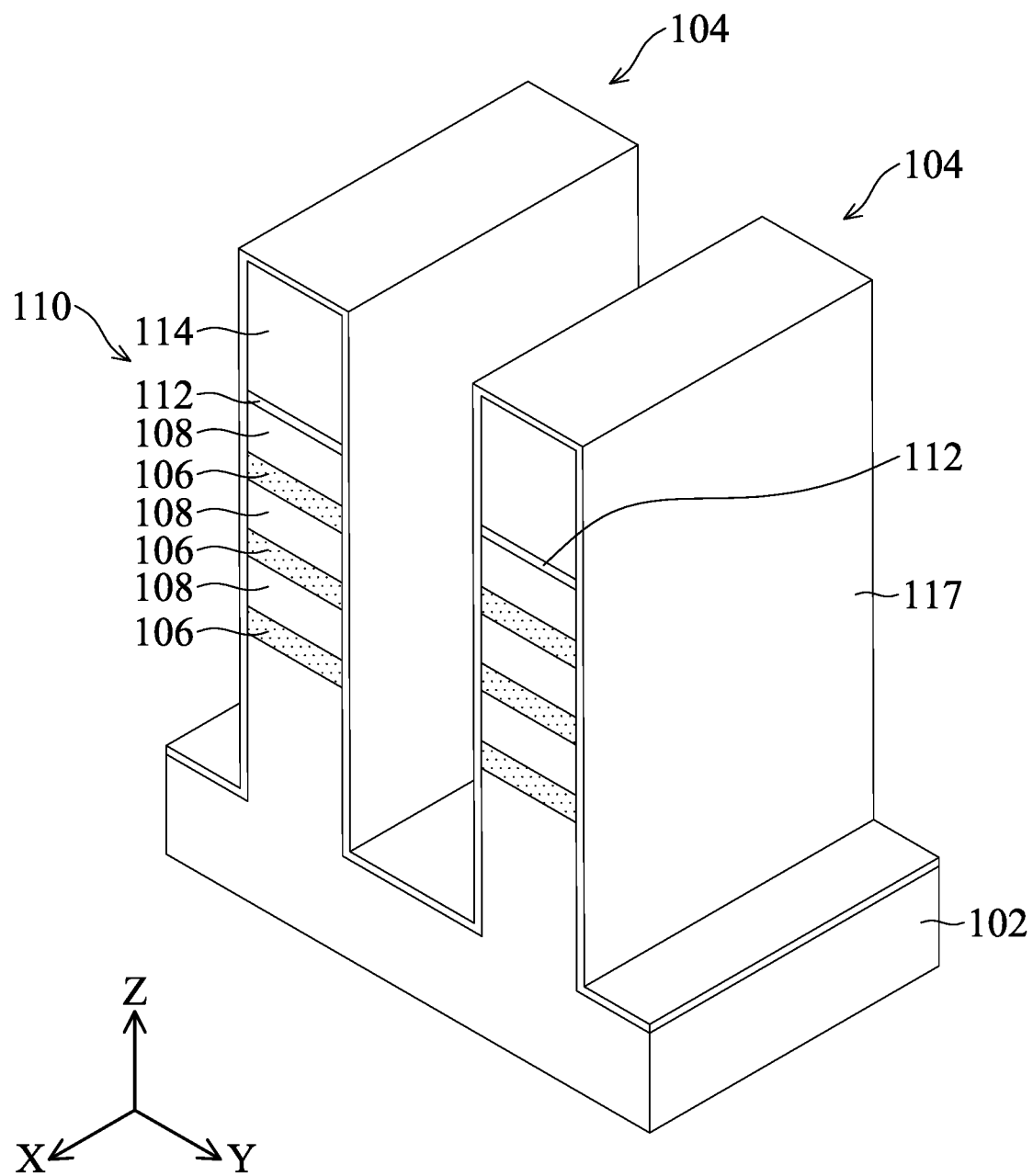
Figure 2D:
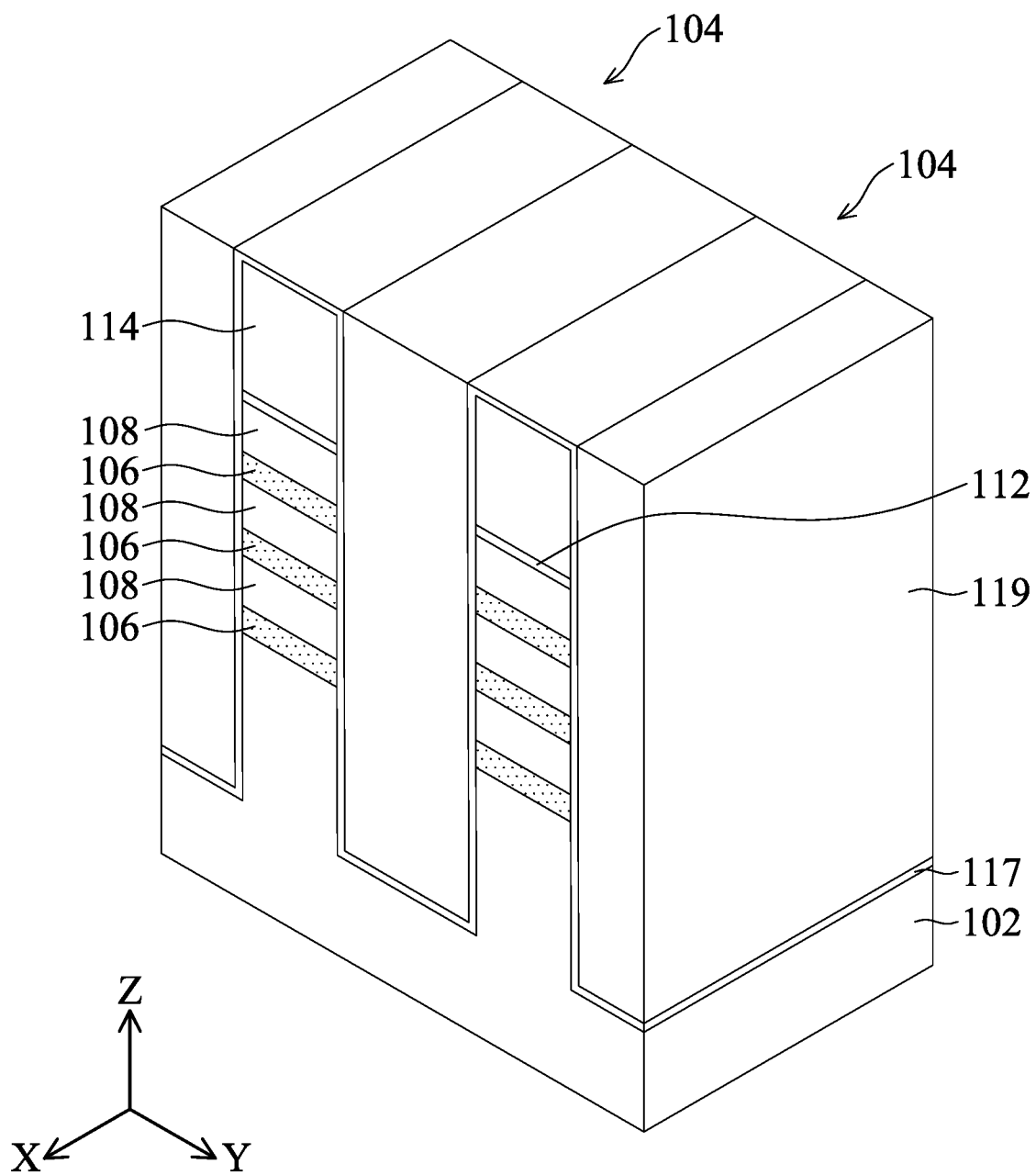
Figure 2E:
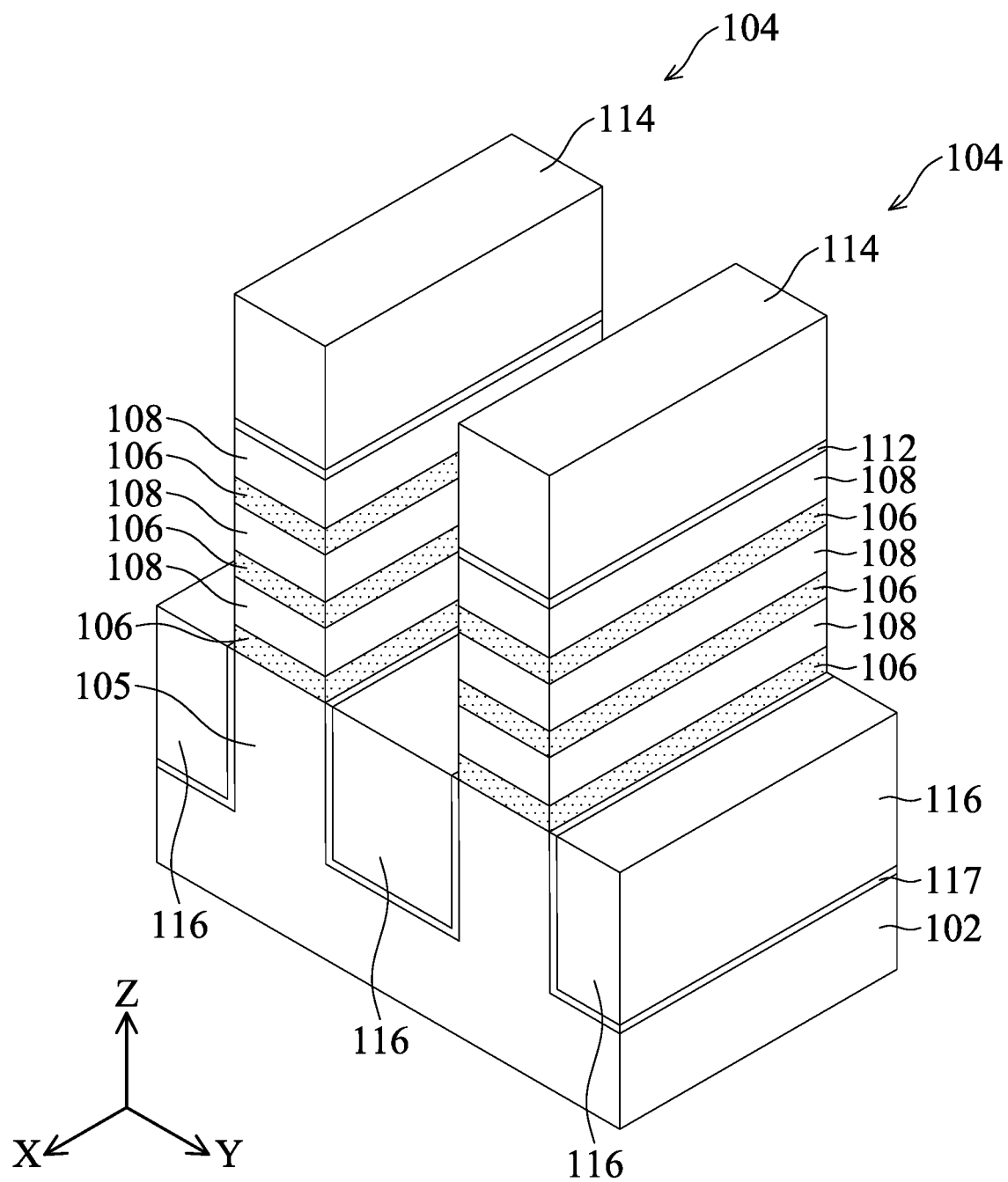
Figure 2F:
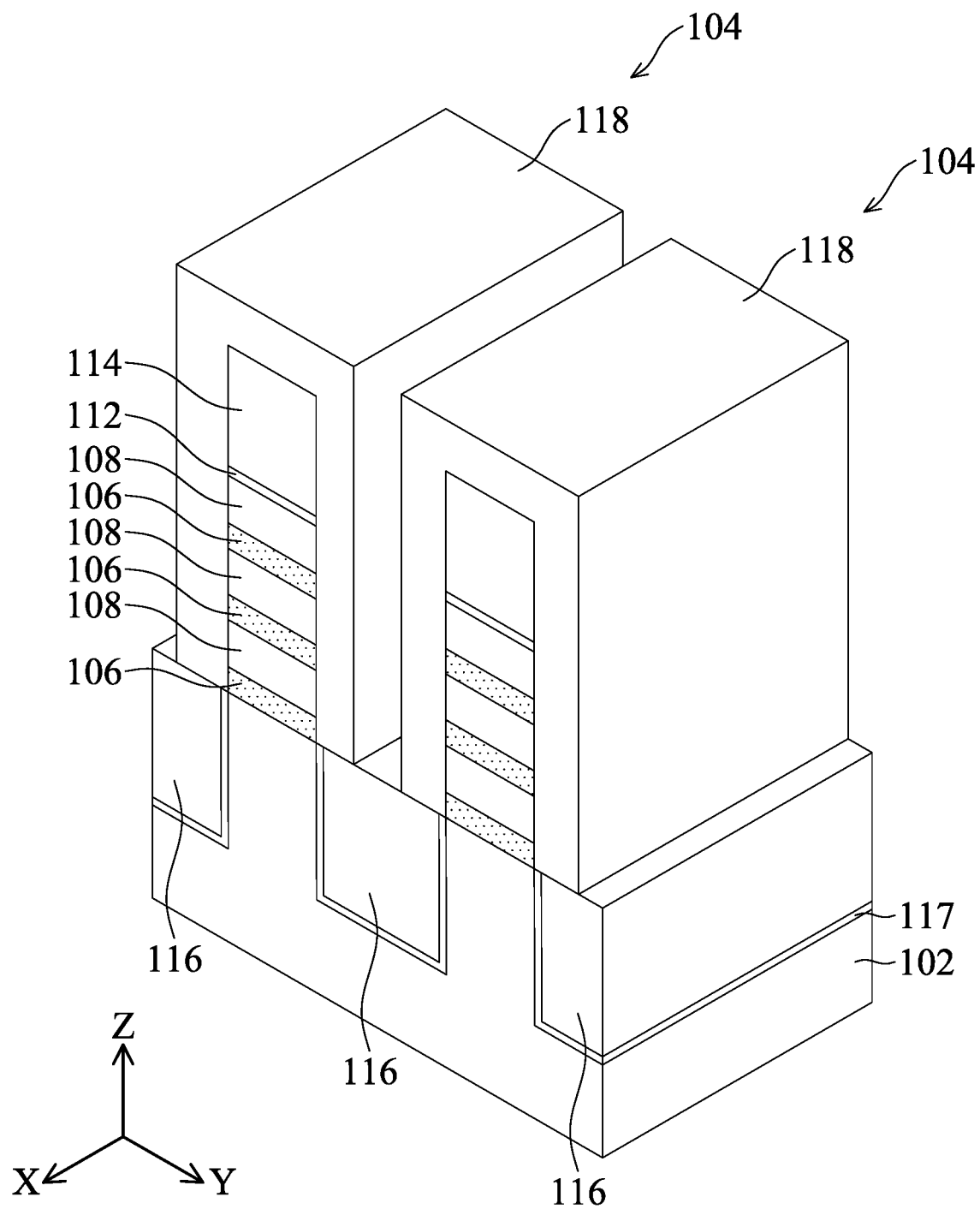
Figure 2G:
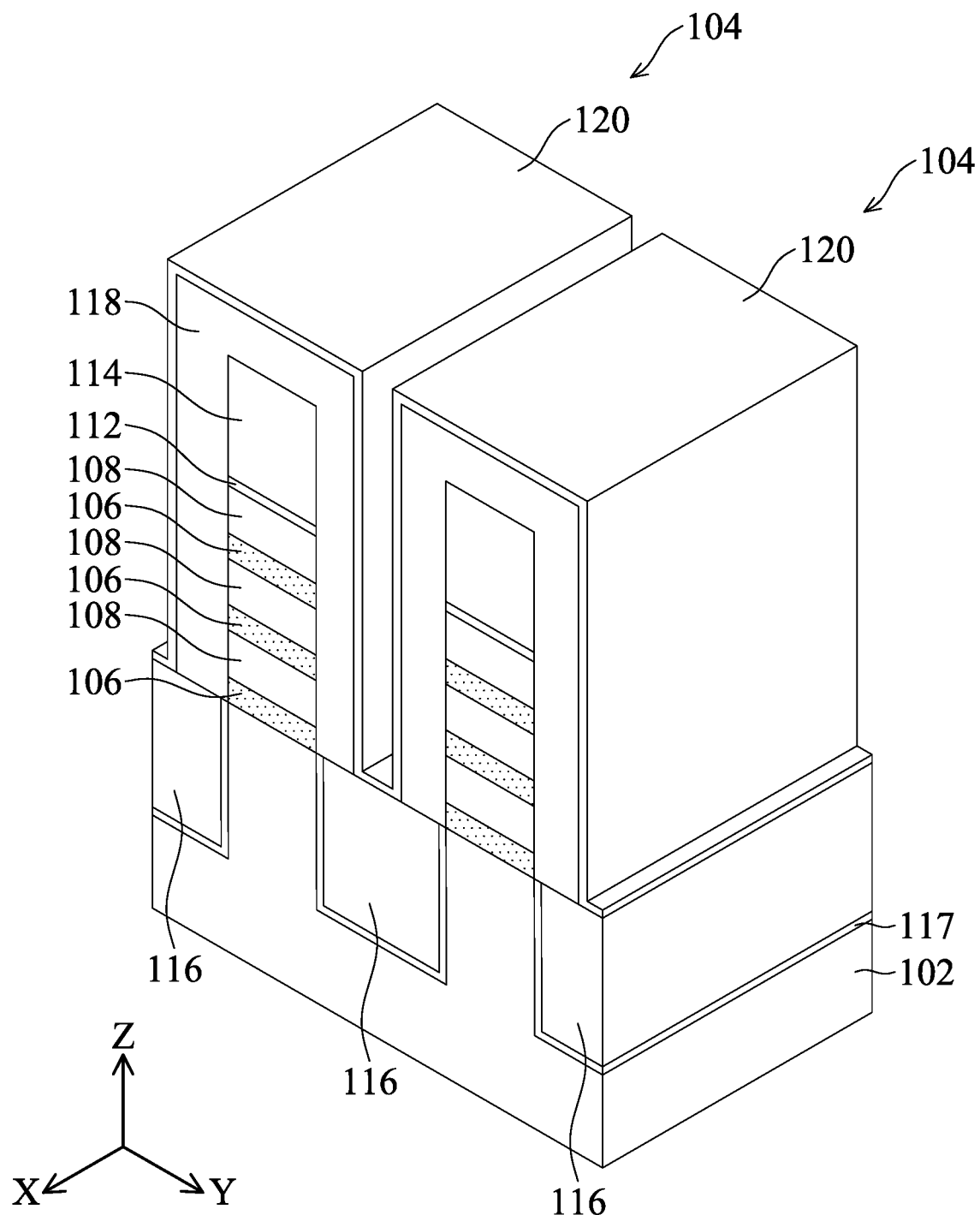
Figure 2H:
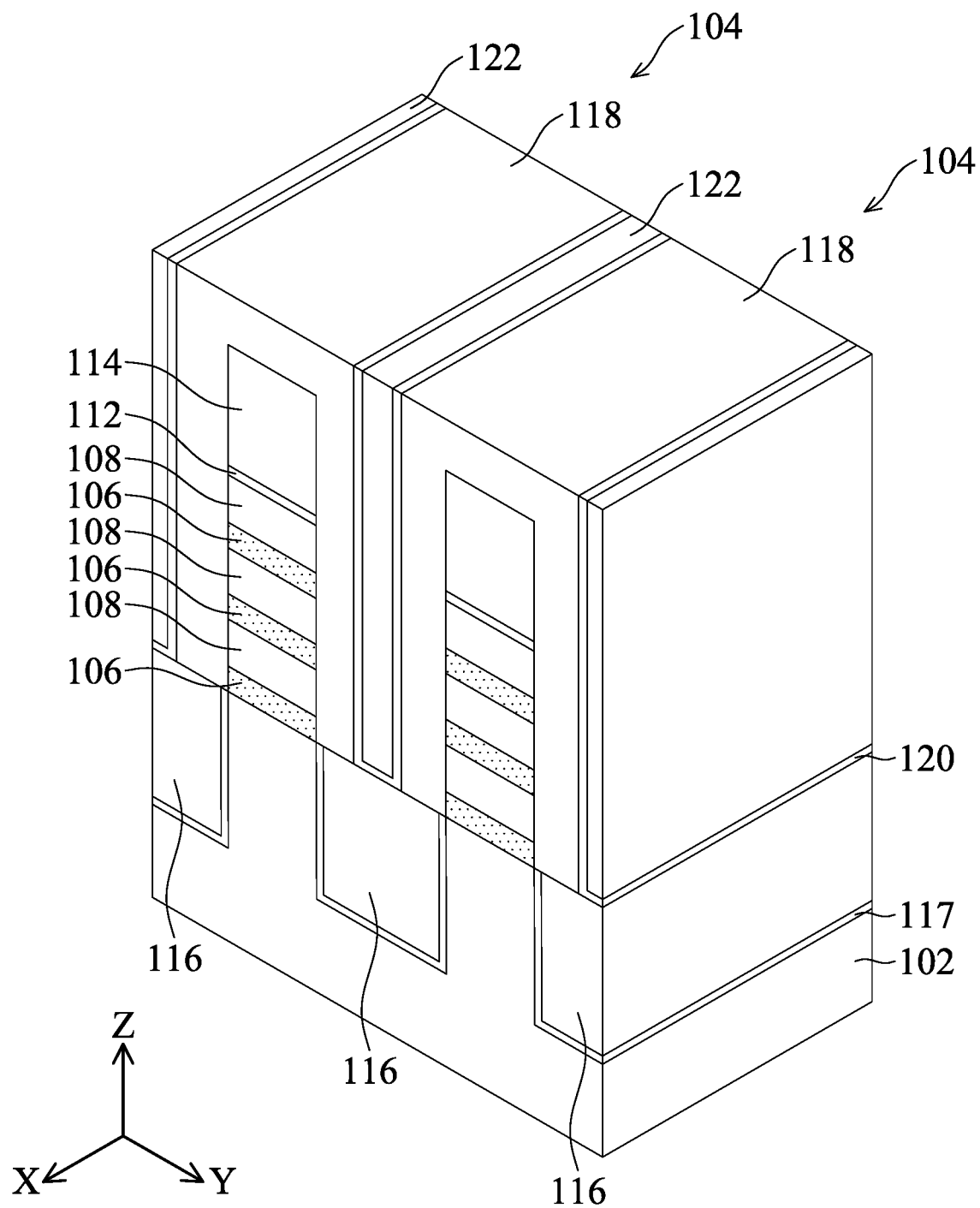
Figure 2I:
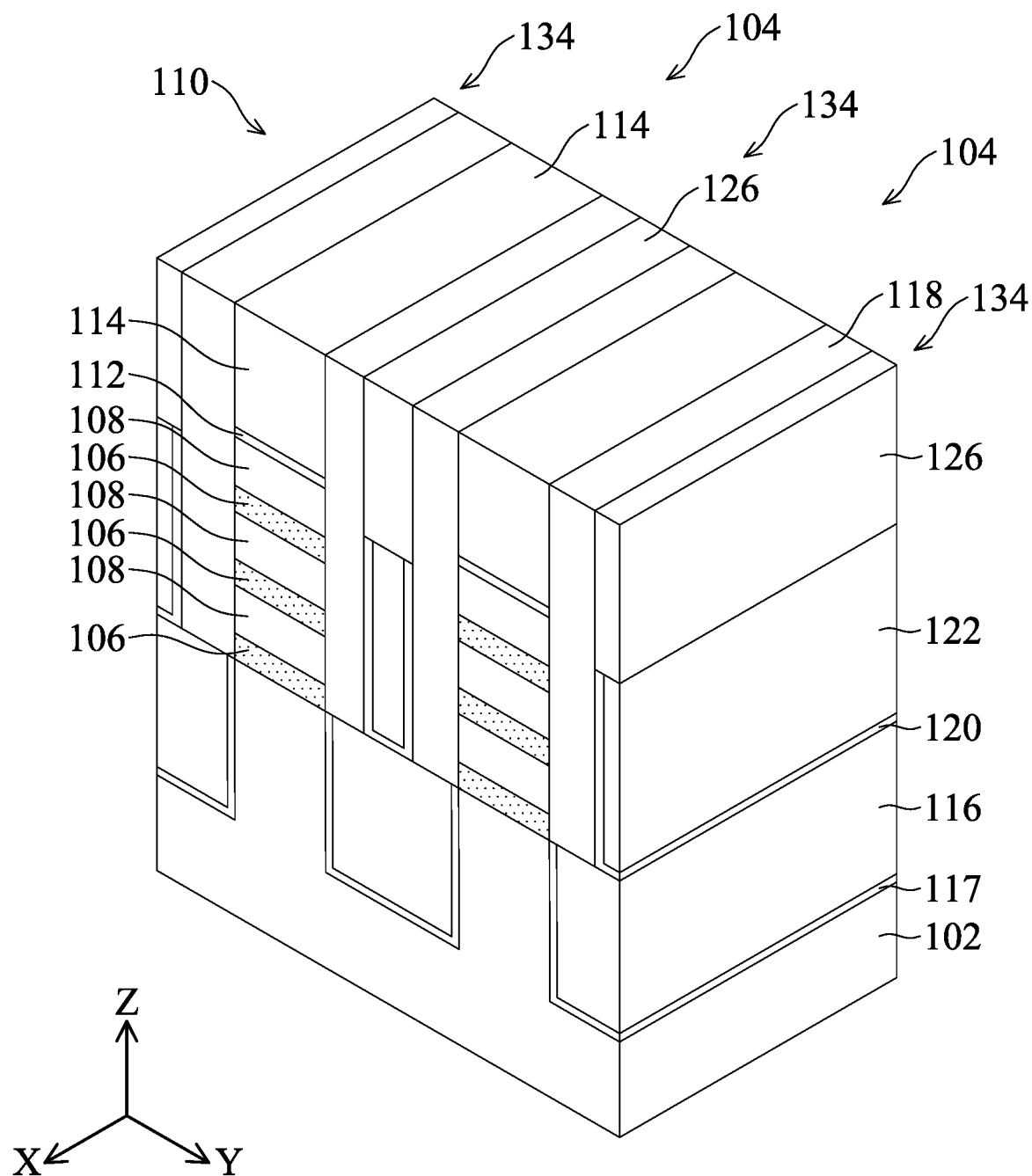
Figure 2J:
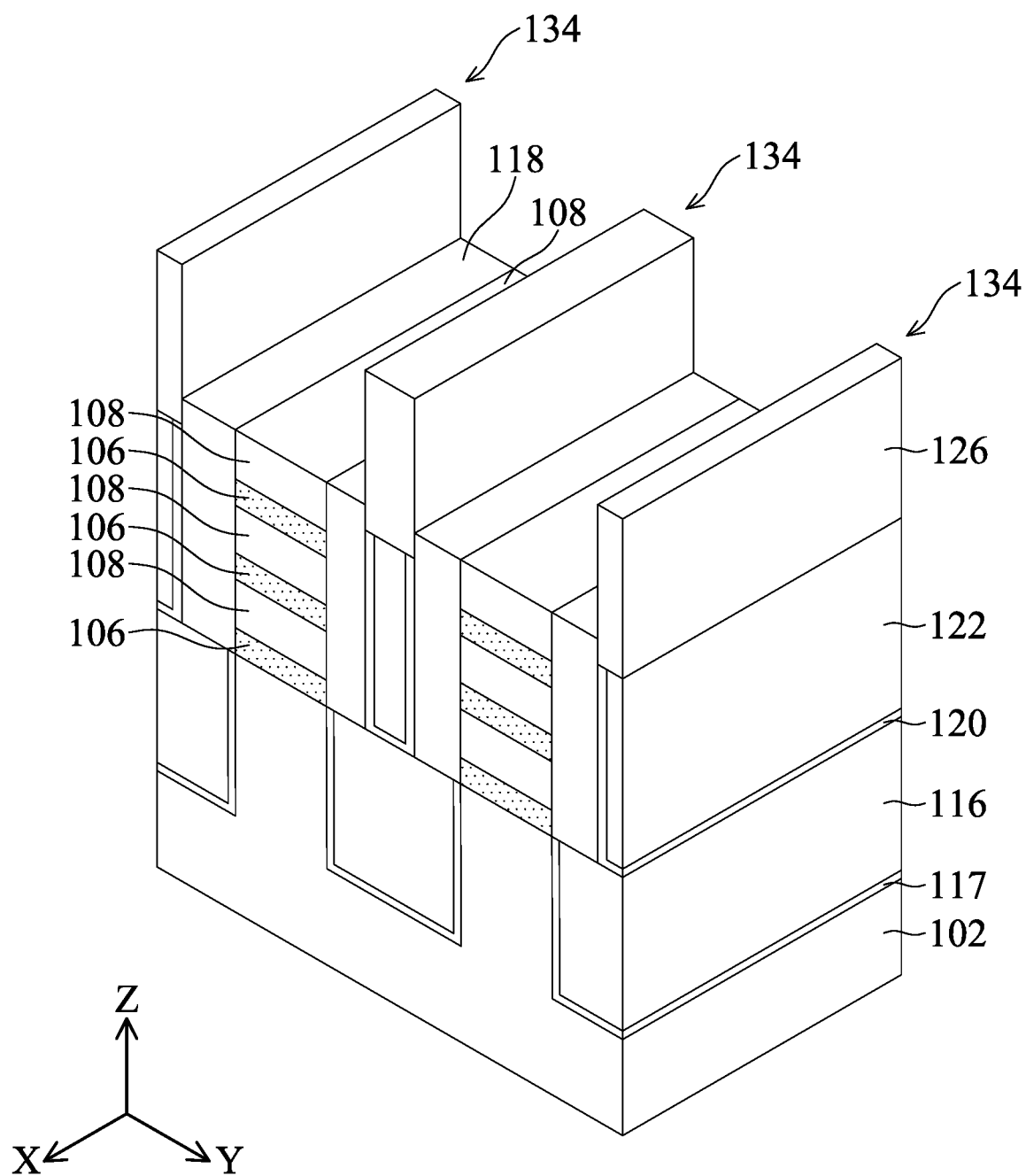
Figure 2K:
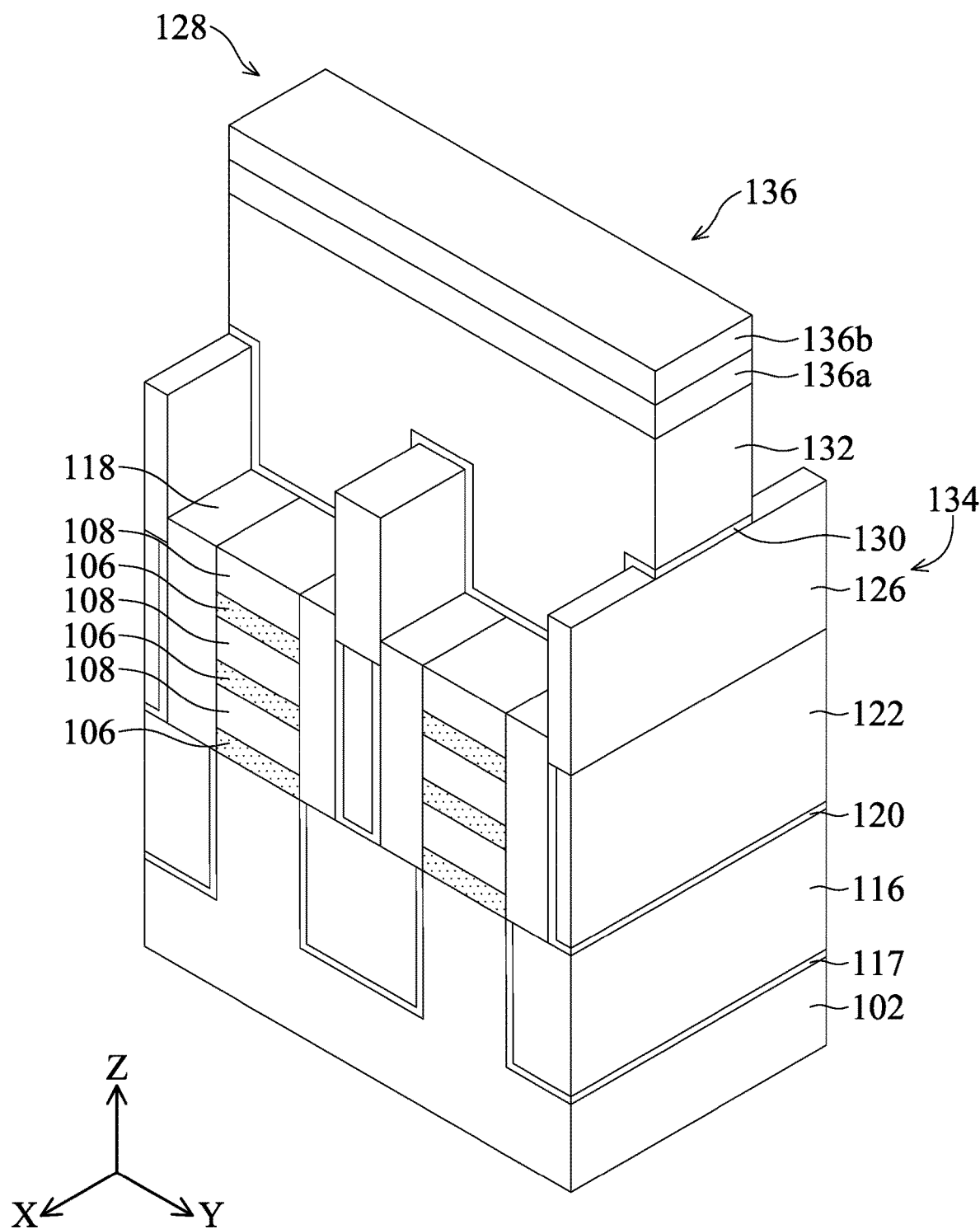
Figure 2L:
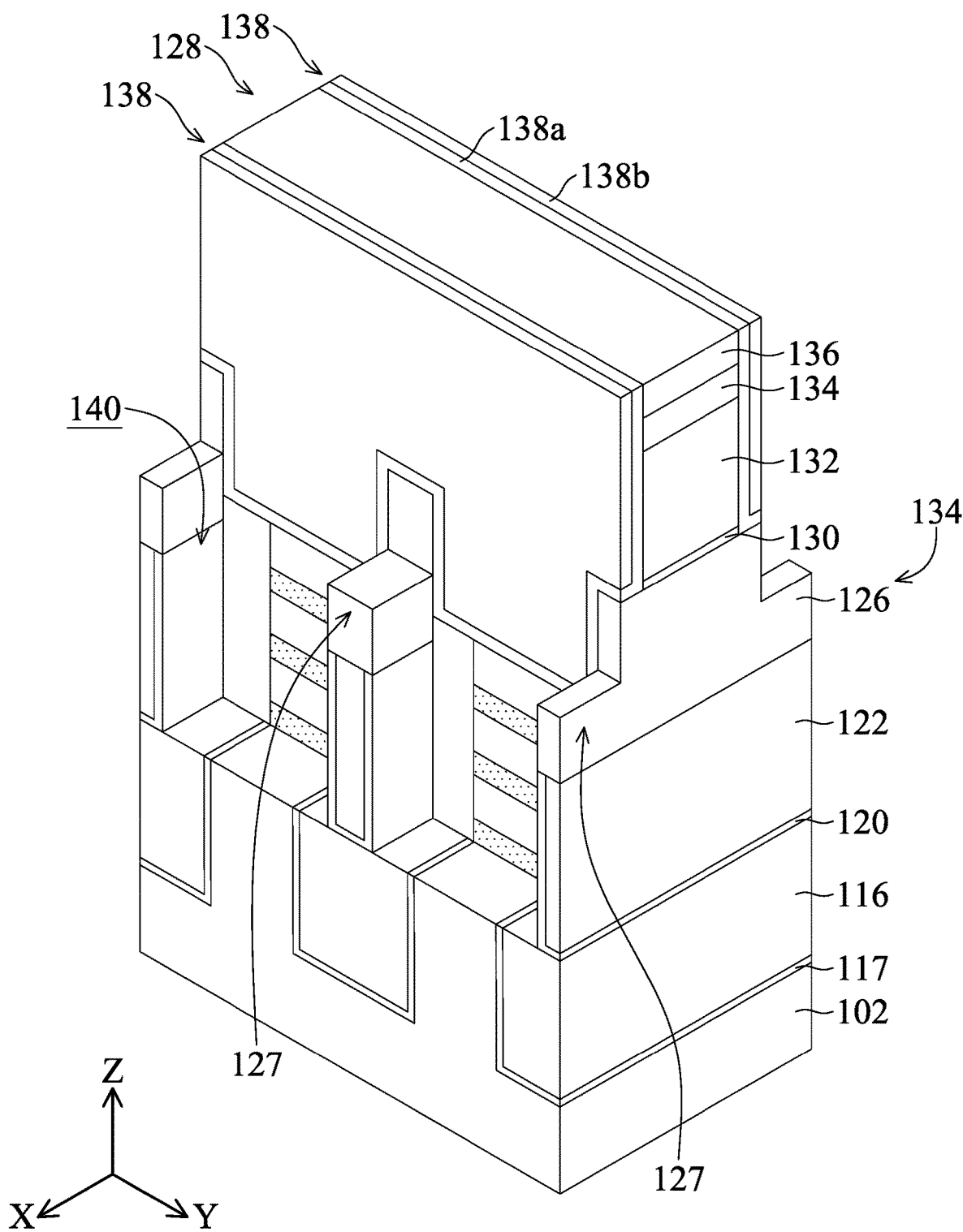
Figure 2M:
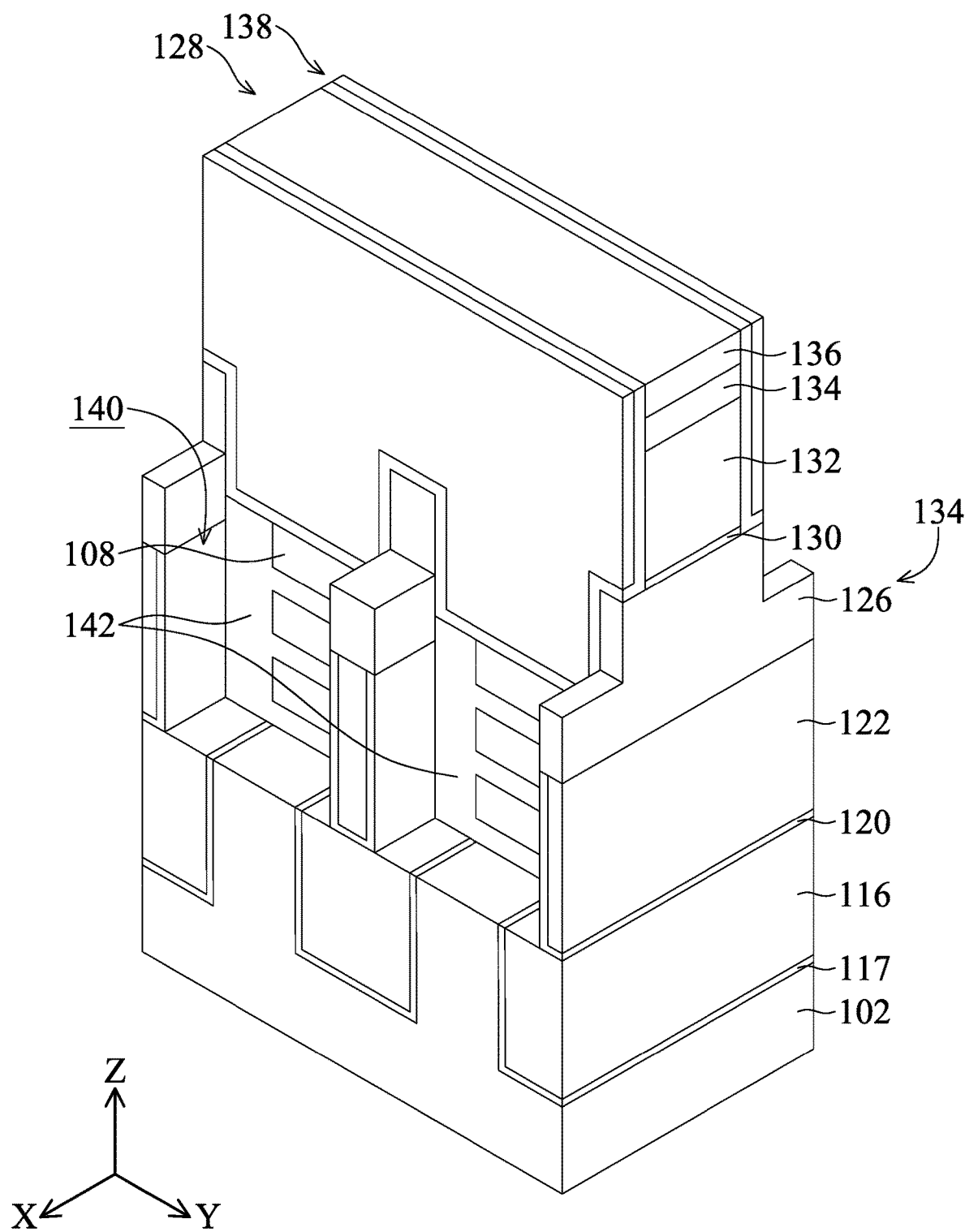
Figure 2N:
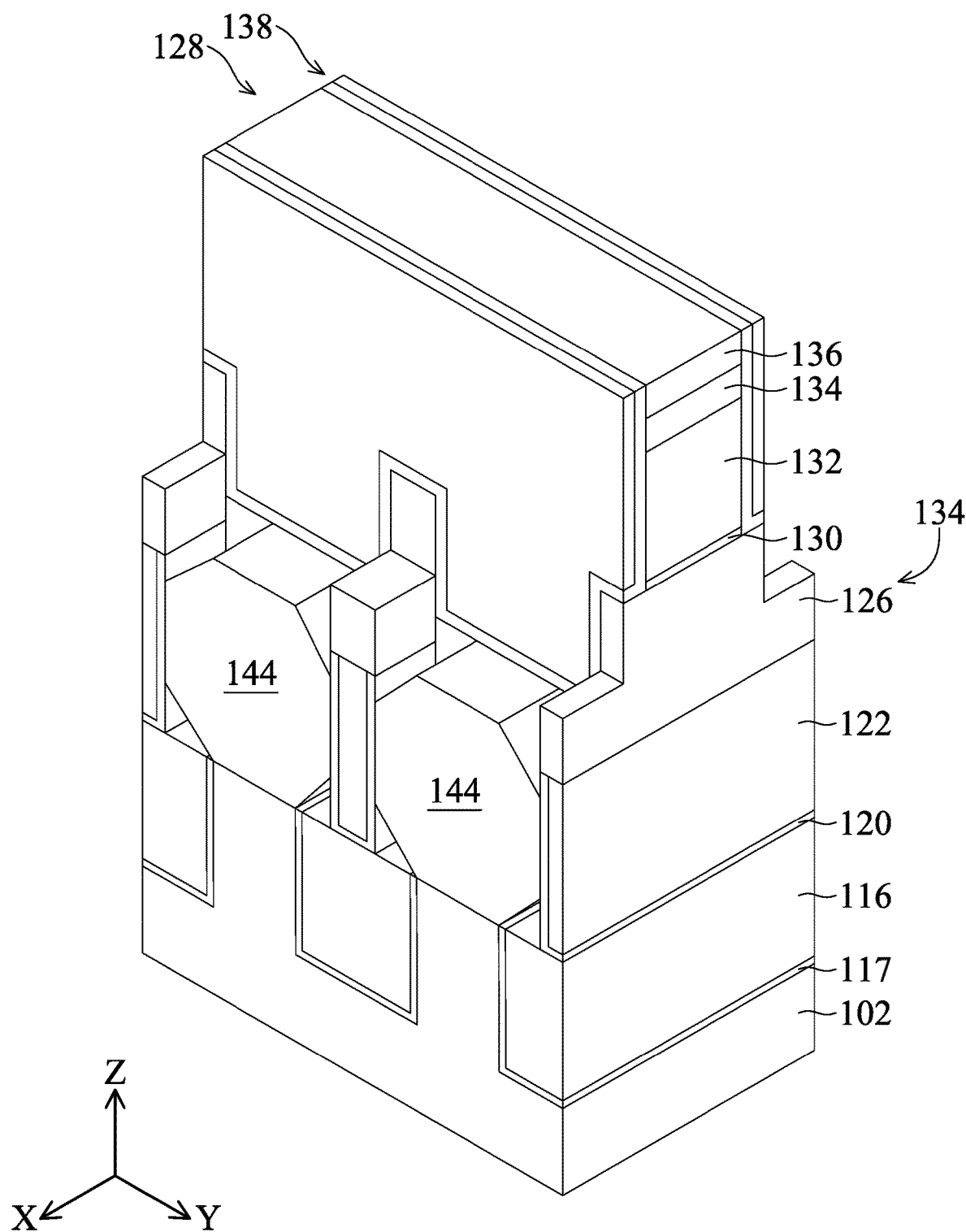
Figure 2O:
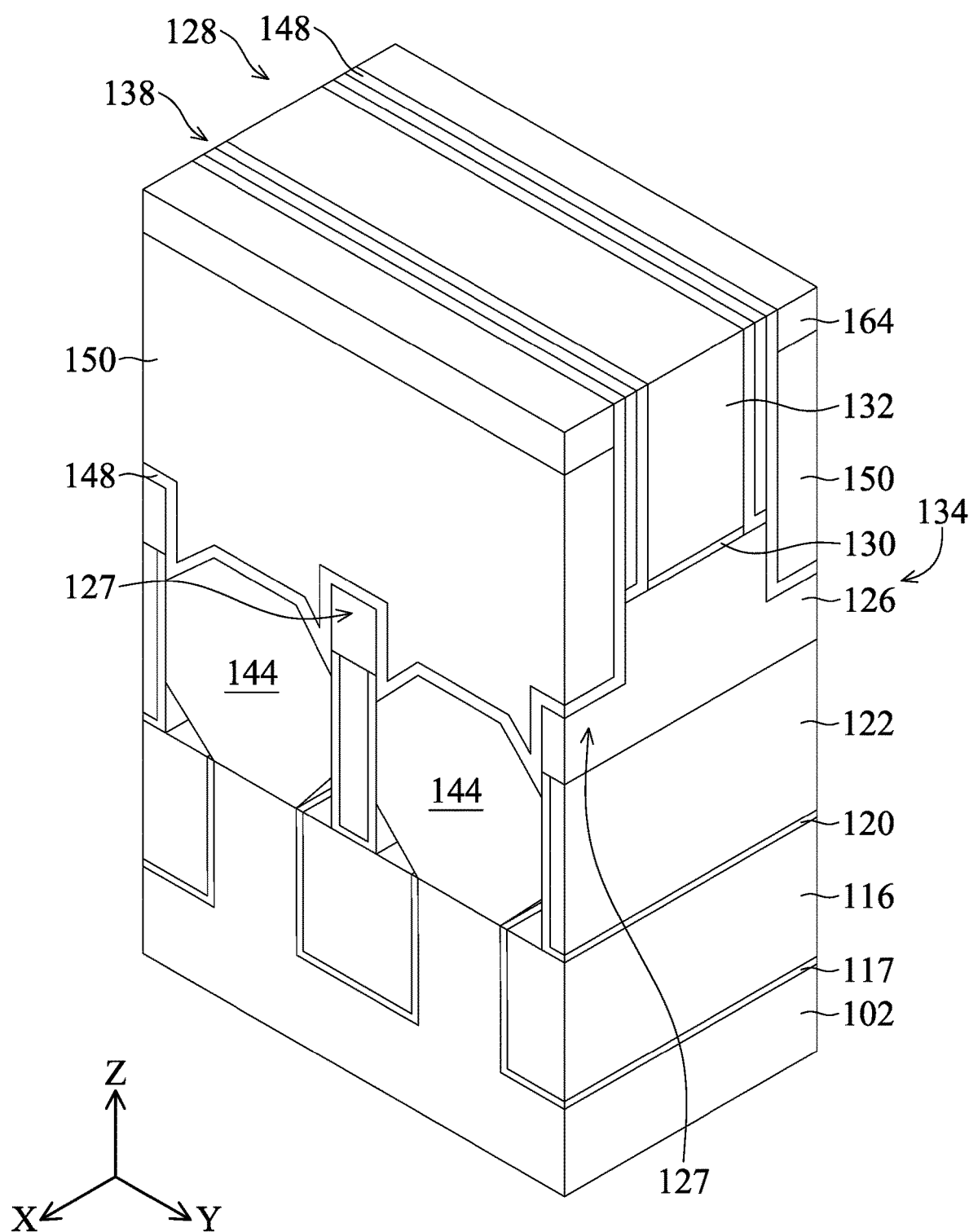
Figure 2P:
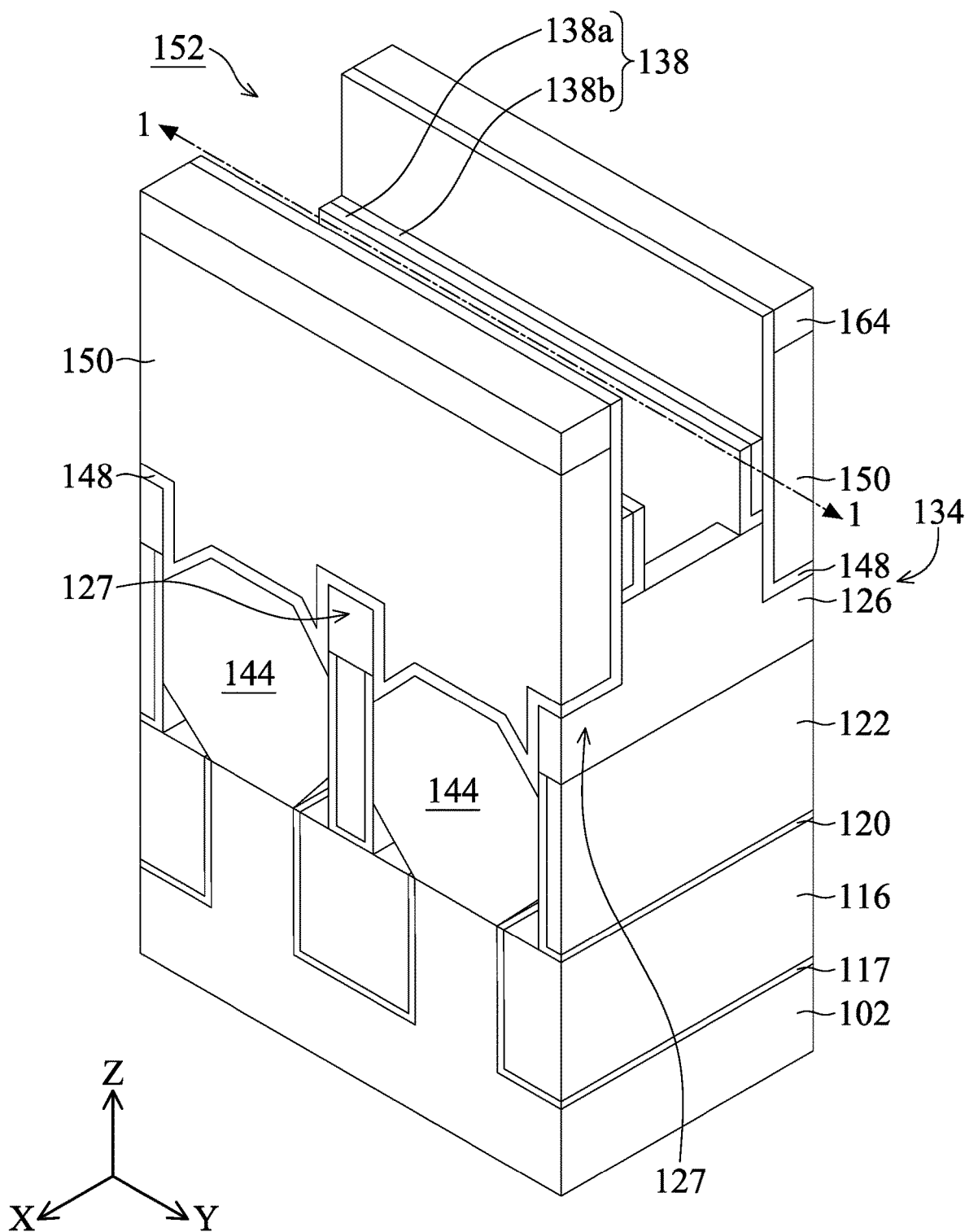
Figures 1, 2P:
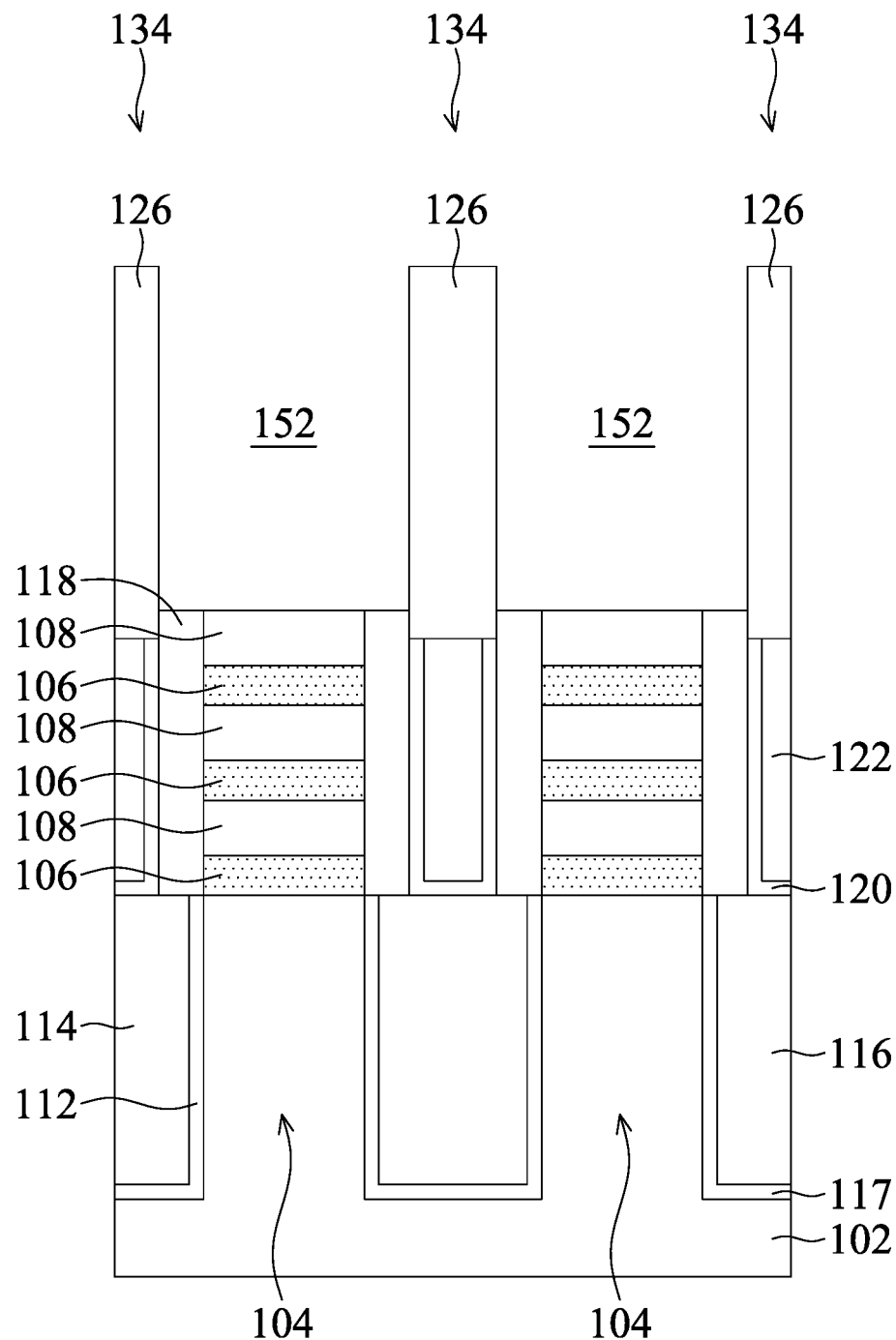
Figure 2Q:
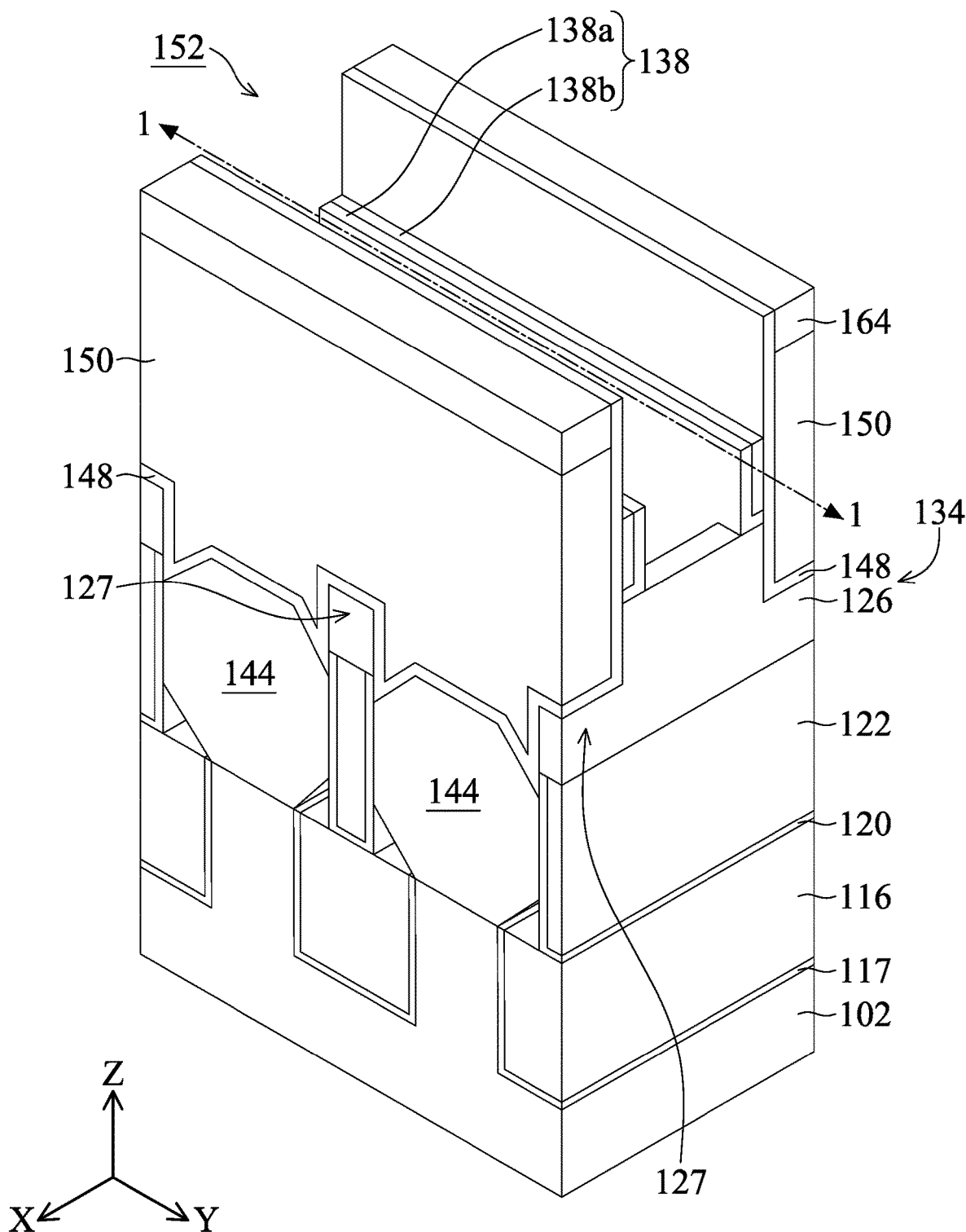
Figures 1, 2Q:
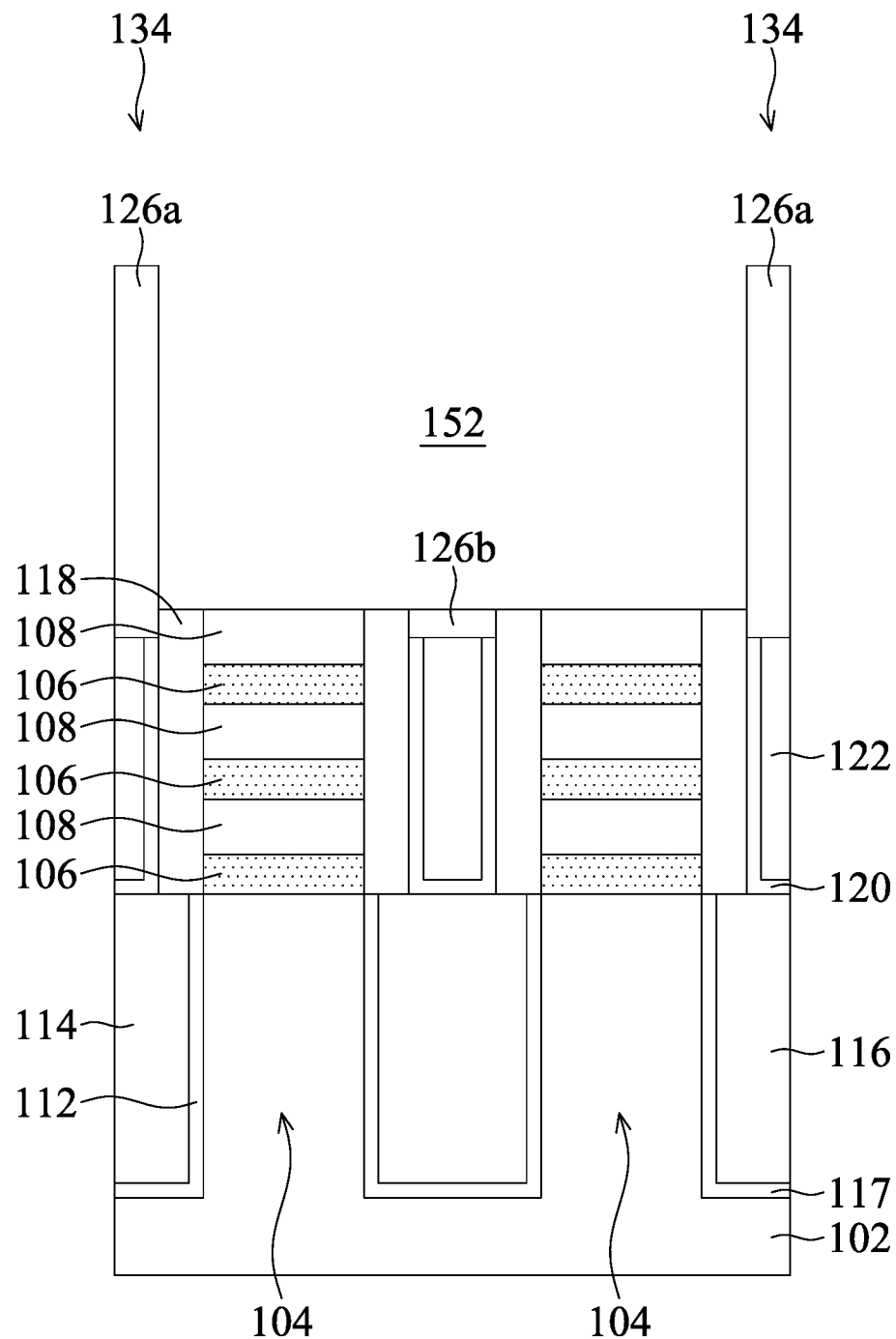
Figure 2R:
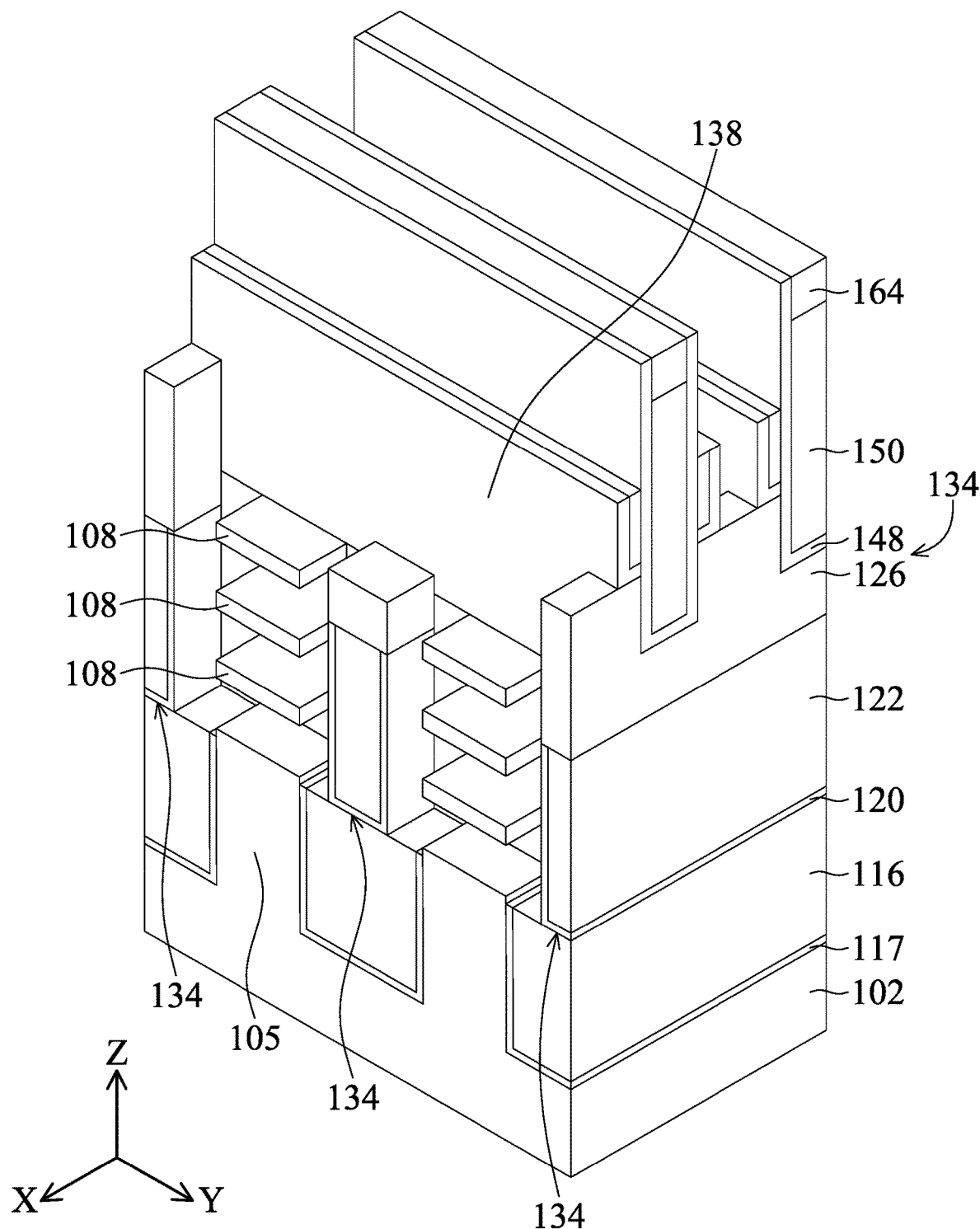
Figures 1, 2R:
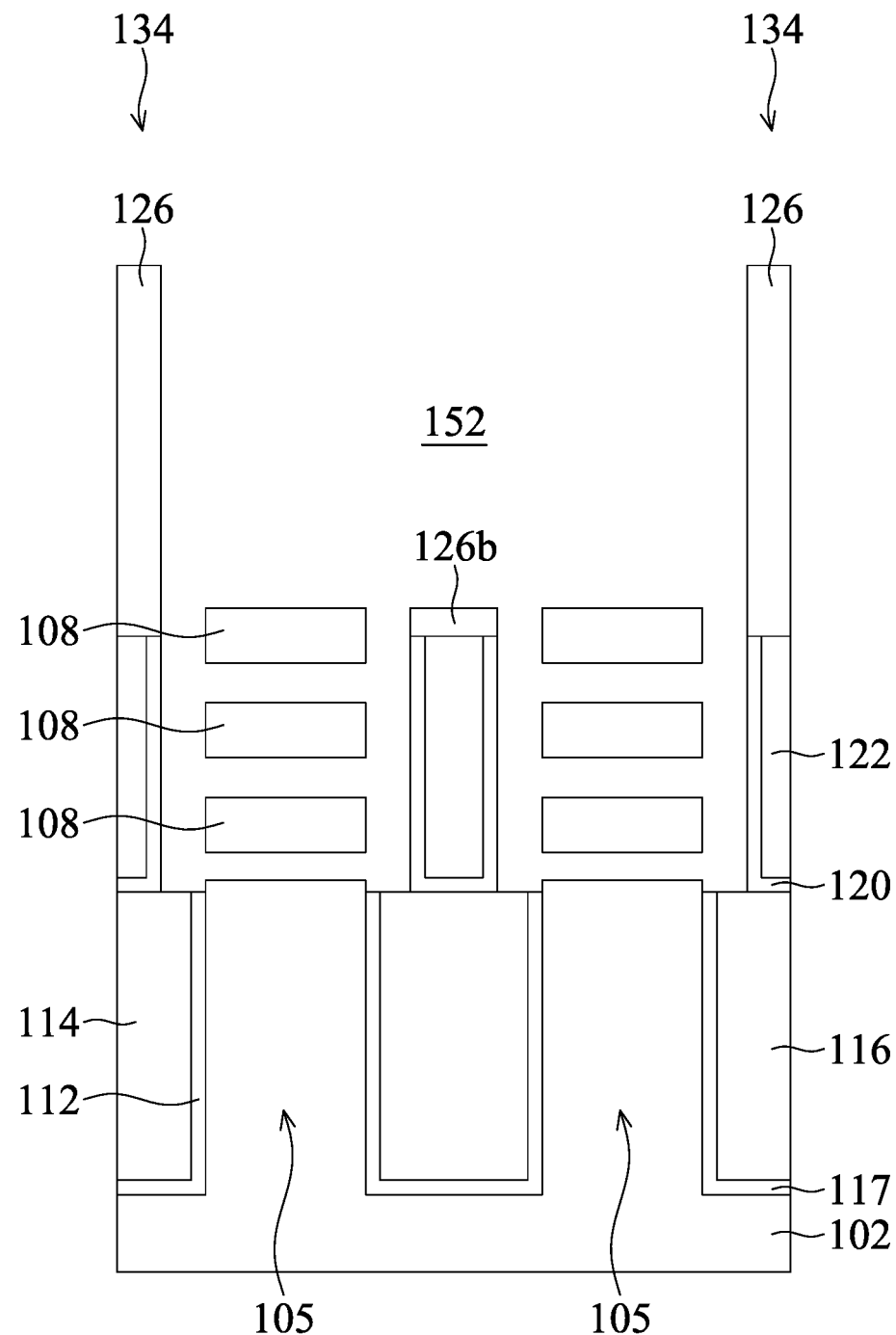
Figure 2S:
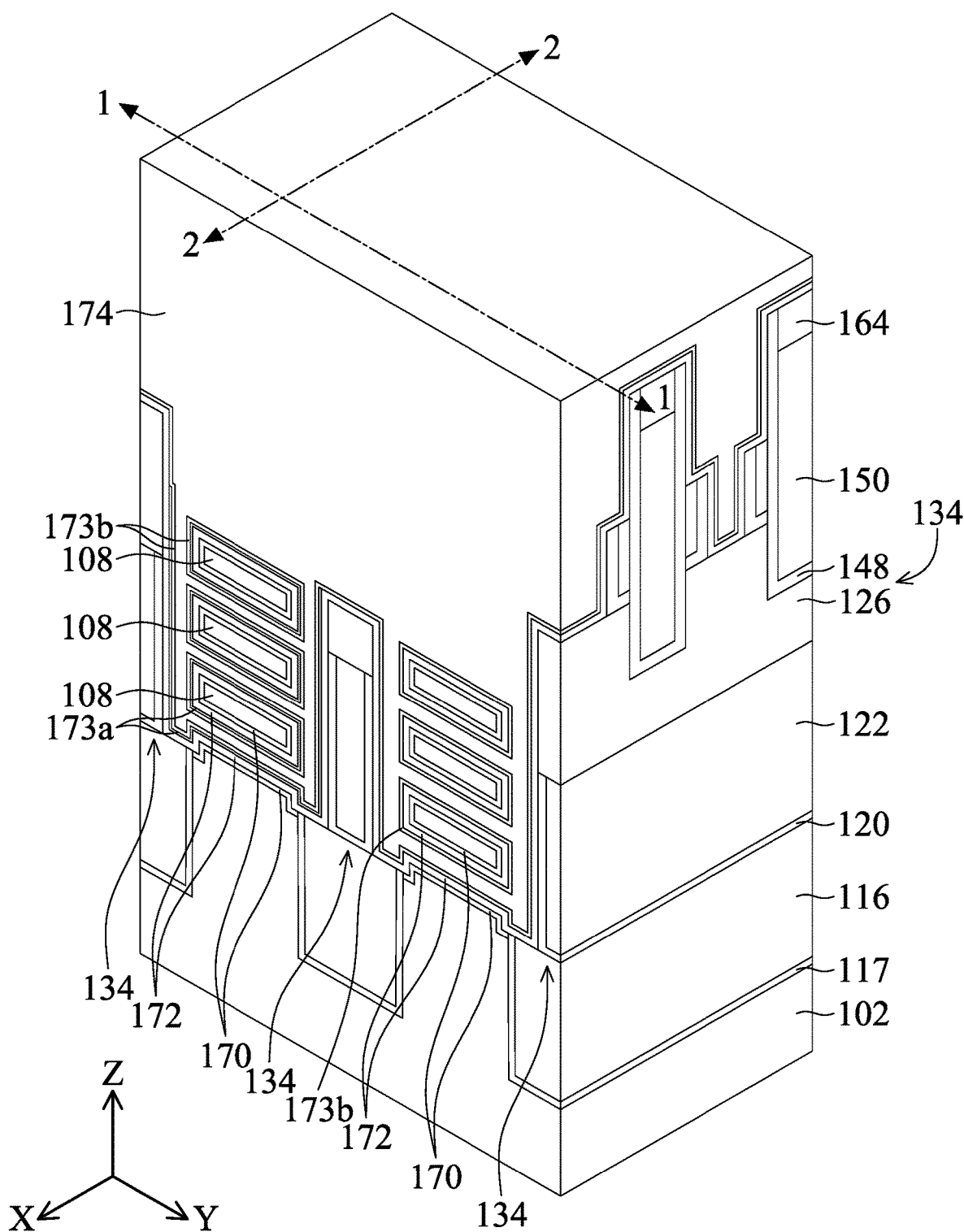
Figures 1, 2S:
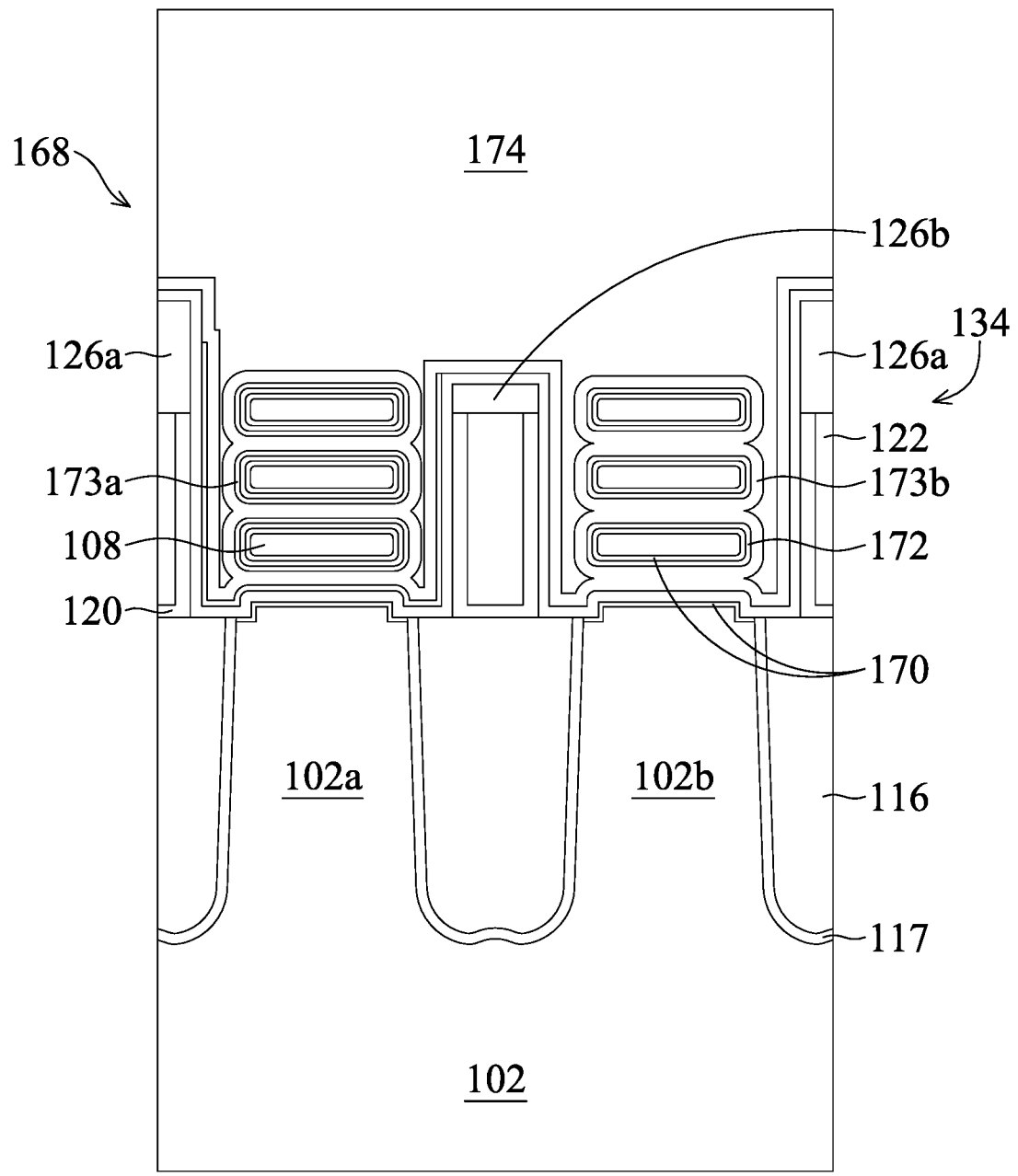
Figures 2, 2S:
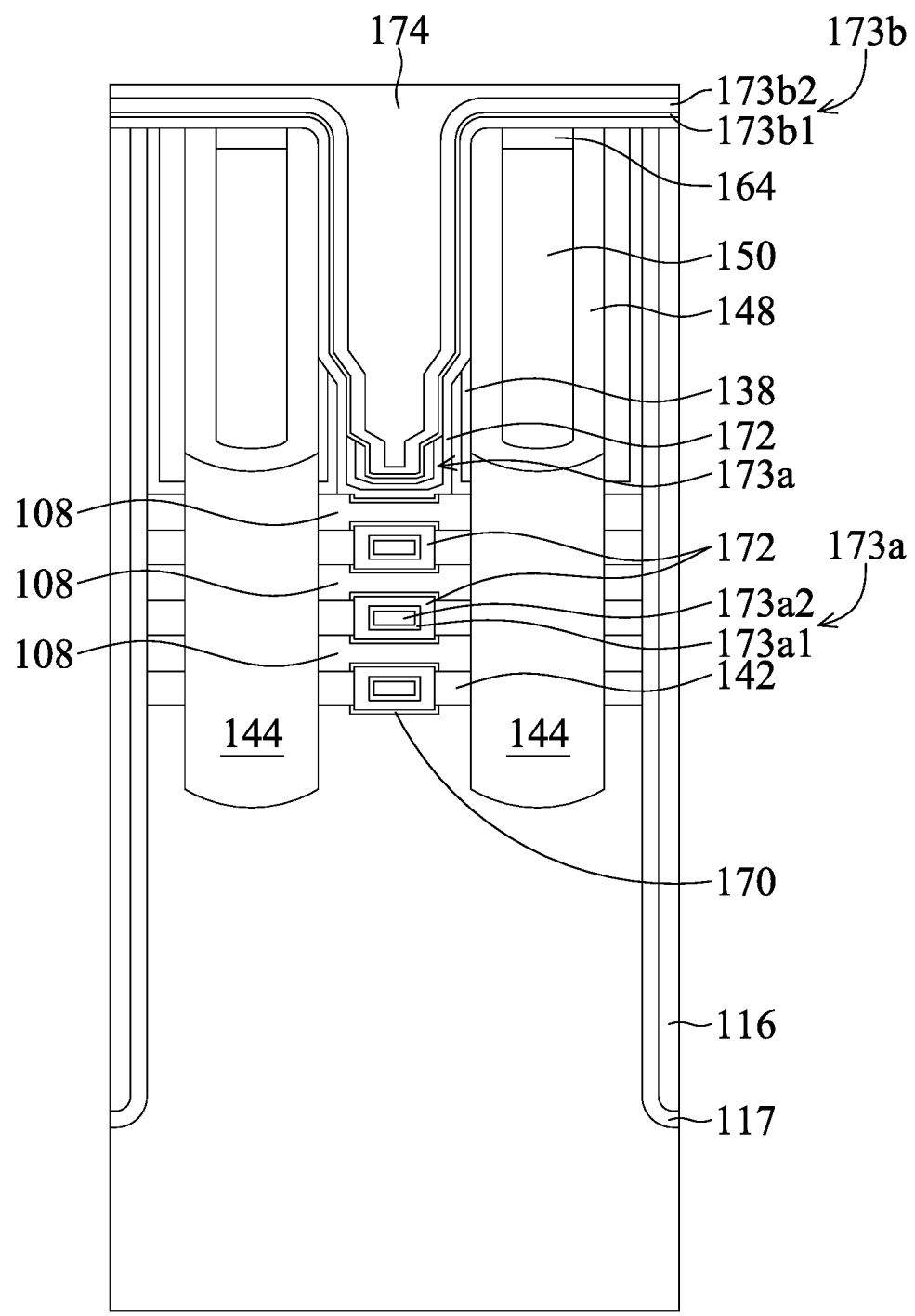
Figure 2T:
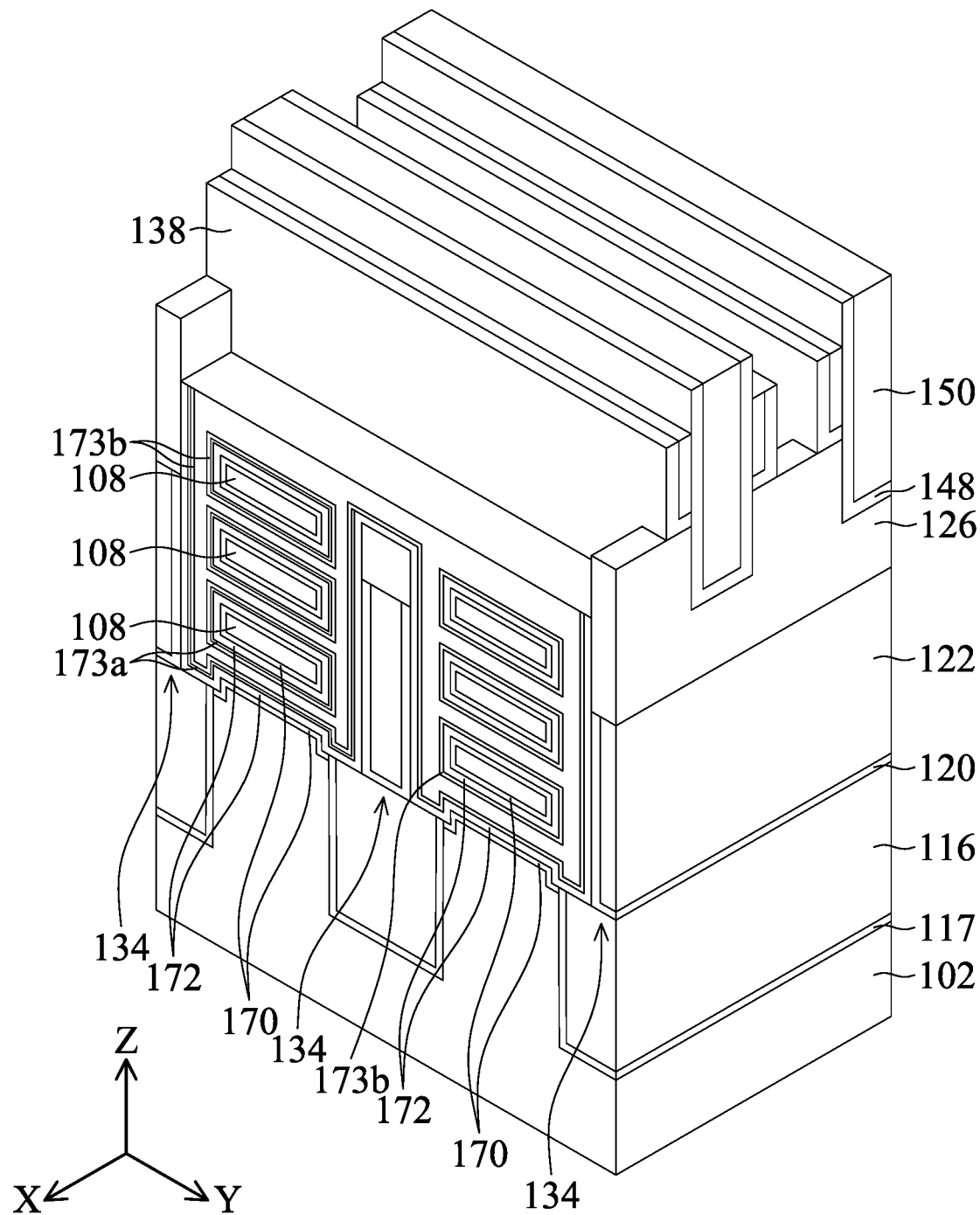
Figures 1, 2T:
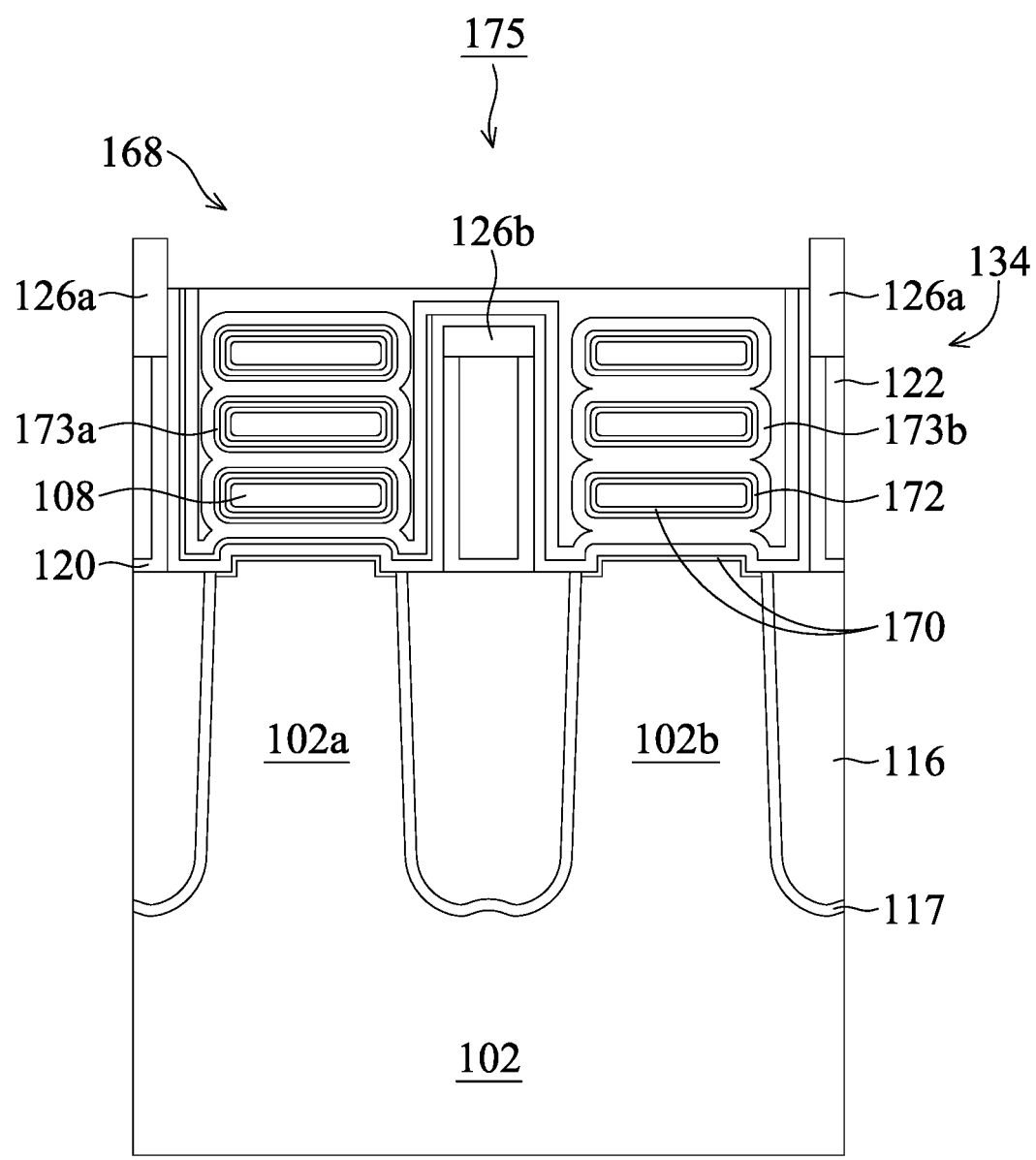
Figures 2, 2T:
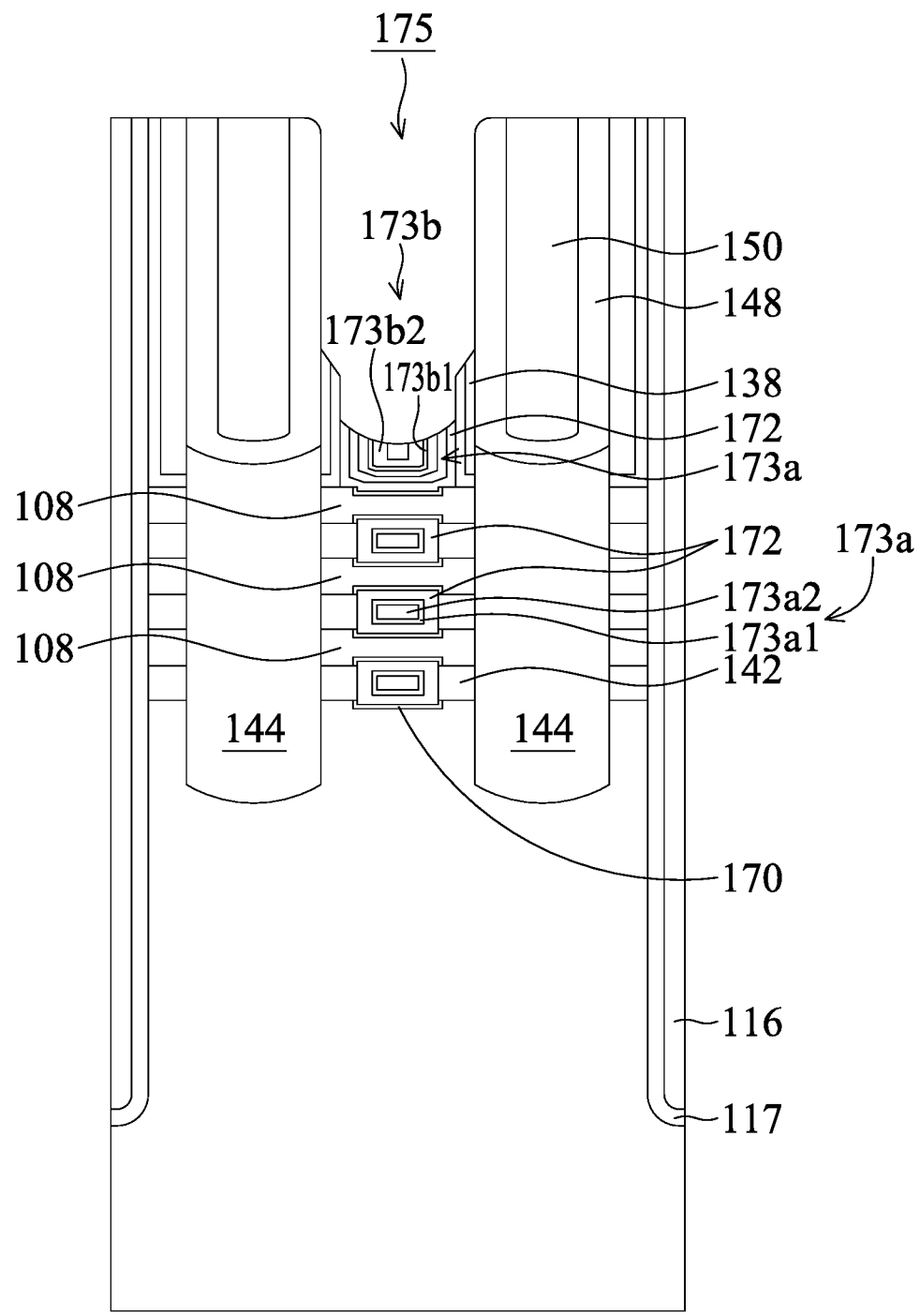
Figure 2U:
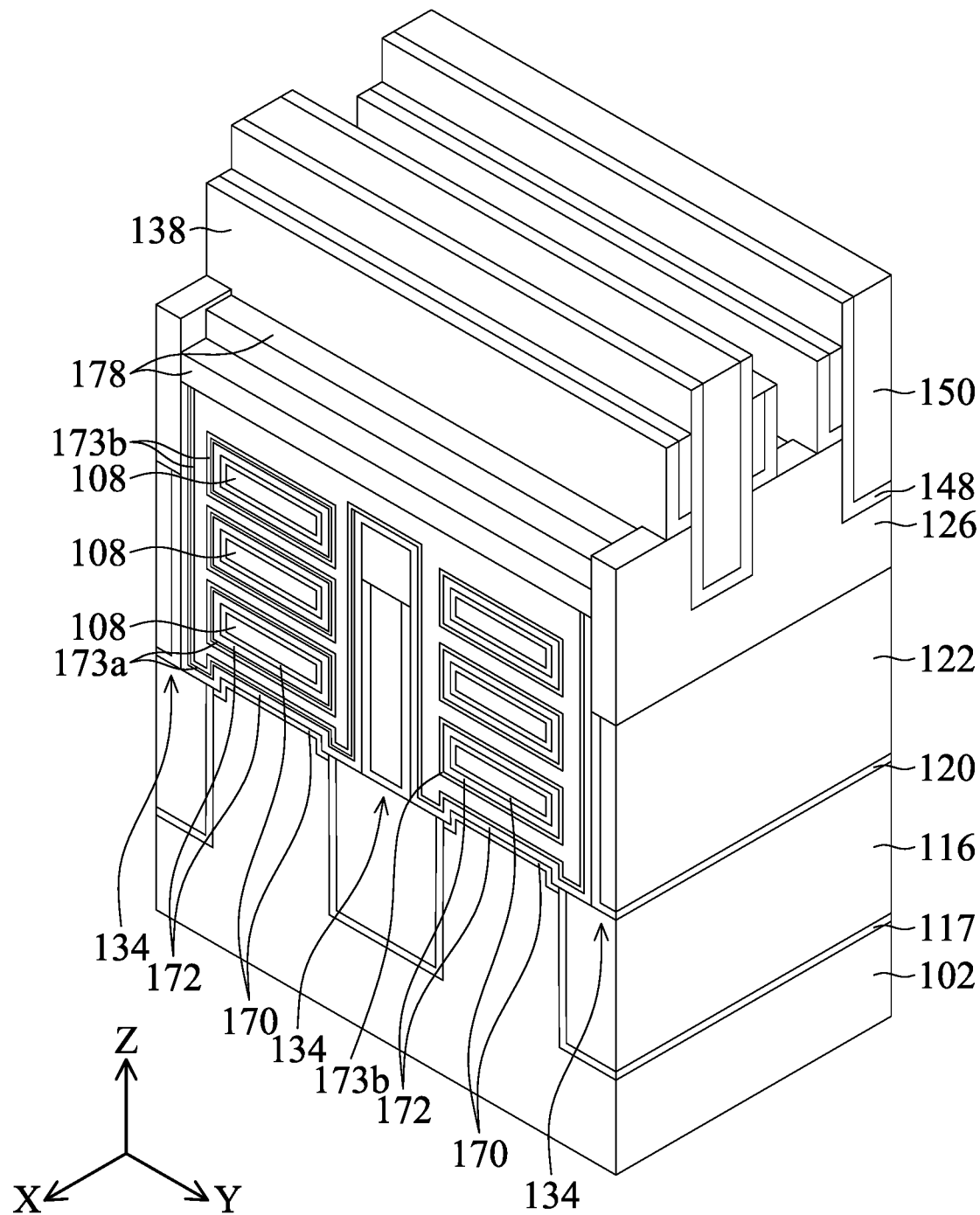
Figures 1, 2U:
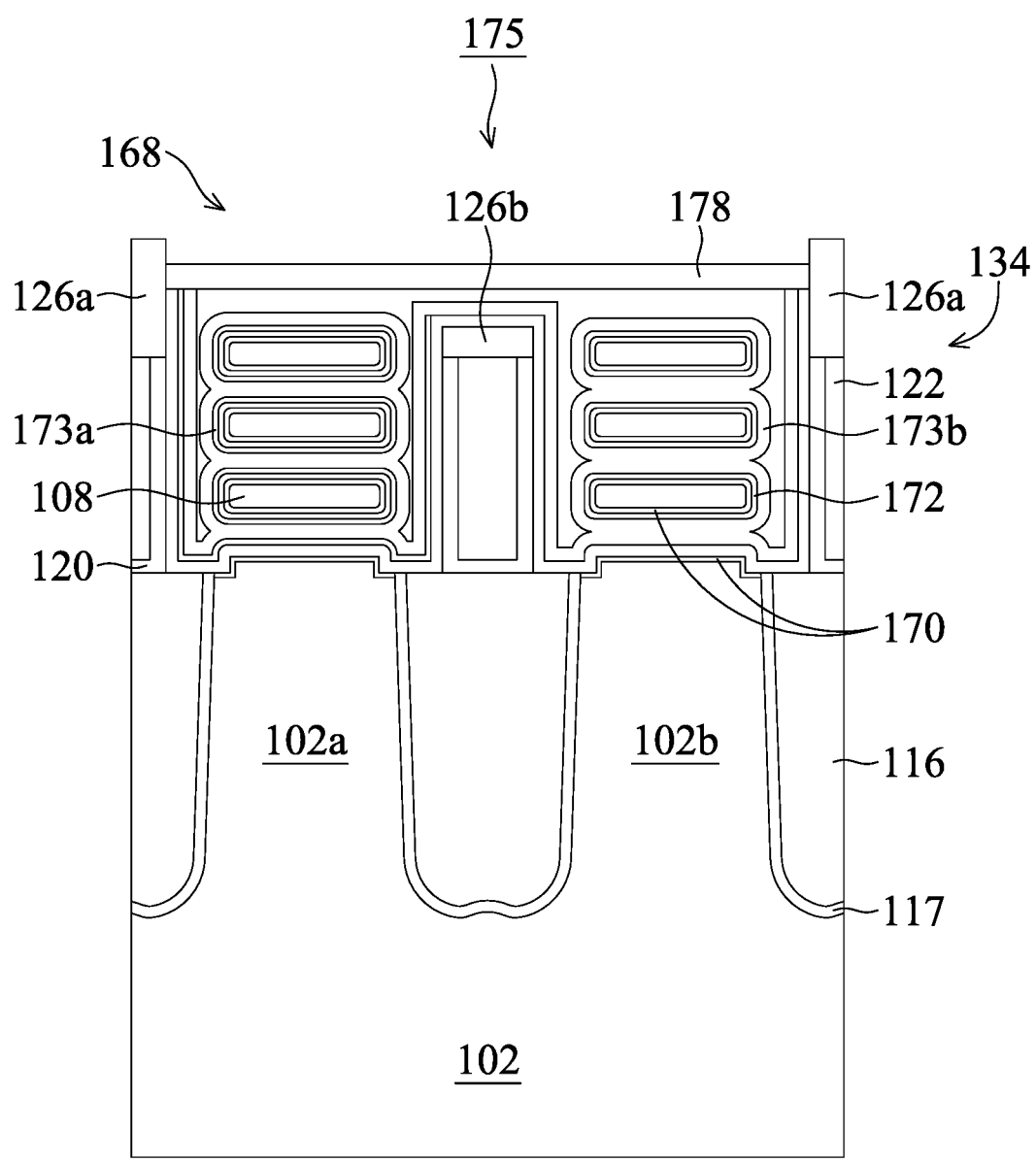
Figures 2, 2U:
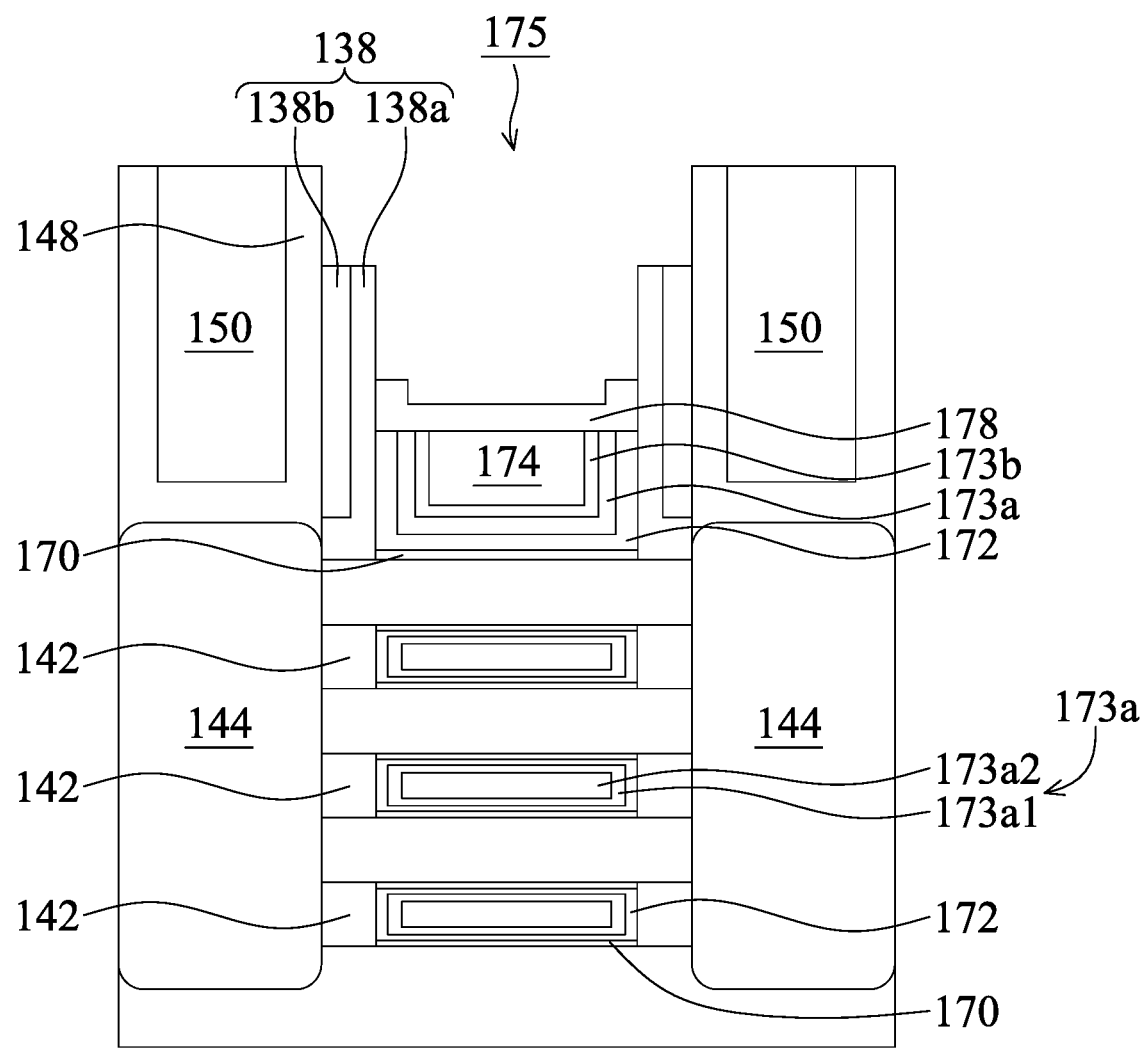
Figure 2V:
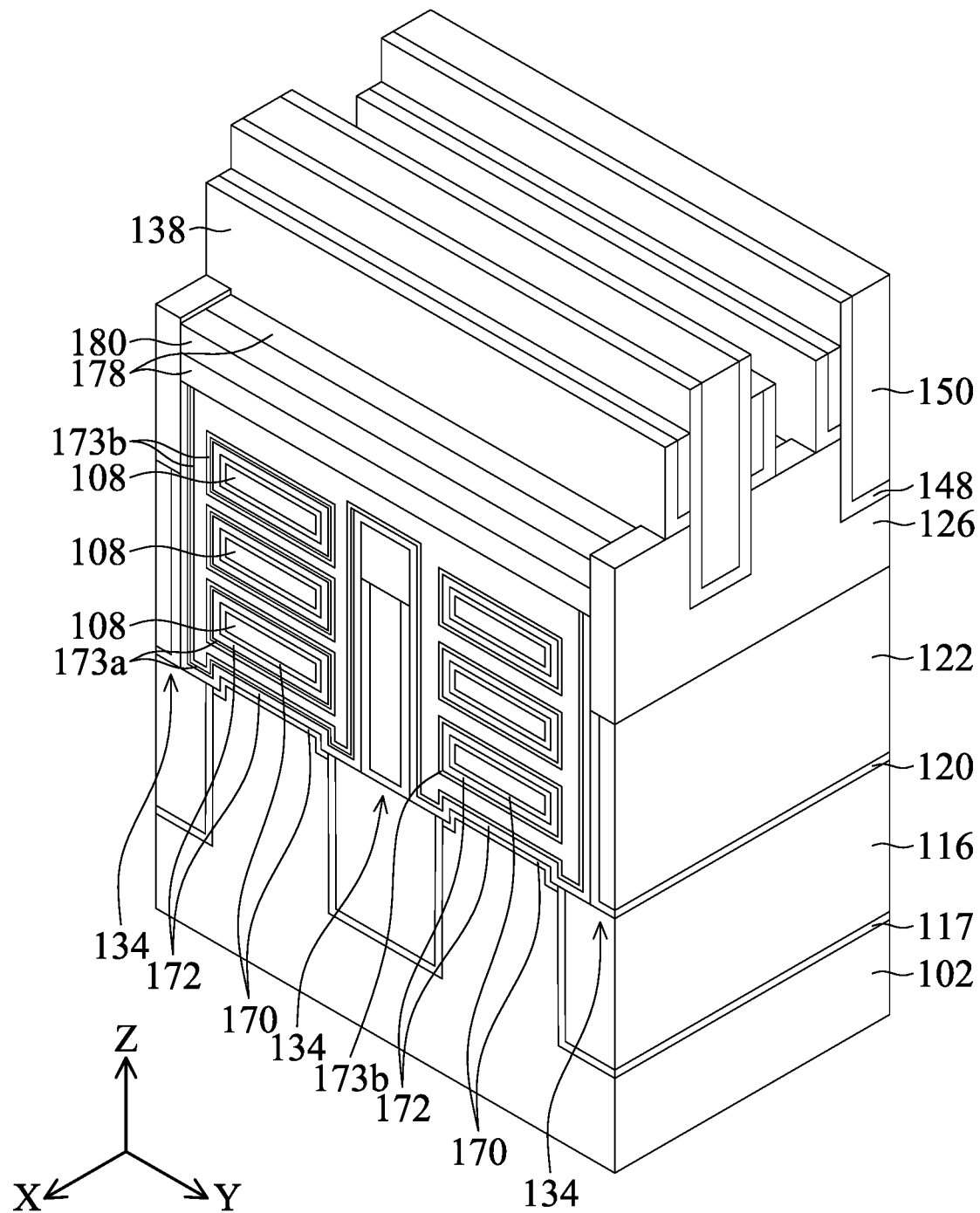
Figures 1, 2V:
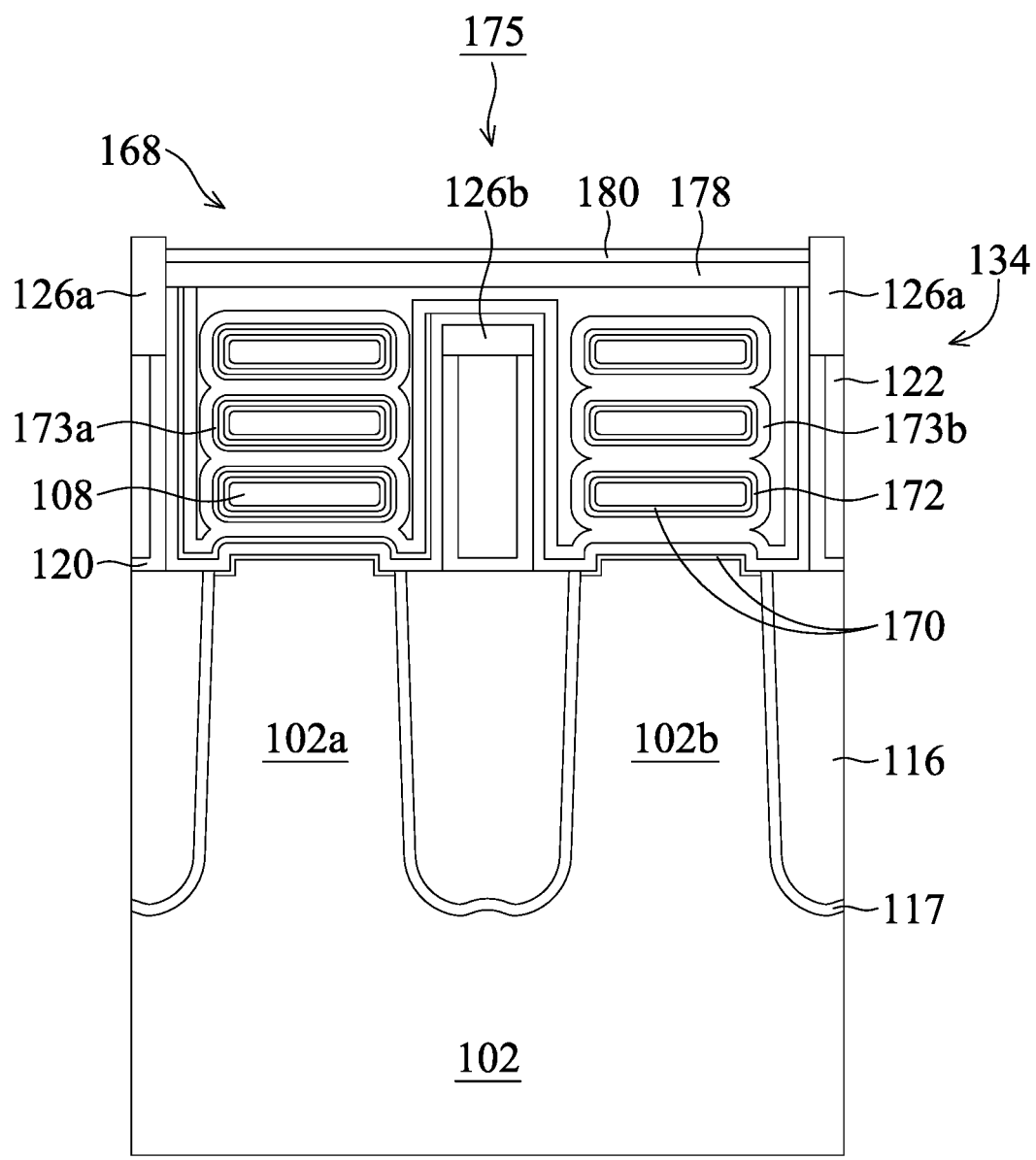
Figures 2, 2V:
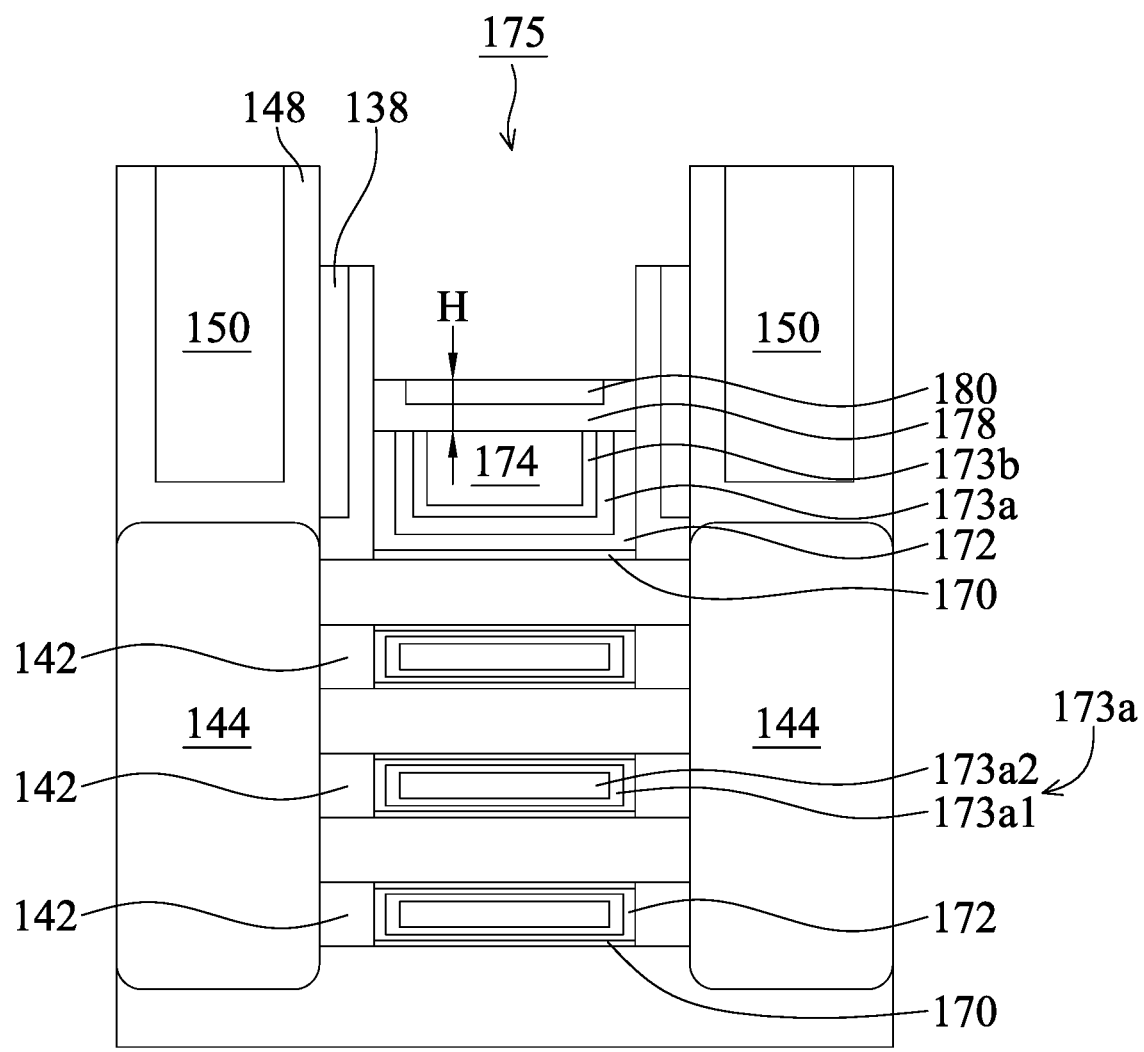
Figure 2W:
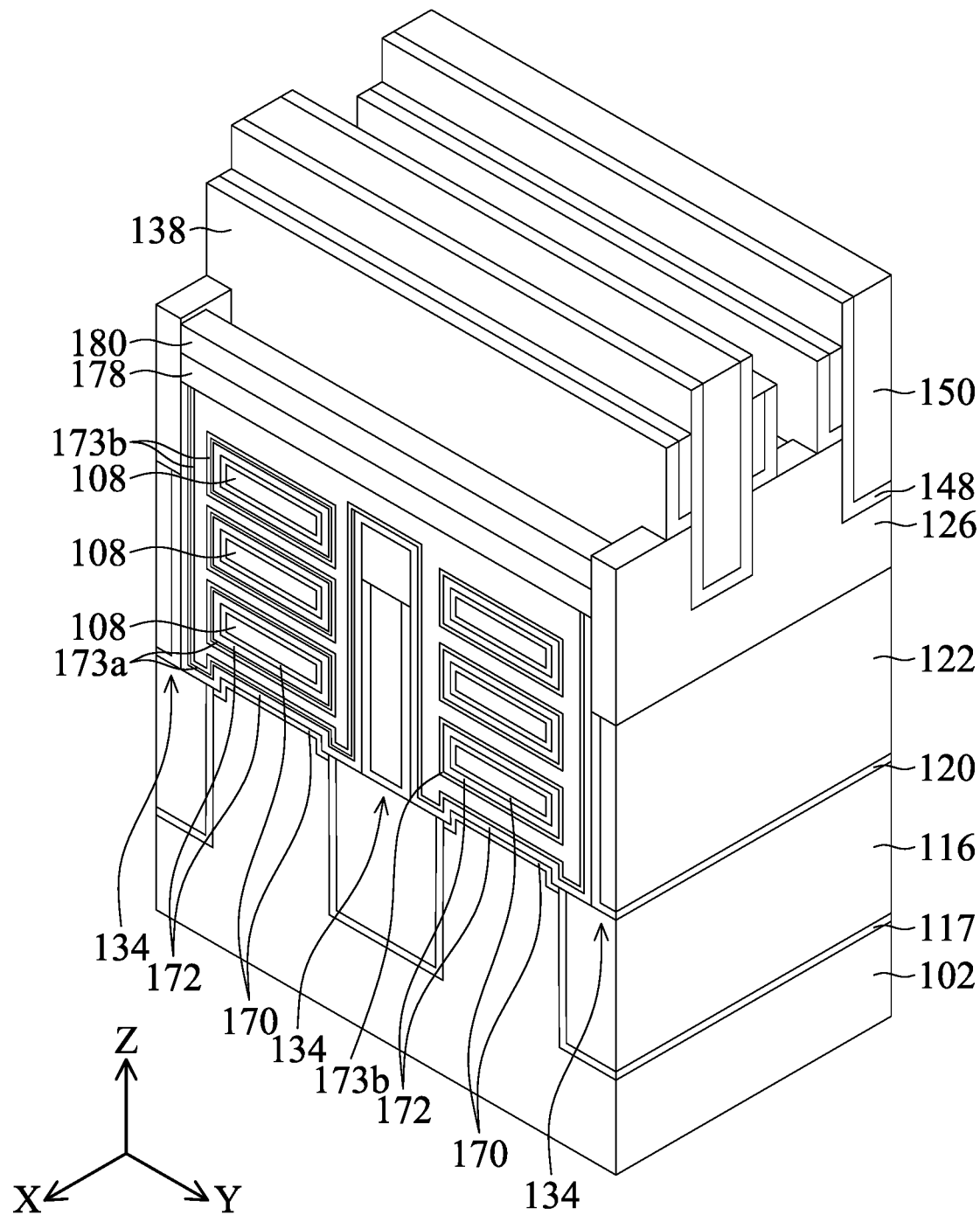
Figures 1, 2W:
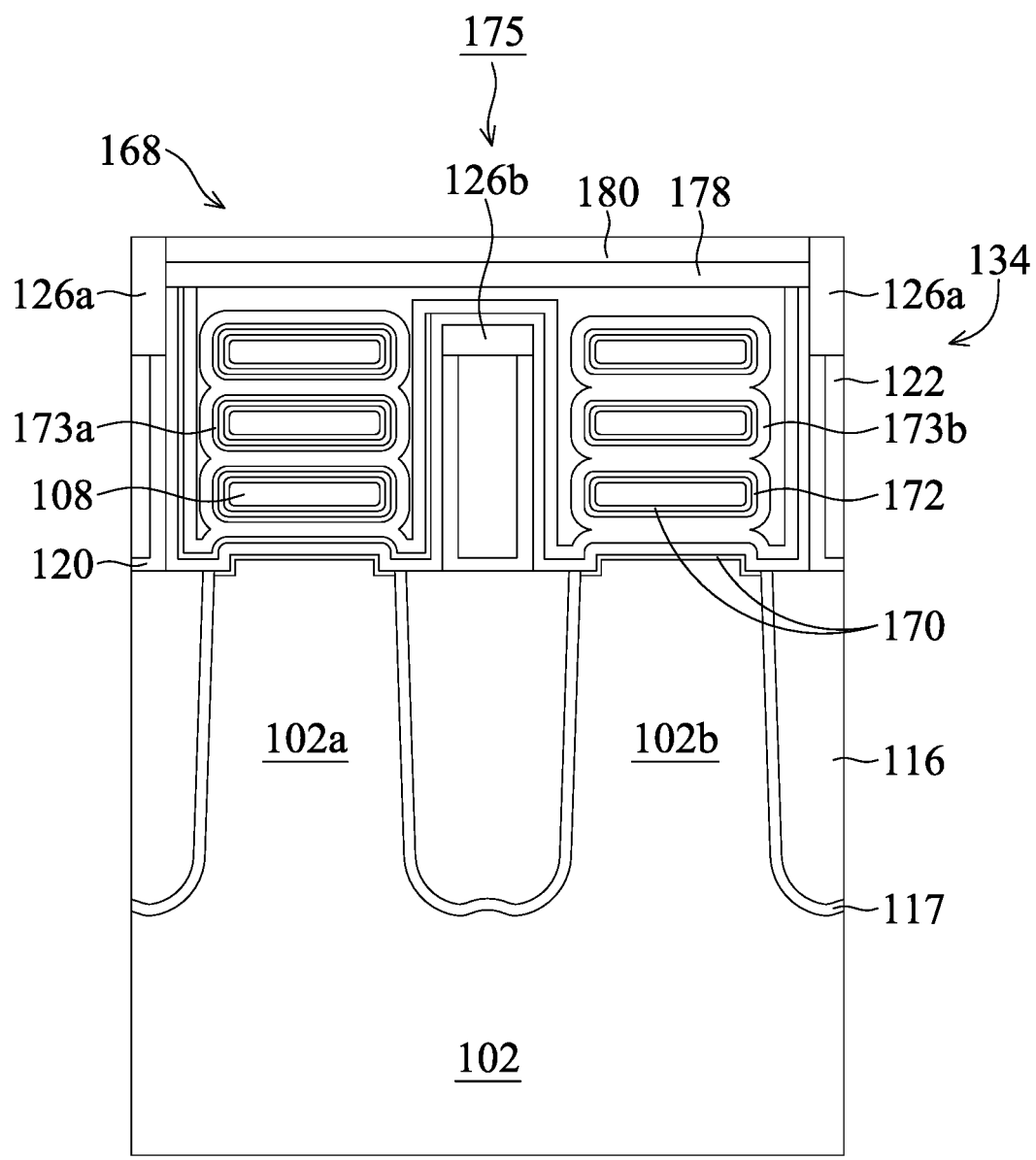
Figures 2, 2W:
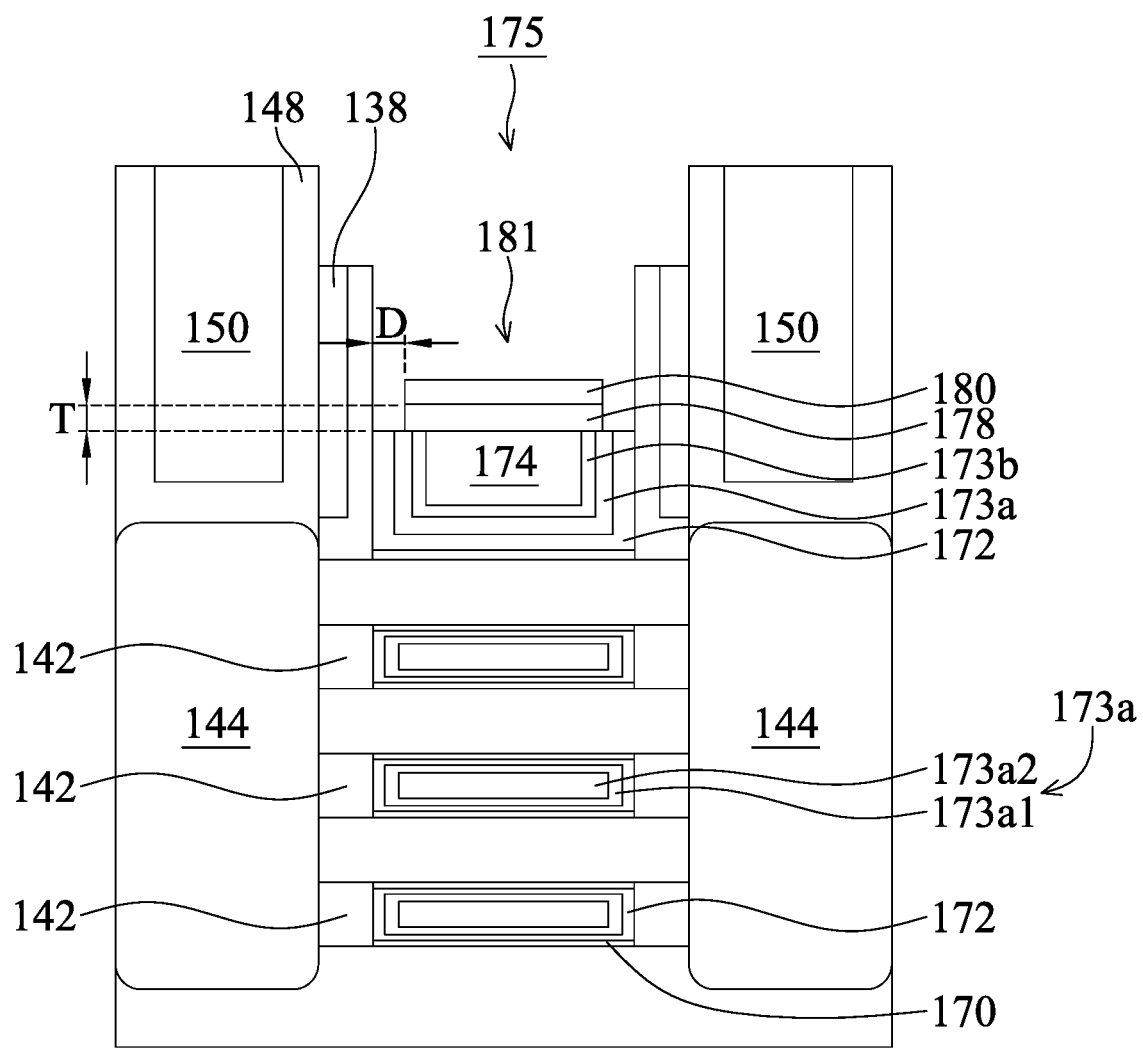
Figure 2X:
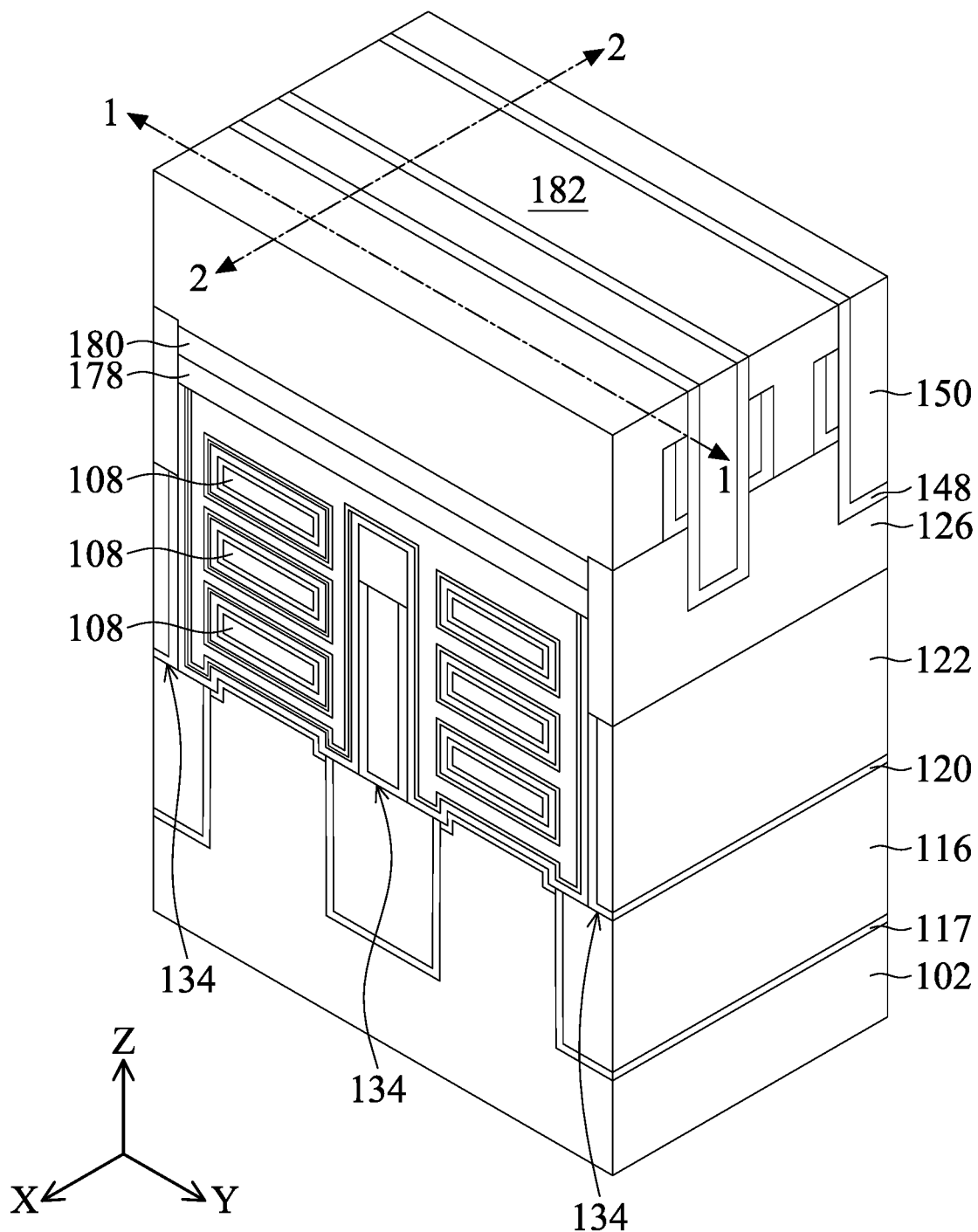
Figures 1, 2X:
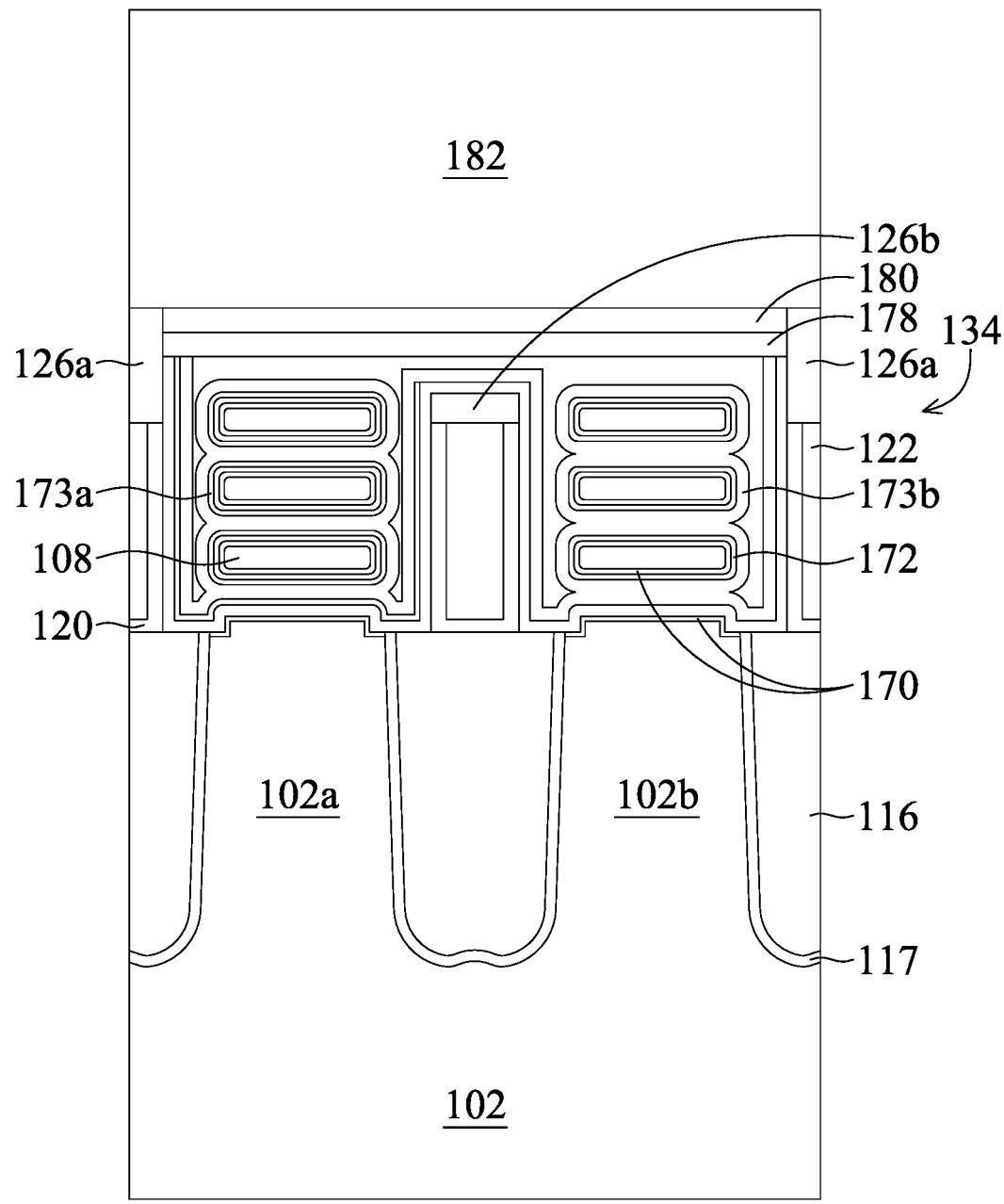
Figures 2, 2X:
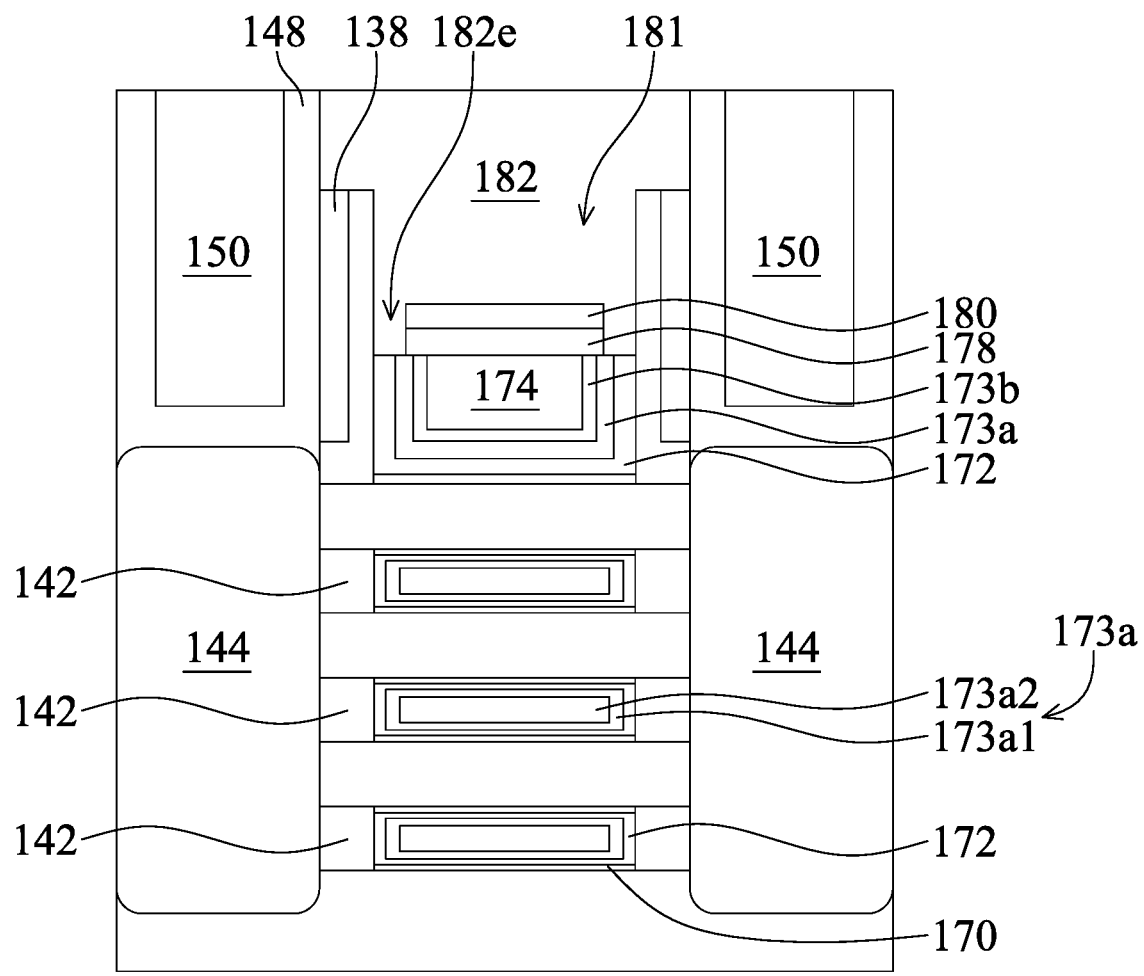
Figure 2Y:
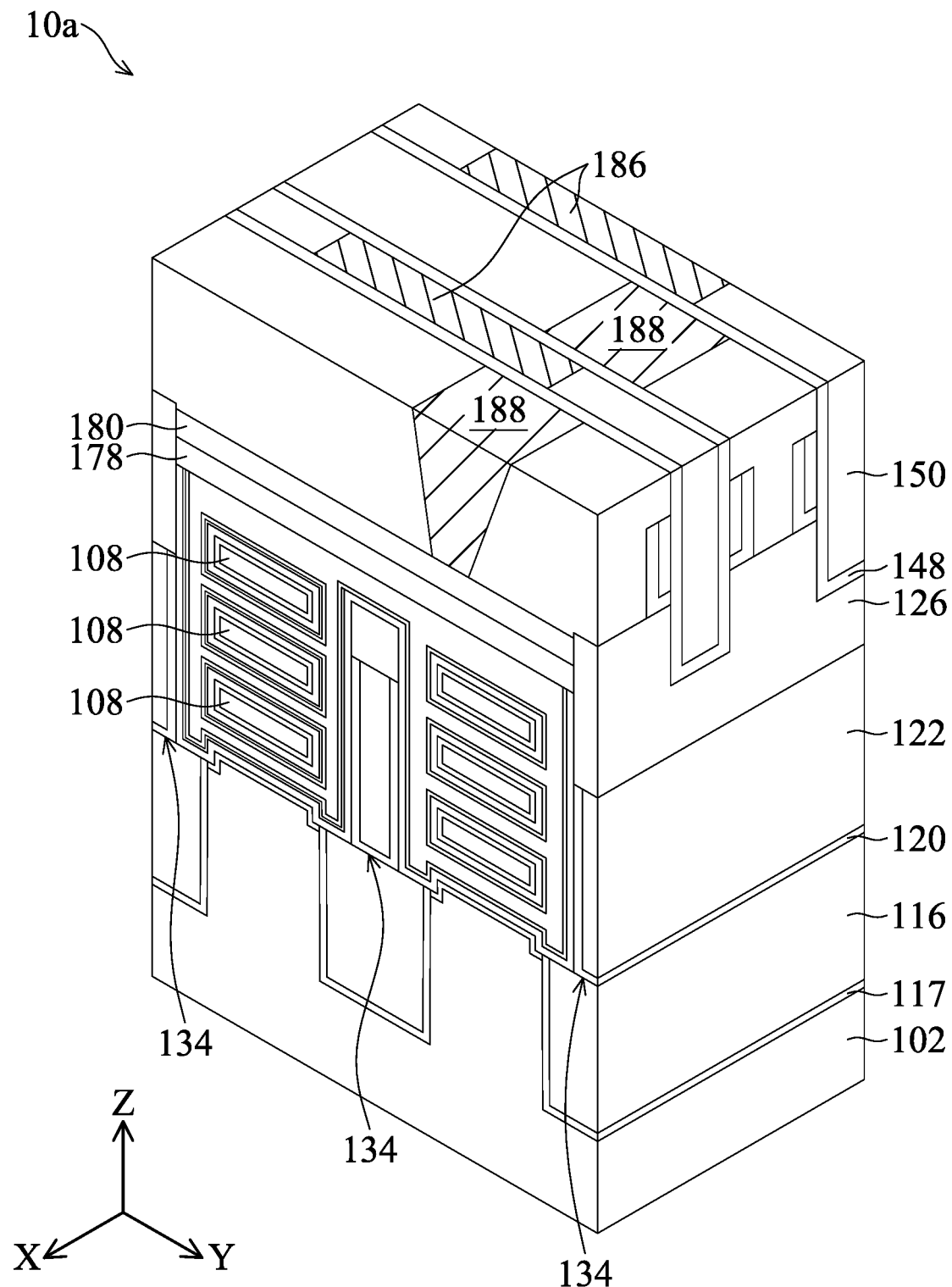
Figures 1, 2Y:
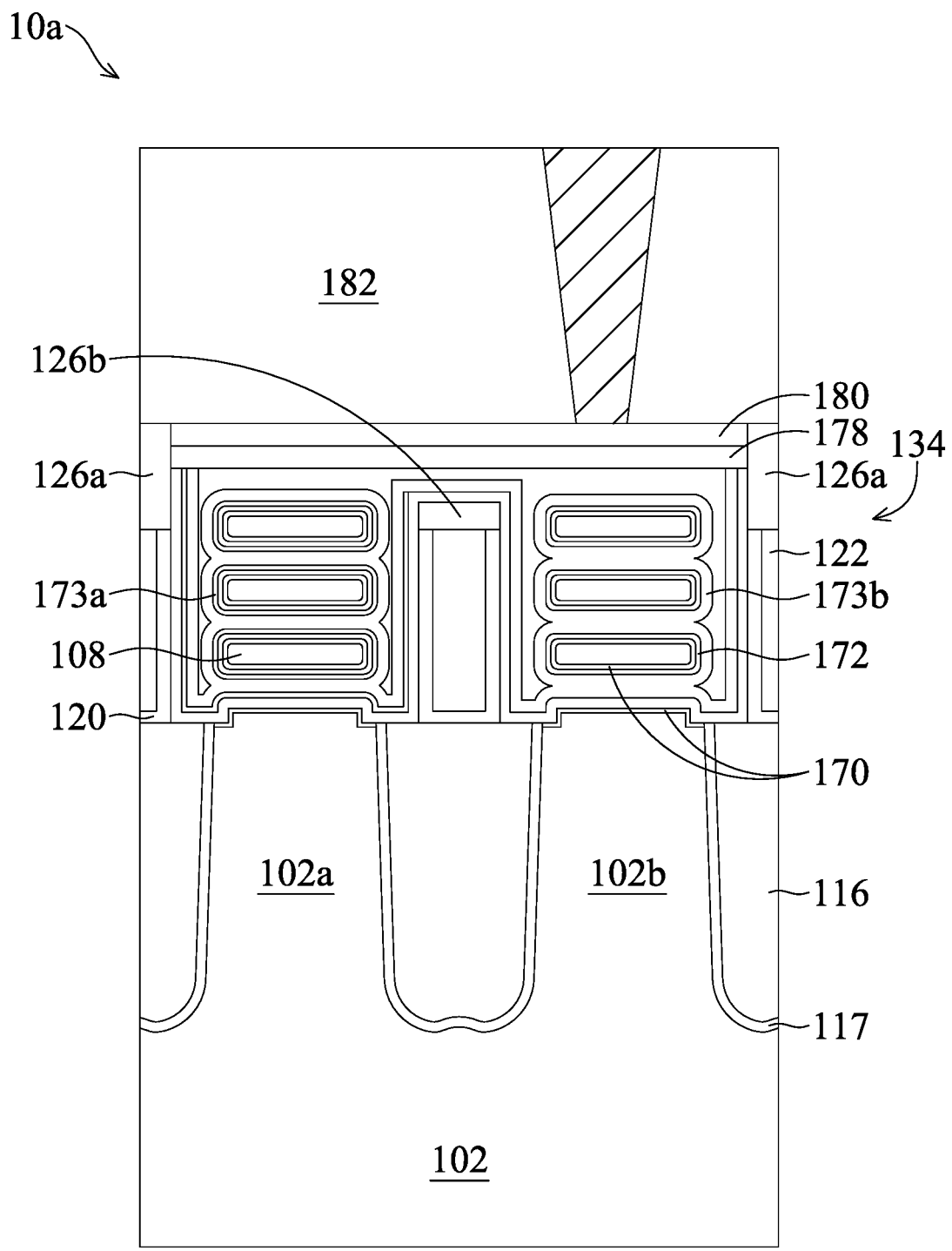
Figures 2, 2Y:
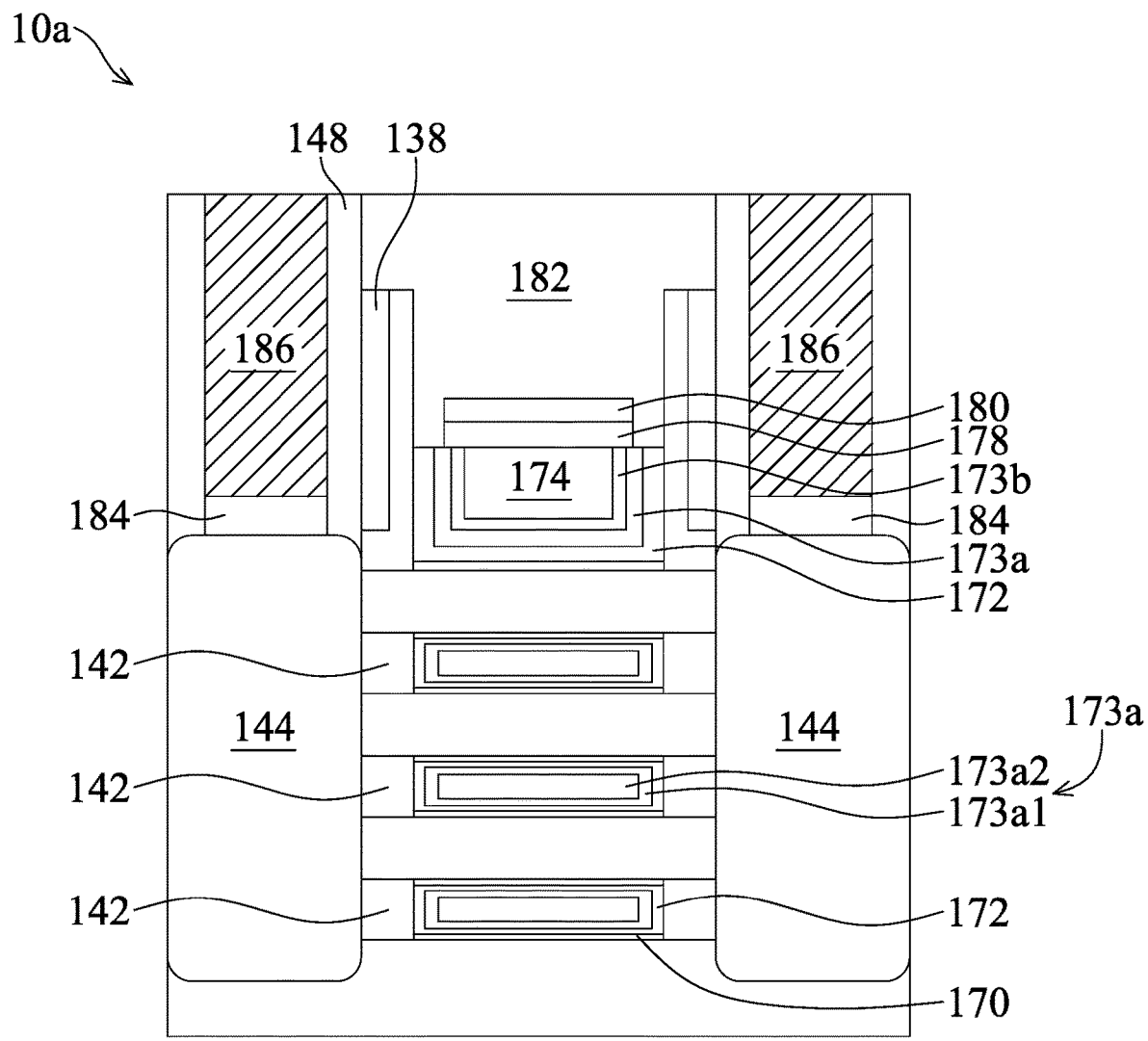

FIGS. 2A-2Y are perspective representations of various stages of forming a semiconductor device structure 10a, in accordance with some embodiments of the disclosure. More specifically, FIGS. 2A-2Q illustrate perspective views of intermediate stages of manufacturing the semiconductor structure 10a shown in the dotted line block C1 of FIG. 1, and FIGS. 2R to 2Y illustrate diagrammatic perspective views of intermediate stages of manufacturing the semiconductor structure 10a shown in the dotted line block C2 of FIG. 1 in accordance with some embodiments.

The semiconductor device structure 10a may be a gate all around (GAA) transistor structure. FIGS. 2P-1, 2Q-1, 2R-1, 2S-1, 2S-2, 2T-1, 2T-2, 2U-1, 2U-2, 2V-1, 2V-2, 2W-1, 2W-2, 2X-1, 2X-2, 2Y-1, 2Y-2 are cross-sectional representations of various stages of forming a semiconductor device structure 10a, in accordance with some embodiments of the disclosure. FIGS. 2P-1, 2Q-1, 2R-1, 2S-1, 2T-1, 2U-1, 2V-1, 2W-1, 2X-1, 2Y-1 show cross-sectional representations taken along line 1-1 in FIGS. 2P, 2Q, 2R, 2S, 2T, 2U, 2V, 2W, 2X, 2Y, respectively. FIGS. 2S-2, 2T-2, 2U-2, 2V-2, 2W-2, 2X-2, 2Y-2 show cross-sectional representations taken along line 2-2 in FIGS. 2S, 2T, 2U, 2V, 2W, 2X, 2Y, respectively A semiconductor stack including first semiconductor material layers 106 and second semiconductor material layers 108 are formed over a substrate 102, as shown in FIG. 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 106 and second semiconductor material layers 108 are alternating stacked over the substrate 102 to form the semiconductor stack, as shown in FIG. 2A in accordance with some embodiments. The first semiconductor material layers 106 and the second semiconductor material layers 108 may include Si, Ge, SiGe, GaAs, InSb, GaP, GaSb, InAlAs, InGaAs, GaSbP, GaAsSb, or InP. The first semiconductor material layers 106 and second semiconductor material layers 108 may be made of different materials with different etching rates. In some embodiments, for example, the first semiconductor material layers 106 are made of SiGe and the second semiconductor material layers 108 are made of Si.

The first semiconductor material layers 106 and second semiconductor material layers 108 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 106 and three layers of the second semiconductor material layers 108 shown in FIG. 2A, the number of the first semiconductor material layers 106 and second semiconductor material layers 108 are not limited herein, depending on the demand of performance and process. For example, the semiconductor structure may include two to five layers of the first semiconductor material layers 106 and two to five layers of the second semiconductor material layers 108.

After the first semiconductor material layers 106 and the second semiconductor material layers 108 are formed as the semiconductor material stack over the substrate 102, the semiconductor material stack is patterned to form fin structures 104 using the patterned mask structure 110 as a mask layer, as shown in FIG. 2B in accordance with some embodiments. In some embodiments, the fin structures 104 include base fin structures 105 and the semiconductor material stacks, including the first semiconductor material layers 106 and the second semiconductor material layers 108, formed over the base fin structure 105.

The patterning process may including forming a mask structure 110 over the first semiconductor material layers 106 and the second semiconductor material layers 108 and etching the semiconductor material stack and the underlying substrate 102 through the mask structure 110, as shown in FIG. 2B in accordance with some embodiments. The mask structure 110 may be a multilayer structure including a pad layer 112 and a hard mask layer 114 formed over the pad layer 112. The pad layer 112 may be made of silicon oxide, which may be formed by thermal oxidation or CVD. The hard mask layer 114 may be made of silicon nitride, which may be formed by CVD, such as LPCVD or plasma-enhanced CVD (PECVD).

The patterning process of forming the fin structures 104 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 104 are formed, a liner layer 117 is formed over the fin structures 104 and in the trenches between the fin structures 104, as shown in FIG. 2C in accordance with some embodiments. The liner layer 117 may be conformally formed over the substrate 102, the fin structure 104, and the mask structure 110 covering the fin structure 104. The liner layer 117 may be used to protect the fin structure 104 from being damaged in the following processes (such as an anneal process or an etching process). The liner layer 117 may be made of silicon nitride. The liner layer 117 may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 119 is be then filled over the liner layer 117 in the trenches between the fin structures 104, as shown in FIG. 2D in accordance with some embodiments. The isolation structure material 119 may be made of silicon oxide, silicon nitride, silicon oxynitride (SiON), fluoride-doped silicate glass (FSG), other low-k dielectric materials, or a combination thereof. The isolation structure material 119 may be deposited by a deposition process, such as a chemical vapor deposition (CVD) process (e.g. a flowable CVD (FCVD) process), a spin-on-glass process, or another applicable process.

Next, the isolation structure material 119 and the liner layer 117 are etched back by an etching process, and an isolation structure 116 is formed surrounding the base fin structure 105, as shown in FIG. 2E in accordance with some embodiments. The etching process may be used to remove the top portion of the liner layer 117 and the top portion of the isolation structure material 119. As a result, the first semiconductor material layers 106 and the second semiconductor material layers 108 may be exposed. The isolation structure 116 may be a shallow trench isolation (STI) structure. The isolation structure 116 may be configured to electrically isolate active regions such as fin structures 104 of the semiconductor structure 10a and prevent electrical interference or crosstalk.

Next, a semiconductor liner layer (not shown) may be formed over the fin structures 104. The semiconductor liner may be a Si layer and may be incorporated into the subsequently formed cladding layer during the epitaxial growth process for forming the cladding layer.

After the semiconductor liner layer is formed, a cladding layer 118 is formed over the top surfaces and the sidewalls of the fin structures 104 and over the isolation structure 116, as shown in FIG. 2F in accordance with some embodiments. The cladding layer 118 may be made of semiconductor materials such as silicon germanium (SiGe). The cladding layer 118 and the first semiconductor material layers 106 may be made of the same material.

The cladding layer 118 may be formed by performing an epitaxy process, such as VPE and/or UHV CVD, molecular beam epitaxy, other applicable epitaxial growth processes, or a combination thereof. After the cladding layer 118 is deposited, an etching process may be performed to remove the portion of the cladding layer 118 not formed on the sidewalls of the fin structures 104. The cladding layer 118 formed over the top surface of the isolation structure 116 is partially or completely removed by the etching process, such that the thickness of the cladding layer 118 over the top surface of the fin structures 104 is thinner than the thickness of the cladding layer 118 on the sidewalls of the fin structures 104. The etching process may include a plasma dry etching process.

Next, a dielectric liner 120 is formed over the cladding layers 118 and the isolation structure 116, as shown in FIG. 2G in accordance with some embodiments. The dielectric liner 120 may be made of a low k dielectric material having a k value lower than 7. The dielectric liner 120 may be made of oxide, nitride, SiN, SiCN, SiOCN, SiON, or the like. The dielectric liner 120 may be deposited using CVD, PVD, ALD, HDPCVD, MOCVD, RPCVD, PECVD, LPCVD, ALCVD, APCVD, other applicable methods, or a combination thereof.

Next, a fin isolation material 122 is formed to completely fill the spaces between the adjacent fin structures 104, and a planarization process is performed until the top surfaces of the cladding layers 118 are exposed, as shown in FIG. 2H in accordance with some embodiments. The fin isolation material 122 may be made of a low k dielectric material such as oxide, nitride, SiN, SiCN, SiOCN, SiON, or the like. The fin isolation material 122 and the dielectric liner 120 may be made of different dielectric materials. The fin isolation material 122 and the dielectric liner 120 may both be made of oxide formed by different methods. The fin isolation material 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating. The planarizing process may include a grinding process, a chemical mechanical polishing (CMP) process, an etching process, other applicable processes, or a combination thereof.

Next, the top portion of the fin isolation material 122 and the dielectric liner 120 are recessed to form a fin isolation structure 122, and a dielectric material 126 is formed in the recesses to form the dielectric structure 134 separating the fin structures 104, as shown in FIG. 2I in accordance with some embodiments. In some embodiments, the dielectric structure 134 includes the fin isolation structure 122 and the dielectric material 126 formed over the fin isolation structure 122. The fin isolation material 122 may be recessed by an etching process. The etching process may include a dry etching process or a wet etching process.

The dielectric material 126 may be made of high-k dielectric material such as metal oxides, metal nitrides, metal silicates, transition metal-oxides, transition metal-nitrides, transition metal-silicates, oxynitrides of metals, other suitable materials, or a combination thereof. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO2-$Al_2O_3$) alloy, or other applicable dielectric materials.

In some embodiments, the dielectric constant of the dielectric material 126 is higher than that of the fin isolation structure 122. The dielectric material 126 may be formed by performing ALD, CVD, PVD, oxidation-based deposition process, other suitable process, or a combination thereof. After the dielectric material 126 is formed, a planarization process may be performed until the mask structure 110 is exposed.

In some embodiments, the interface between the dielectric material 126 and the fin isolation structure 122 is lower than the top surface of the topmost second semiconductor material layers 108 and higher than the bottom surface of the topmost second semiconductor material layers 108.

Next, the mask structure 110 including the pad layer 112 and the hard mask layer 114 is removed, and the upper portions of the cladding layer 118 are partially removed to expose the top surfaces of the topmost second semiconductor material layers 108, as shown in FIG. 2J in accordance with some embodiments. More specifically, the upper portions of the cladding layer 118 are removed first, and the mask structure 110 is removed afterwards in accordance with some embodiments. The top surfaces of the cladding layers 118 are substantially level with the top surfaces of the topmost second semiconductor material layers 108. The mask structures 107 and the cladding layers 118 may be recessed by performing an etching process. The etching processes may be dry etching, wet drying, reactive ion etching, or other applicable etching methods.

Next, a dummy gate structure 128 is formed over and across the fin structures 104, the cladding layer 118, and the dielectric structure 134, as shown in FIG. 2K in accordance with some embodiments. The dummy gate structures 128 may be used to define the source/drain regions and the channel regions of the resulting semiconductor structure 10a. The dummy gate structure 128 may include a dummy gate dielectric layer 130 and a dummy gate electrode layer 132. The dummy gate dielectric layer 130 and the dummy gate electrode layer 132 may be replaced by the following steps to form a real gate structure with a high-k dielectric layer and a metal gate electrode layer.

The dummy gate dielectric layer 130 may include one or more dielectric materials, such as silicon oxide, silicon nitride, silicon oxynitride (SiON), $HfO_2$, HfZrO, HfSiO, HfTiO, HfAlO, or a combination thereof. The dummy gate dielectric layer 130 may be formed by an oxidation process (e.g., a dry oxidation process, or a wet oxidation process), a chemical vapor deposition process, other applicable processes, or a combination thereof. Alternatively, the dummy gate dielectric layer 130 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, $BaZrO$, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 132 may include polycrystalline-silicon (poly-Si), poly-crystalline silicon-germanium (poly-SiGe), other applicable materials, or a combination thereof. The dummy gate electrode layer 132 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Hard mask layers 136 are formed over the dummy gate structures 128, as shown in FIG. 2K in accordance with some embodiments. The hard mask layers 136 may include multiple layers, such as an oxide layer 136a and a nitride layer 136b. In some embodiments, the oxide layer 136a is silicon oxide, and the nitride layer 136b is silicon nitride.

The formation of the dummy gate structures 128 may include conformally forming a dielectric material as the dummy gate dielectric layers 130. Afterwards, a conductive material may be formed over the dielectric material as the dummy gate electrode layers 132, and the bi-layered hard mask layers 136, including the oxide layer 136a and the nitride layer 136b, may be formed over the conductive material. Next, the dielectric material and the conductive material may be patterned and etched through the bi-layered hard mask layers 136 to form the dummy gate structures 128, as shown in FIG. 2K in accordance with some embodiments. The dummy gate dielectric layer 130 and the dummy gate electrode layer 132 may be etched by a dry etching process. After the etching process, the first semiconductor material layers 106 and the second semiconductor material layers 108 may be exposed on opposite sides of the dummy gate structure 128.

Next, a conformal dielectric layer is formed over the substrate 102 and the dummy gate structure 128, and then an etching process is performed. A pair of spacer layers 138 is formed over opposite sidewalls of the dummy gate structure 128, and a source/drain opening is formed between adjacent dummy gate structures 128, as shown in FIG. 2L in accordance with some embodiments.

In some embodiments, the spacer layers 138 are multi-layer structures including the first spacer layers 138a and the second spacer layers 138b. In some embodiments, the first spacer layer 138a is conformally formed over sidewalls of the dummy gate structure 128 and the dielectric material 126, and the second spacer layers 138b is formed over the first spacer layer 138a. The first spacer layer 138 may have an L-shape in the cross-sectional view.

The first spacer layers 138a and the second spacer layers 138b may be made of silicon oxide, silicon nitride, silicon oxynitride, and/or dielectric materials. The first spacer layers 138a and second spacer layers 138b may be formed by different materials with different etching selectivity. In some embodiments, the first spacer layers 138a and the second spacer layers 138b are made of silicon nitride with different etching selectivity. The first spacer layers 138a and second spacer layers 138b may be formed by a chemical vapor deposition (CVD) process, a spin-on-glass process, or another applicable process.

After the spacer layers 138 are formed, the first semiconductor material layers 106 and the second semiconductor material layers 108 of the fin structure 104 and the cladding layer 118 not covered by the dummy gate structures 128 and the spacer layers 138 are etched to form the trenches 140, as shown in FIG. 2L in accordance with some embodiments.

The fin structures 104 and the cladding layer 118 may be recessed by performing a number of etching processes. That is, the first semiconductor material layers 106 and the second semiconductor material layers 108 of the fin structures 104 and the cladding layer 118 may be etched in different etching processes. In addition, the dielectric material 126 not covered by the dummy gate structures 128 and the spacer layers 138 are also partially etched to form recessed portions 127 during the etching processes in accordance with some embodiments. That is, the dielectric material 126 is thicker under the dummy gate structure 128 and the spacer layers 138, as shown in FIG. 2L in accordance with some embodiments.

The etching process may be a dry etching process or a wet etching process. In some embodiments, the fin structures 104 and the cladding layer 118 are etched by a dry etching process.

Next, the first semiconductor material layers 106 are laterally etched from the source/drain opening to form recesses (not shown). The outer portions of the first semiconductor material layers 106 may be removed, and the inner portions of the first semiconductor material layers 106 under the dummy gate structures 128 and the spacer layers 138 may remain. After the lateral etching process, the sidewalls of the etched first semiconductor material layers 106 may be not aligned with the sidewalls of the second semiconductor material layers 108. The cladding layer 118 may be exposed in the recess.

The lateral etching of the first semiconductor material layers 106 may be a dry etching process, a wet etching process, or a combination thereof. In some embodiments, the first semiconductor material layers 106 are Ge or SiGe and the second semiconductor material layers 108 are Si, and the first semiconductor material layers 106 are selectively etched to form the recesses by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Next, an inner spacer 142 is formed in the recess, as shown in FIG. 2M in accordance with some embodiments. The inner spacer 142 may provide a barrier between subsequently formed source/drain epitaxial structures and gate structure. The inner spacer 142 may be made of dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The inner spacer 142 may be formed by a deposition process. The deposition process may include a CVD process (such as LPCVD, PECVD, SACVD, or FCVD), an ALD process, another applicable method, or a combination thereof.

Next, a source/drain epitaxial structure 144 is formed in the source/drain opening, as shown in FIG. 2N in accordance with some embodiments. The source/drain epitaxial structure 144 may be formed over opposite sides of the dummy gate structure 128.

A strained material may be grown in the source/drain opening by an epitaxial (epi) process to form the source/drain epitaxial structure 144. In addition, the lattice constant of the strained material may be different from the lattice constant of the substrate 102. The source/drain epitaxial structure 144 may include Ge, SiGe, InAs, InGaAs, InSb, GaAs, GaSb, InAlP, InP, SiC, SiP, other applicable materials, or a combination thereof. The source/drain epitaxial structure 144 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments, the source/drain epitaxial structures 144 are in-situ doped during the epitaxial growth process. For example, the source/drain epitaxial structures 144 may be the epitaxially grown SiGe doped with boron (B). For example, the source/drain epitaxial structures 144 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The source/drain epitaxial structures 144 may be doped in one or more implantation processes after the epitaxial growth process.

Next, a contact etch stop layer 148 is formed over the source/drain epitaxial structure 144, as shown in FIG. 2O in accordance with some embodiments. More specifically, the contact etch stop layers 148 cover the sidewalls of the spacer layers 138, the top surfaces and sidewalls of the recessed portion 127 of the dielectric materials 126, and the source/drain structures 144 in accordance with some embodiments.

The contact etch stop layer 148 may be made of a dielectric material such as silicon nitride, silicon oxide, silicon oxynitride (SiON), other applicable materials, or a combination thereof. The contact etch stop layer 148 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the contact etch stop layer 148 is formed, an inter-layer dielectric (ILD) structure 150 is formed over the contact etch stop layer 148, as shown in FIG. 2O in accordance with some embodiments. The ILD structure 150 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 150 may be formed by chemical vapor deposition (CVD), physical vapor deposition, (PVD), atomic layer deposition (ALD), spin-on coating, or other applicable processes.

Afterwards, a planarizing process or an etch-back process is performed on the ILD structure 150 until the top surface of the dummy gate structure 128 is exposed, as shown in FIG. 2O in accordance with some embodiments. After the planarizing process, the top surface of the dummy gate structure 128 may be substantially level with the top surfaces of the spacer layers 138 and the ILD structure 150. The planarizing process may include a grinding process, a chemical mechanical polishing (CMP) process, an etching process, other applicable processes, or a combination thereof.

Afterwards, a protection layer 164 is formed over the interlayer dielectric layer 150, as shown in FIG. 2O in accordance with some embodiments. More specifically, after the planarization process is performed, the ILD structure 150 is recessed and the protection layer 164 is deposited over the ILD structure 150 to protect the ILD structure 150 from subsequent etching processes. The protection layer 164 may be made of a material that is the same as or similar to that in the contact etch stop layer 130. The protection layer 164 may be made of $Si_3N_4$, SiCN, SiOCN, SiOC, a metal oxide such as $HrO_2$, $ZrO_2$, hafnium aluminum oxide, and hafnium silicate, or other applicable material. The protection layer 164 may be formed by CVD, PVD, ALD, or other applicable methods.

Next, the dummy gate structure 128 and the top portion of the spacer layers 138a and 138b are removed, as shown in FIGS. 2P and 2P-1 in accordance with some embodiments. Therefore, a trench 152 is formed between the spacer layers 138 over the fin structure 104 and the second semiconductor material layers 108 are exposed from the trench 152.

The bottom portion of the spacer layers 138 may remain after the removal of the dummy gate structure 128. In some embodiments, the top surfaces of the bottom portion of the spacer layers 138 are exposed in the trench 152. In some embodiments, the top surface of the spacer layers 138a is substantially aligned with the top surface of the spacer layers 138b. In some embodiments, the bottom of the trench 152 is narrower than the top of the top of the trench 152.

The dummy gate structure 128 and the top portion of the spacer layers 138 may be removed by a dry etching process or a wet etching process. The removal process may include one or more etching processes. For example, when the dummy gate electrode layers 132 are polysilicon, a wet etchant such as a tetramethylammonium hydroxide (TMAH) solution may be used to selectively remove the dummy gate electrode layers 132. Afterwards, the dummy gate dielectric layers 130 may be removed using a plasma dry etching, a dry chemical etching, and/or a wet etching.

After the dummy gate structures 128 are removed, the dielectric material 126 of the dielectric structure 134 exposed by the trenches 152 is patterned, as shown in FIGS. 2Q and 2Q-1 in accordance with some embodiments. The remaining portions 126*a* of the dielectric material 126 may be configured to separate the gate structures formed afterwards into various portions and may therefore be left over the fin isolation structure 122. In some embodiments, the top surface of the remaining portion 126*b* of the dielectric material 126*a* is substantially level with the top surface of the topmost second semiconductor material layer 108.

After the dielectric material 126 of the dielectric structure 134 is patterned, the first semiconductor material layers 106 and the cladding layer 118 are removed, as shown in FIGS. 2R and 2R-1 in accordance with some embodiments. More specifically, the second semiconductor material layers 108 exposed by the trenches 152 form nanostructures 108, and the nanostructures 108 are configured to function as channel regions in the resulting semiconductor devices 10*a* in accordance with some embodiments.

The first semiconductor material layers 106 and the cladding layer 118 may be removed by performing one or more etching processes. For example, the cladding layer 118 may be etched to form gaps between the fin structure 104 and the fin isolation structure 122, and the first semiconductor material layers 106 may be removed through the gaps afterwards. The cladding layer 118 may help to remove the first semiconductor material layers 106 and to form the nanostructures 108 more efficiently.

The etching process may include a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

The isolation structure 116 and the liner layer 117 may be consumed in the etching process of removing the first semiconductor material layers 106 and the cladding layer 118. In some embodiments, the top surfaces of the isolation structure 116 and the liner layer 117 are lower than the top surface of the base fin structure 105 after the etching process.

Next, a gate structures 168 are formed surrounding the nanostructures 108 and over the nanostructures 108. Gate structures 168 are formed surrounding the nanostructure 108 to form gate-all-around (GAA) transistor structures, as shown in FIGS. 2S, 2S-1 and 2S-2 in accordance with some embodiments. Therefore, the gate control ability may be enhanced.

In some embodiments as shown in FIGS. 2S, 2S-1 and 2S-2, the gate structures 168 are multi-layered structures. Each of the gate structures 168 may include an interfacial layer 170, a gate dielectric layer 172, a first work function layer 173*a* and a second work function layer 173*b*, a glue layer 174, and a gate electrode layer, as shown in FIGS. 2S, 2S-1 and 2S-2 in accordance with some embodiments.

The interfacial layer 170 may be formed around the nanostructures 108 and on the exposed portions of the base fin structures 105. The interfacial layers 170 may be made of silicon oxide, and the interfacial layers 170 may be formed by thermal oxidation.

In some embodiments, the gate dielectric layer 172 is formed over the interfacial layer 170, so that the nanostructures 108 are surrounded (e.g. wrapped) by the gate dielectric layer 172. In addition, the gate dielectric layer 172 also covers the sidewalls of the spacer layers 138, the inner spacers 142, and the dielectric features 134 in accordance with some embodiments. The gate dielectric layers 172 may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The gate dielectric layers 172 may be formed using CVD, ALD, other applicable methods, or a combination thereof.

The first work function layer 173*a* is conformally formed surrounding the nanostructures 108 in the first region 102*a* and the second region 102*b* in the substrate 102 (not shown). The first work function layer 173*a* may be also formed over the nanostructures 108 and the dielectric features 134. The first work function layer 173*a* may be made of metal materials. The metal materials of the first work function layer 173*a* may include N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The first work function layer 173*a* may be formed by using CVD, ALD, other applicable methods, or a combination thereof.

Next, the first work function layer 173*a* in the second region 102*b* of the substrate 102 is removed, as shown in FIGS. 2S, 2S-1 and 2S-2 in accordance with some embodiments. The first work function layer 173*a* may be removed by a patterning process. The patterning process may include forming a patterned mask layer a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a wet etching process using etchant such as ammonia.

Next, a second work function layer 173*b* is formed surrounding the nanostructures 108 and over the nanostructures 108 in the first region 102*a* and the second region 102*b* in the substrate 102, as shown in FIGS. 2S, 2S-1 and 2S-2 in accordance with some embodiments. The second work function layer 173*b* may be conformally formed over the nanostructures 108 and the dielectric features 134. The second work function layer 173*b* may be made of metal materials. In some embodiments, the second work function layer 173*b* includes P-work-function metal. The P-work-function metal may include titanium nitride (TiN), tungsten nitride (WN), tantalum nitride (TaN), ruthenium (Ru) or a combination thereof. The second work function layer 173*b* may be formed by using CVD, ALD, other applicable methods, or a combination thereof.

The first work function layer 173*a* and a second work function layer 173*b* may be multi-layer structures. In some embodiments, the first work function layer 173*a* includes the first work function layer 173*a*1 and the first work function layer 173*a*2 formed over the first work function layer 173*a*1, and the second work function layer 173*b* includes the second work function layer 173b1 and the second work function layer 173b2 formed over the second work function layer 173b1.

The glue layer 174 is formed over the first work function layer 173a and the second work function layer 173b, as shown in FIGS. 2S, 2S-1 and 2S-2 in accordance with some embodiments. The glue layers 174 may be made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. The glue layers 174 may be formed using CVD, ALD, electroplating, another applicable method, or a combination thereof. After the glue layer 174 is formed, a planarization process such as CMP or an etch-back process may be performed and the protection layer 164 may be exposed.

After the gate structures 168 are formed, an etch back process is performed to remove the top portions of the gate structures 168 and the protection layers 164 over the ILD structure, and a recess 175 is formed over the nanostructures 108 between the gate spacers 138, as shown in FIGS. 2T, 2T-1 and 2T-2 in accordance with some embodiments. The top portion of the dielectric material 126a and the top surfaces of the first gate dielectric layer 172, the first work function layer 173a, and the second work function layer 173b are exposed after the etching process. In some embodiments, the top surface of the glue layers 174 is lower than the top surface of the dielectric material 126a of the dielectric structure 134. The dielectric structure 134 may provide isolation between adjacent gate structures 168.

Next, a first metal layer 178 is conformally formed over the gate structures 168, as shown in FIGS. 2U, 2U-1 and 2U-2 in accordance with some embodiments. In some embodiments, the first metal layer 178 is in contact with the top surfaces of the gate dielectric layer 172, the first work function layer 173a, the second work function layer 173b, and the glue layers 174. In some embodiments, the first metal layer 178 is in contact with the sidewall of the spacer layers 138a. In some embodiments, the top surface of the first metal layer 178 is lower than the top surface of the spacer layers 138a. In some embodiments, the first metal layer 178 is in a U-shape in a cross-sectional view. The first metal layer 178 may be deposited directly.

In some embodiments, the metal layer 178 is made of high conductive metal such as Ru, TiN, TaN, Co, Ti, TiAl, W, copper, tantalum, molybdenum, nickel silicide, cobalt silicide, WN, TiAlN, TaCN, TaC, TaSiN, metal alloys, another suitable material, or the like. The metal layer 178 may be formed by using CVD, ALD, electroplating, another applicable method, or a combination thereof.

In some embodiments, the thickness of the first metal layer 178 over the gate structure 168 and over the sidewalls of the spacer layers 138 are substantially the same. In some embodiments, the thickness of the first metal layer 178 is in a range of about 2 nm to about 3 nm. If the first metal layer 178 is too thick, the parasitic capacitance may be increased due to thicker first metal layer 178 in the Y direction. If the first metal layer 178 is too thin, the capacitance reduction may be not enough. The thickness of the first metal layer 178 may be controlled by the deposition time or cycle number.

Next, a second metal layer 180 is formed over the first metal layer 178, as shown in FIGS. 2V, 2V-1 and 2V-2 in accordance with some embodiments. After the second metal layer 180 is formed, an etch-back process may be performed to remove excess second metal layer material 180 and expose the top surface of the first metal layer 178.

In some embodiments, the top surface of the first metal layer 178 is substantially level with the top surface of the second metal layer 180 after the etching back process. In some embodiments, the second metal layer 180 is surrounded by the first metal layer 178. The second metal layer 180 may be formed using CVD, ALD, electroplating, another applicable method, or a combination thereof.

In some embodiments, the first metal layer 178 and the second metal layer 180 are made of different materials with different etching selectivity. In some embodiments, the second metal layer 180 is made of W.

In some embodiments, the total thickness H of the first metal layer 178 and the second metal layer 180 is in a range of about 3 nm to about 8 nm. If the total thickness H of the first metal layer 178 and the second metal layer 180 is too thick, the parasitic capacitance may be too great. If the total thickness H of the first metal layer 178 and the second metal layer 180 is too thin, the capacitance reduction may be not enough, and the resistance may be increased.

Next, the first metal layer 178 formed over opposite sides of the second metal layer 180 is selectively etched and the gate electrode layer 181 is formed, as shown in FIGS. 2W, 2W-1 and 2W-2 in accordance with some embodiments. The gate electrode layer 181 may include the first metal layer 178 and the second metal layer 180. In some embodiments, an inverted T-shape gate structure 168 with the gate electrode layer 181 is formed after the etching process. In some embodiments, the gate electrode layer 181 is narrower than the bottom surface of the gate structure 168.

In some embodiments, the top surfaces of the gate dielectric layer 172, the first work function layer 173a, and the second work function layer 173b is exposed after selectively etching the first metal layer 178. The first metal layer 178 and the second metal layer 180 may be separated from the spacer layers 138. In some embodiments, the sidewall of the first metal layer 178 is aligned with the sidewall of the second metal layer 180. In some embodiments, the distance D between the first metal layer 178 and the spacer layers 138 and the thickness T of the first metal layer 178 are substantially the same. The etching process may include a dry etching process or a wet etching process. In some embodiments, the etching process is a dry etching process.

Next, a cap layer 182 is formed in the recess 175 above the gate structure 168, as shown in FIGS. 2X, 2X-1 and 2X-2 in accordance with some embodiments. In some embodiments, the cap layer 182 covers the first metal layer 178 and the second metal layer 180. In some embodiments, the cap layer 182 is formed over the top surface and of the second metal layer 180 and the sidewalls of the first metal layer 178 and the second metal layer 180. In some embodiments, the cap layer 182 covers the top surface and the sidewalls of the gate electrode layer 181.

The cap layer 182 may be formed between the spacers 138. In some embodiments, the cap layer 182 has an extending portion 182e protruding between the second metal layer 180 and the spacer layer 138. The extending portion 182e of the cap layer 182 may be between the gate electrode layer 181 and the spacer layer 138. In some embodiments, the cap layer 182 is in contact with the top surfaces of the gate dielectric layer 172, the first work function layer 173a, and the second work function layer 173b. In some embodiments, the cap layer 182 is in contact with the sidewalls of the first metal layer 178 and the second metal layer 180. In some embodiments, the bottom surface of the cap layer 182 is lower than the top surface of the second metal layer 180.

With the extending portion 182e of the cap layer 182 formed between the gate electrode layer 181 and the spacer layers 138, the parasitic capacitance between the gate structure 168 and the subsequently formed source/drain contact structure may be reduced, and the device performance may be enhanced.

The cap layer 182 may provide isolation for subsequently formed contact structure and conductive elements nearby. The cap layer 182 may be made of dielectric materials such as SiN, LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The cap layer 182 may be deposited in the recess 175 by CVD (such as HDP-CVD, PECVD, or HARP), ALD, another suitable method, and/or a combination thereof. After the cap layer 182 is deposited, a planarization process (e.g., a chemical mechanical polishing process or an etching back process) may optionally be performed to remove excess cap layer materials.

Next, a gate contact structure 188 is formed through the cap layer 182 and lands on the gate structure 168, and a source/drain contact structure 186 is formed through the ILD structure 150 and lands on the source/drain epitaxial structure 144 as shown in FIGS. 2Y, 2Y-1 and 2Y-2 in accordance with some embodiments More specifically, the gate contact structure 188 and the source/drain contact structure 186 may be formed separately. For example, a trench may be formed through the ILD structure 150 to expose the source/drain epitaxial structure 144 by performing an etching process. The source/drain epitaxial structure 144 exposed by the trench may be partially etched, so that the source/drain contact structure 186 formed afterwards may have a greater contact surface with the source/drain epitaxial structure 144. A silicide layer 184 may be formed over the source/drain structure 144 before the source/drain contact 186 is formed.

A source/drain opening is formed in the ILD structure 150, and a silicide layer 184 may be formed over the source/drain epitaxial structure 144, as shown in FIGS. 2Y, 2Y-1 and 2Y-2 in accordance with some embodiments. The silicide layer 184 may reduce the contact resistance between the source/drain epitaxial structure 144 and the subsequently formed source/drain contact structure over the source/drain epitaxial structure 144. The silicide layer 184 may be made of titanium silicide ($TiSi_2$), nickel silicide (NiSi), cobalt silicide (CoSi), or other suitable low-resistance materials.

The silicide layer 184 may be formed over the source/drain epitaxial structure 144 by forming a metal layer over the source/drain epitaxial structure 144 first. The metal layer may react with the source/drain epitaxial structure 144 in an annealing process and a silicide layer 184 may be produced. Afterwards, the unreacted metal layer may be removed in an etching process and the silicide layer 184 may be left.

Next, a barrier layer (not shown) may be conformally formed over the bottom surface and the sidewalls of the source/drain opening. Afterwards, the barrier layer may be etched back. The barrier layer remains over the bottom surface of the source/drain opening. The barrier layer may be formed before filling the conductive material in the source/drain opening to prevent the conductive material from diffusing out. The barrier layer may also serve as an adhesive or glue layer. The material of the barrier layer may be tantalum, titanium, titanium nitride, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a source/drain contact structure 186 is formed into the source/drain opening over the source/drain epitaxial structure 144, as shown in FIGS. 2Y, 2Y-1 and 2Y-2 in accordance with some embodiments. The source/drain contact structure 186 may be made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The source/drain contact structure 186 may be formed by a chemical vapor deposition process (CVD), a physical vapor deposition process (PVD), (e.g., evaporation or sputter), an atomic layer deposition process (ALD), a plasma enhanced CVD (PECVD), a plasma enhanced physical vapor deposition (PEPVD), an electroplating process, another suitable process, or a combination thereof to deposit the conductive materials of the source/drain contact structure 186, and then a planarization process such as a chemical mechanical polishing (CMP) process or an etch back process is optionally performed to remove excess conductive materials. After the planarization process, the top surface of the source/drain contact structure 186 may be level with the top surfaces of the ILD structure 150 and the spacer layers 138.

Similarly, the gate contact structure 188 may be formed by forming a trench exposing the second metal layer 180 and forming a conductive material. The gate contact structure 188 and the source/drain contact structure 186 may be made of the same conductive material. The gate contact structure 188 and the source/drain contact structure 186 may be formed by the same deposition process.

By forming an inverted T-shape gate structure 168, the cap layer 182 may extend into a space between the gate structure 168 and the spacer layers 138. Therefore, the parasitic capacitance between the gate structure 168 and the source/drain contact structure 186 may be reduced. The inverted T-shape gate structure 168 may be achieved by depositing different metal layers with different etching selectivity, which is compatible with current process.

Many variations and/or modifications may be made to the embodiments of the disclosure. FIGS. 3A-3E are cross-sectional representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A in accordance with some embodiments, the first metal layer 178 has a curved top surface.

In some embodiments, the middle portion of the first metal layer 178 is lower than the side portion of the first metal layer 178. In some embodiments, the first metal layer 178 has a concave top surface.

Figure 3A:
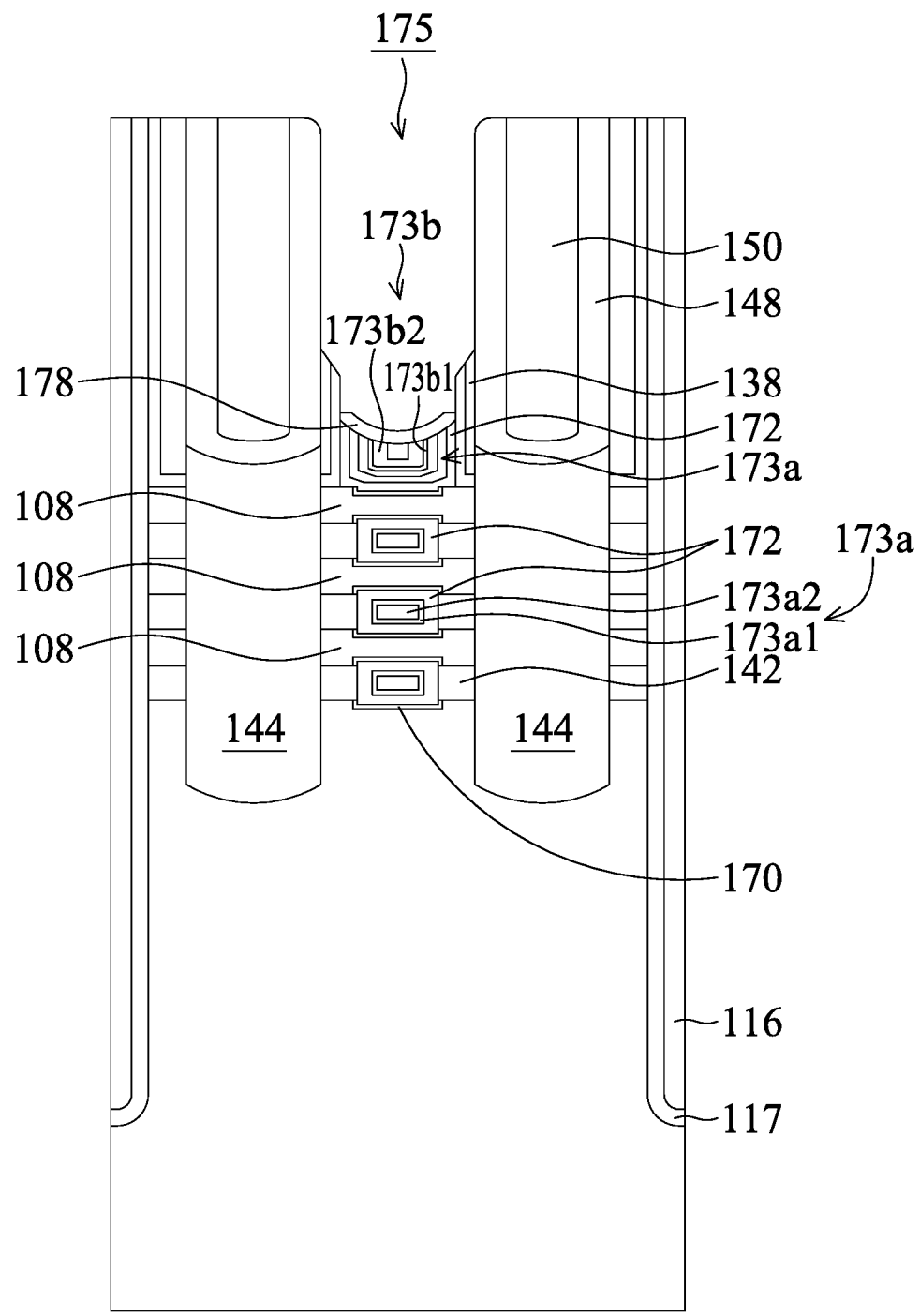
FIGS. 3A-3E are perspective representations of various stages of forming a semiconductor device structure, in accordance with some embodiments of the disclosure.
Figure 3B:
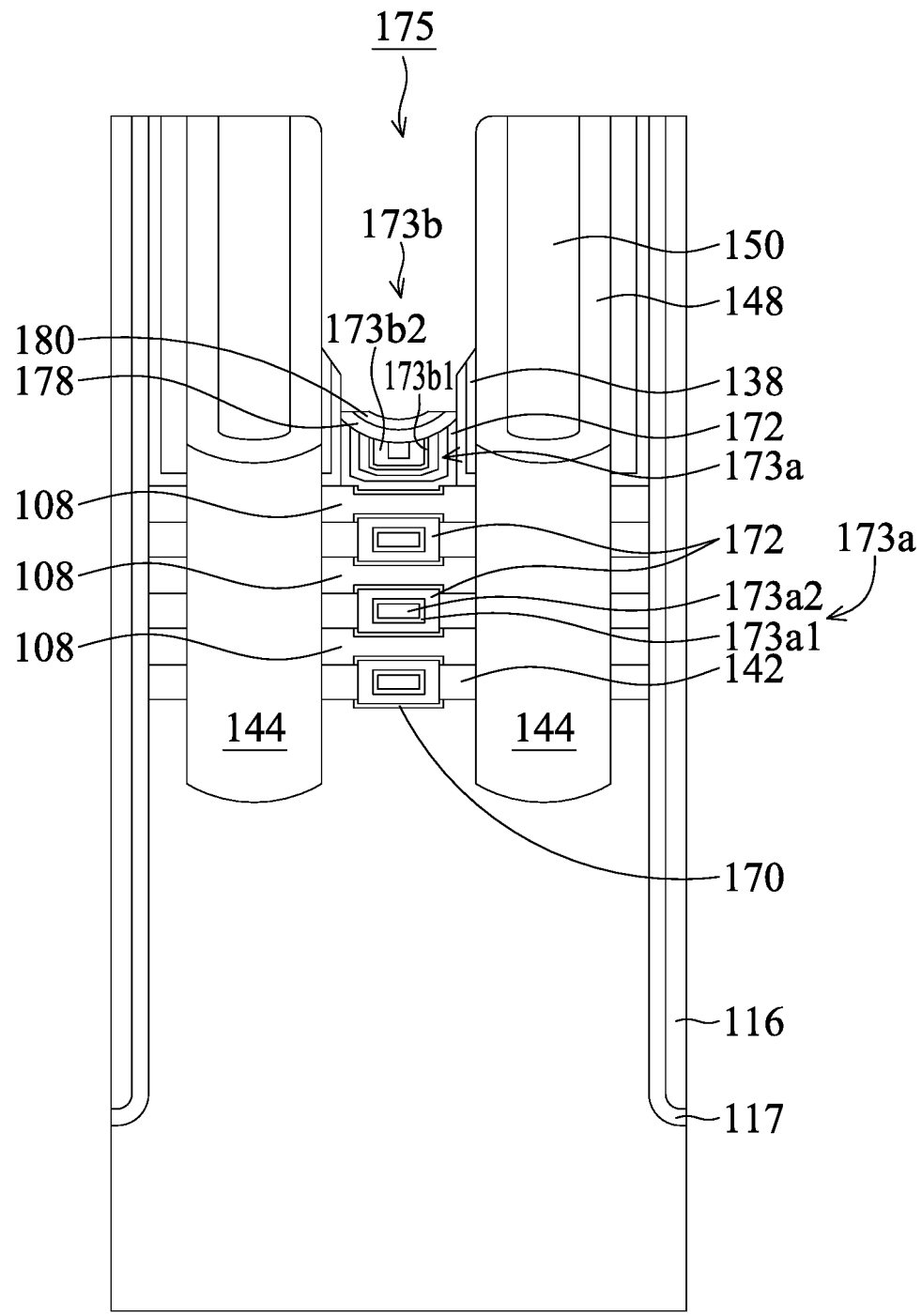

Next, a second metal layer 180 is formed over the first metal layer 178, as shown in FIG. 3B in accordance with some embodiments. In some embodiments, the second metal layer 180 has a curved bottom surface and a curved top surface. In some embodiments, the second metal layer 180 has a concave top surface. In some embodiments, the second metal layer 180 is narrower than the first metal layer 178. The side portions of the first metal layer 178 may be exposed.

Figure 3C:
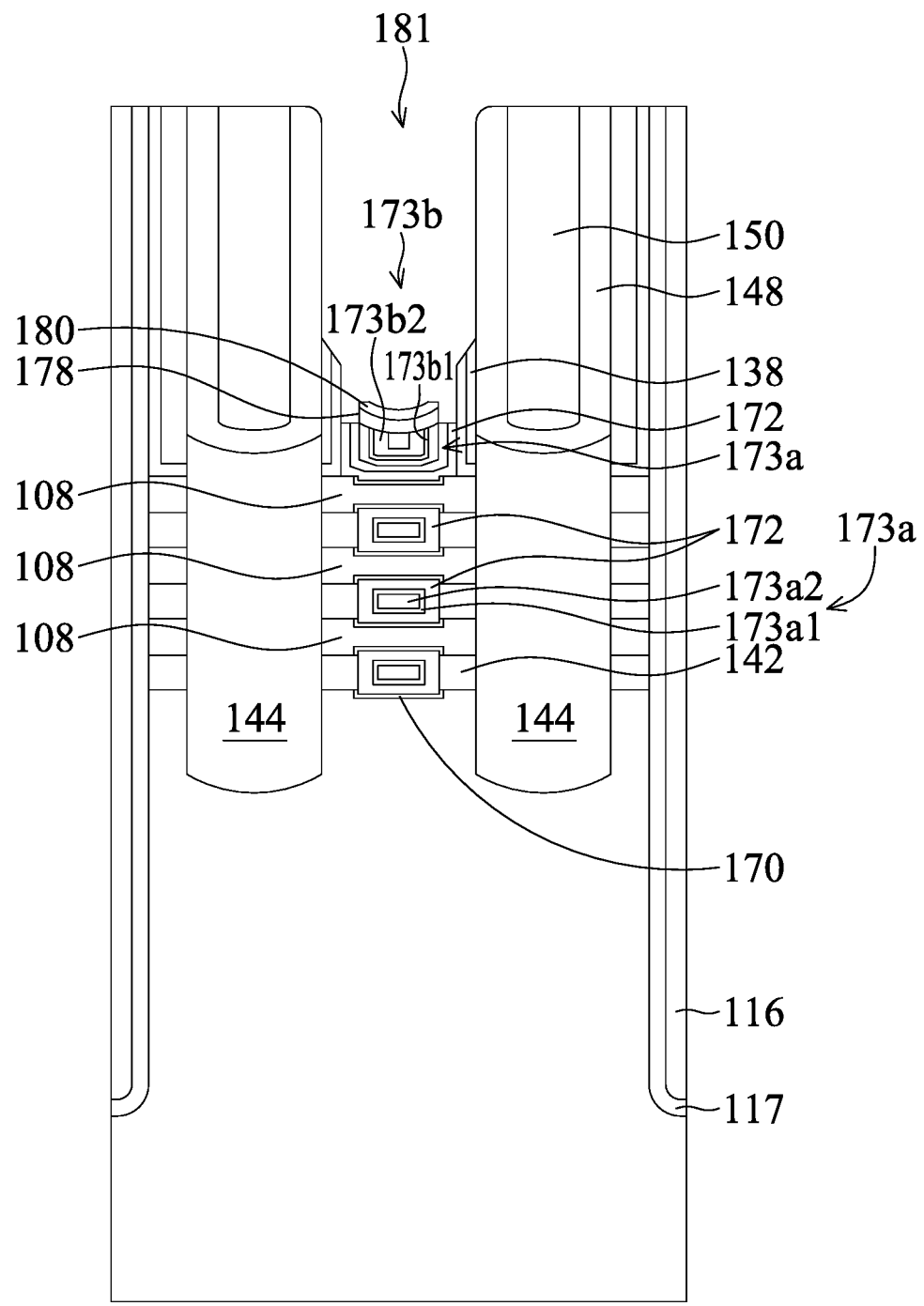

Next, the first metal layer 178 formed over opposite sides of the second metal layer 180 is selectively etched, as shown in FIG. 3C in accordance with some embodiments. In some embodiments, a gate electrode layer 181 with curved top surface is formed after the etching process.

Figure 3D:
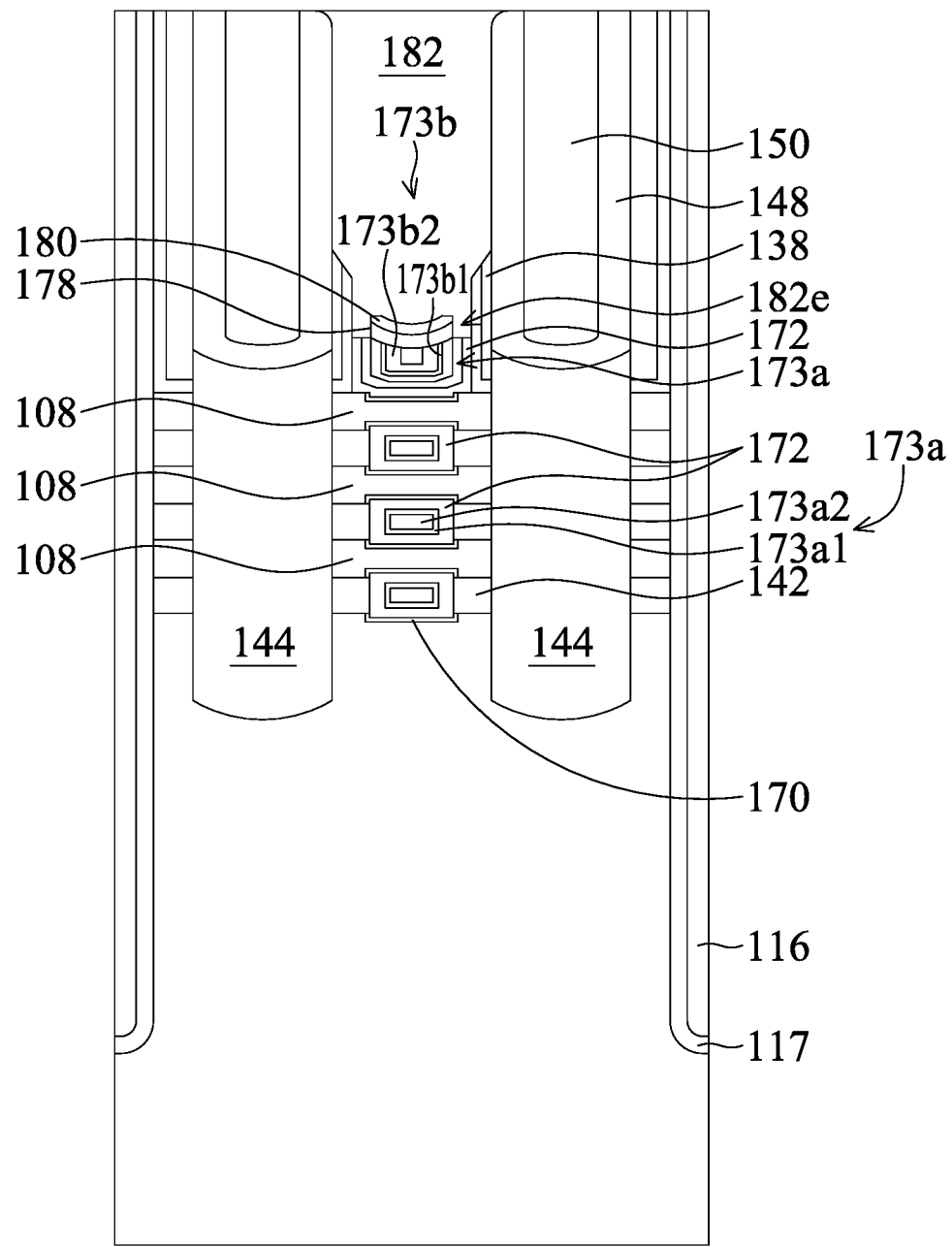
Figure 3E:
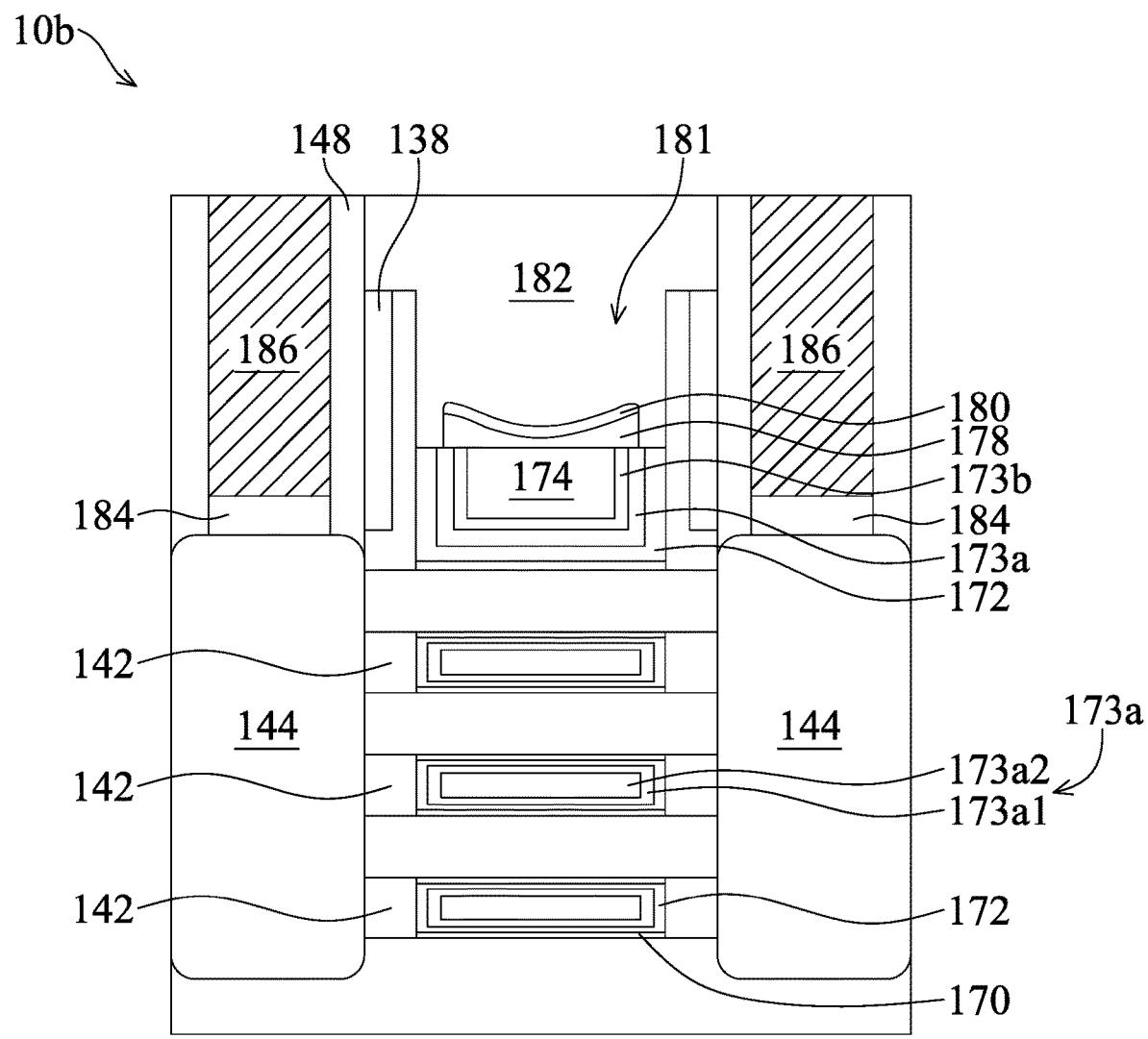

Afterwards, a cap layer 182 with extending portions 182e is formed over the inverted T-shape gate structure 168, as shown in FIG. 3D in accordance with some embodiments. The source/drain contact structure 186 is formed after forming the cap layer 182, as shown in FIG. 3E in accordance with some embodiments. The processes for selectively etching the first metal layer 178 and forming the cap layer 182 with extending portions 182e may be the same as, or similar to, those used to selectively etch the first metal layer 178 and form the cap layer 182 in the previous embodiments. For the purpose of brevity, the descriptions of these processes are not repeated herein.

By forming an inverted T-shape gate structure 168, the cap layer 182 may extend into a space between the gate structure 168 and the spacer layers 138. Therefore, the parasitic capacitance between the gate structure 168 and the source/drain contact structure 186 may be reduced. The inverted T-shape gate structure 168 may be achieved by depositing different metal layers with different etching selectivity, which is compatible with current process. The first metal layer 178 and the second metal layer 180 in the gate electrode layer 181 of the inverted T-shape gate structure 168 may have curved top surfaces.

Figure 4A:
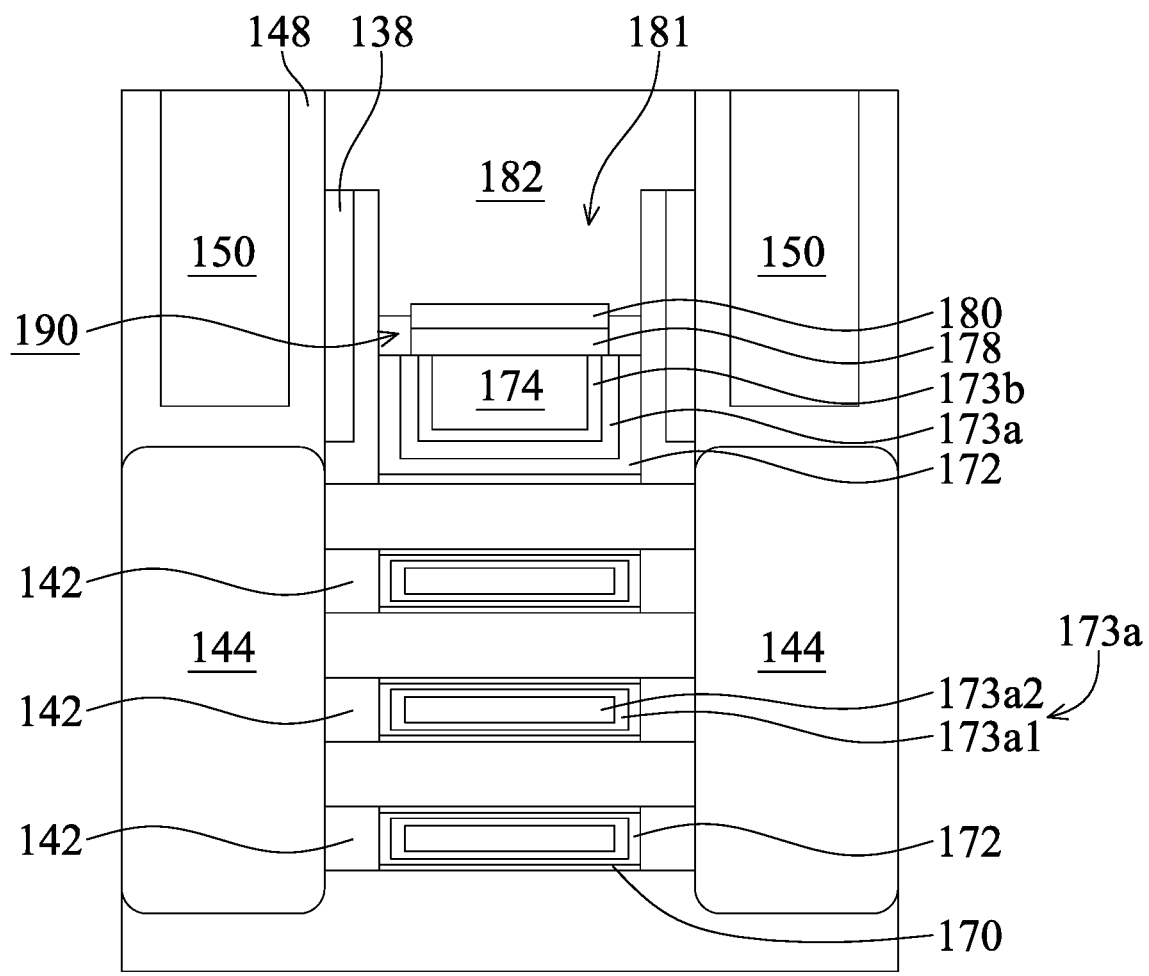
FIGS. 4A-4B are perspective representations of various stages of forming a semiconductor device structure, in accordance with some embodiments of the disclosure.
Figure 4B:
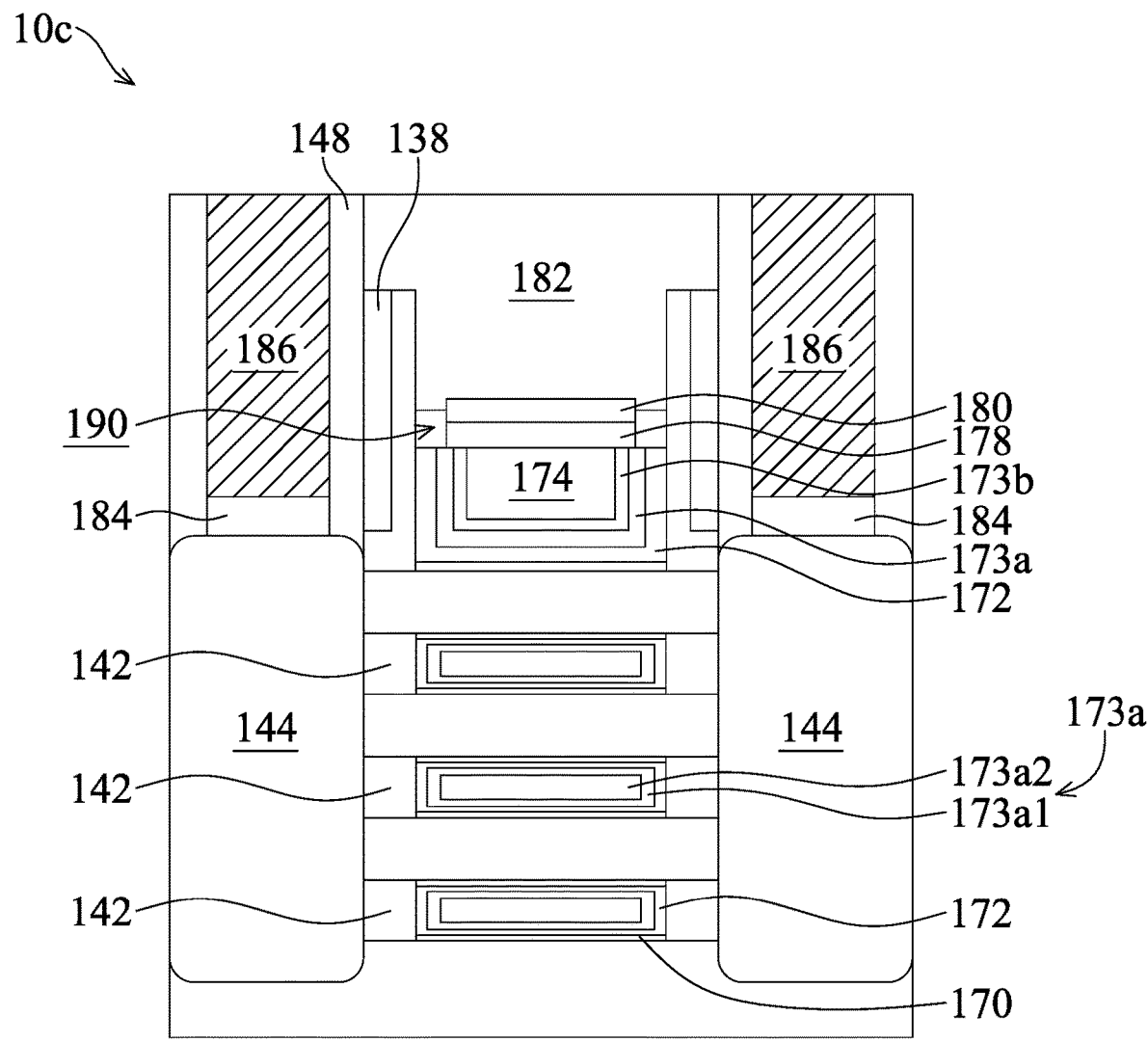

Many variations and/or modifications may be made to the embodiments of the disclosure. FIGS. 4A-4B are cross-sectional representations of various stages of forming a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, and air gap 190 may be formed beside the first metal layer 178 of the gate electrode layer 181 when forming the cap layer 182.

In some embodiments, the air gap 190 is formed between the cap layer 182 and the gate structure 168. In some embodiments, the cap layer 182 may be partially filled between the second metal layer 180 and the spacer layers 138. In some embodiments, the cap layer 182 is in contact with a portion of the sidewall of the second metal layer 180. In some embodiments, the cap layer 182 is separated from the first work function layer 173a and the second work function layer 173b.

The source/drain contact structure 186 is formed after forming the cap layer 182, as shown in FIG. 4B in accordance with some embodiments. The air gap 190 formed between the first metal layer 178 and the source/drain contact structure 186 may help to further reduce parasitic capacitance since the k-value of the air is lower than the k-value of the cap layer 182. Therefore, partially forming the cap layer 182 between the gate electrode layer 181 of the inverted T-shaped gate structure 168 and the source/drain contact structure 186 may further decrease the parasitic capacitance.

It should be noted that the size of the air gap 190 shown in FIG. 4A is merely an example, and the air gap 190 is not limited herein. The cap layer 182 may partially cover the sidewall of the first metal layer 178, depending on the process capability.

By forming an inverted T-shape gate structure 168, the cap layer 182 may extend into a space between the gate structure 168 and the spacer layers 138. Therefore, the parasitic capacitance between the gate structure 168 and the source/drain contact structure 186 may be reduced. The inverted T-shape gate structure 168 may be achieved by depositing different metal layers with different etching selectivity, which is compatible with current process. Forming an air gap 190 between the gate electrode layer 181 of the inverted T-shape gate structure 168 and the source/drain contact structure 186, the parasitic capacitance may be further reduced.

Many variations and/or modifications may be made to the embodiments of the disclosure. FIGS. 5A-5D are cross-sectional representations of various stages of forming a semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, a third metal layer 192 is formed between the first metal layer 178 and the second metal layer 180.

Figure 5A:
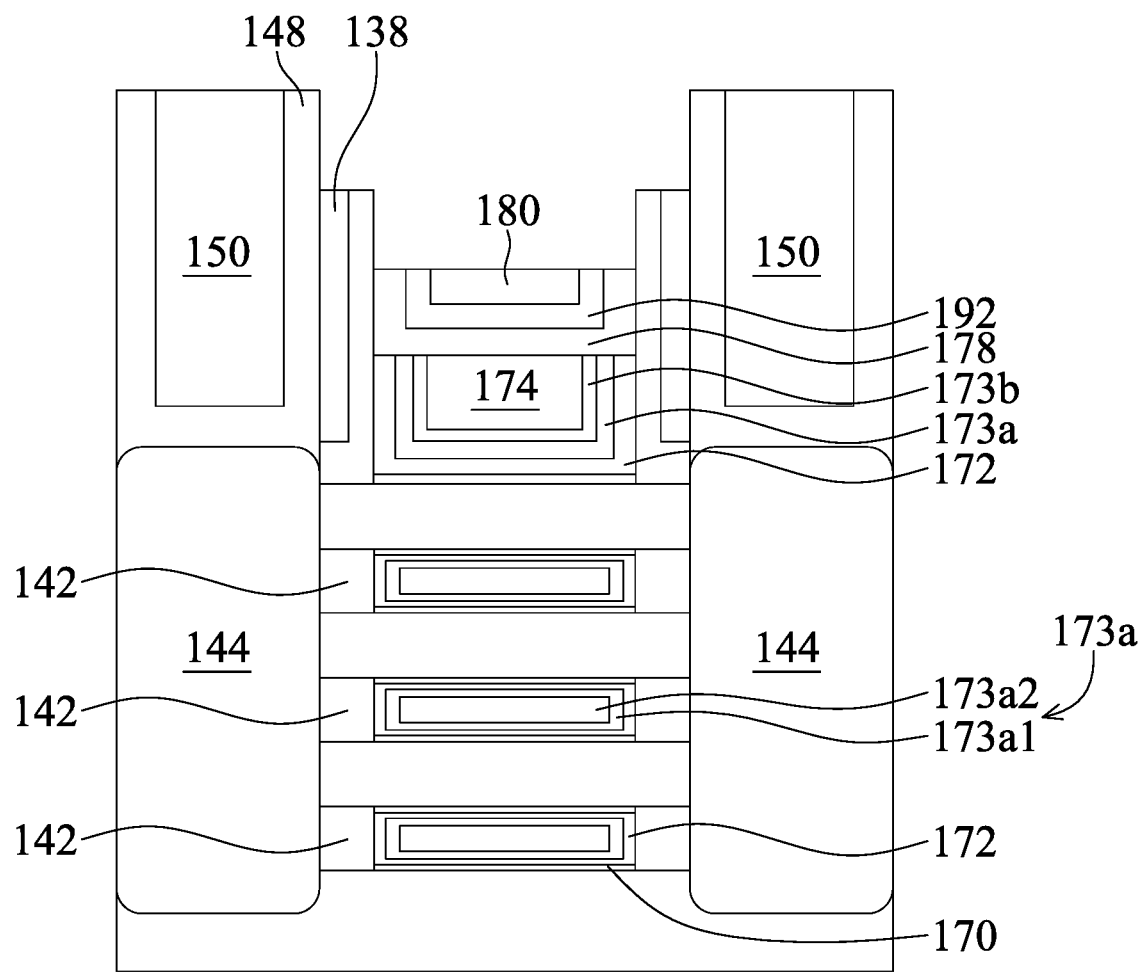
FIGS. 5A-5D are perspective representations of various stages of forming a semiconductor device structure, in accordance with some embodiments of the disclosure.

In some embodiments as shown in FIG. 5A, after forming the first metal layer 178 with a U-shape in the cross-sectional view, the third metal layer 192 with a U-shape in the cross-sectional view is formed over the first metal layer 178. Later, the second metal layer 180 is formed over the third metal layer 192. The third metal layer 192 may be surrounded by the first metal layer 178, and the second metal layer 180 may be surrounded by the third metal layer 192. In some embodiments, the third metal layer 192 may be separated from the spacer layers 138.

In some embodiments, the third metal layer 192, the first metal layer 178, and the second metal layer 180 are made of different materials with different etching selectivity. In some embodiments, the third metal layer 192 is made of metal such as Ru, TiN, TaN, Co, Ti, TiAl, W, aluminum, copper, titanium, tantalum, molybdenum, nickel silicide, cobalt silicide, WN, TiAl, TiAlN, TaCN, TaC, TaSiN, metal alloys, another suitable material, or the like. The third metal layer 192 may be formed by using CVD, ALD, electroplating, another applicable method, or a combination thereof.

Afterwards, the first metal layer 178, the second metal layer 180, and the third metal layer 192 is etched back to remove excess materials of the first metal layer 178, the second metal layer 180, and the third metal layer 192, so that the top surfaces of first metal layer 178, the second metal layer 180, and the third metal layer 192 are substantially at the same level, as shown in FIG. 5A in accordance with some embodiments.

Figure 5B:
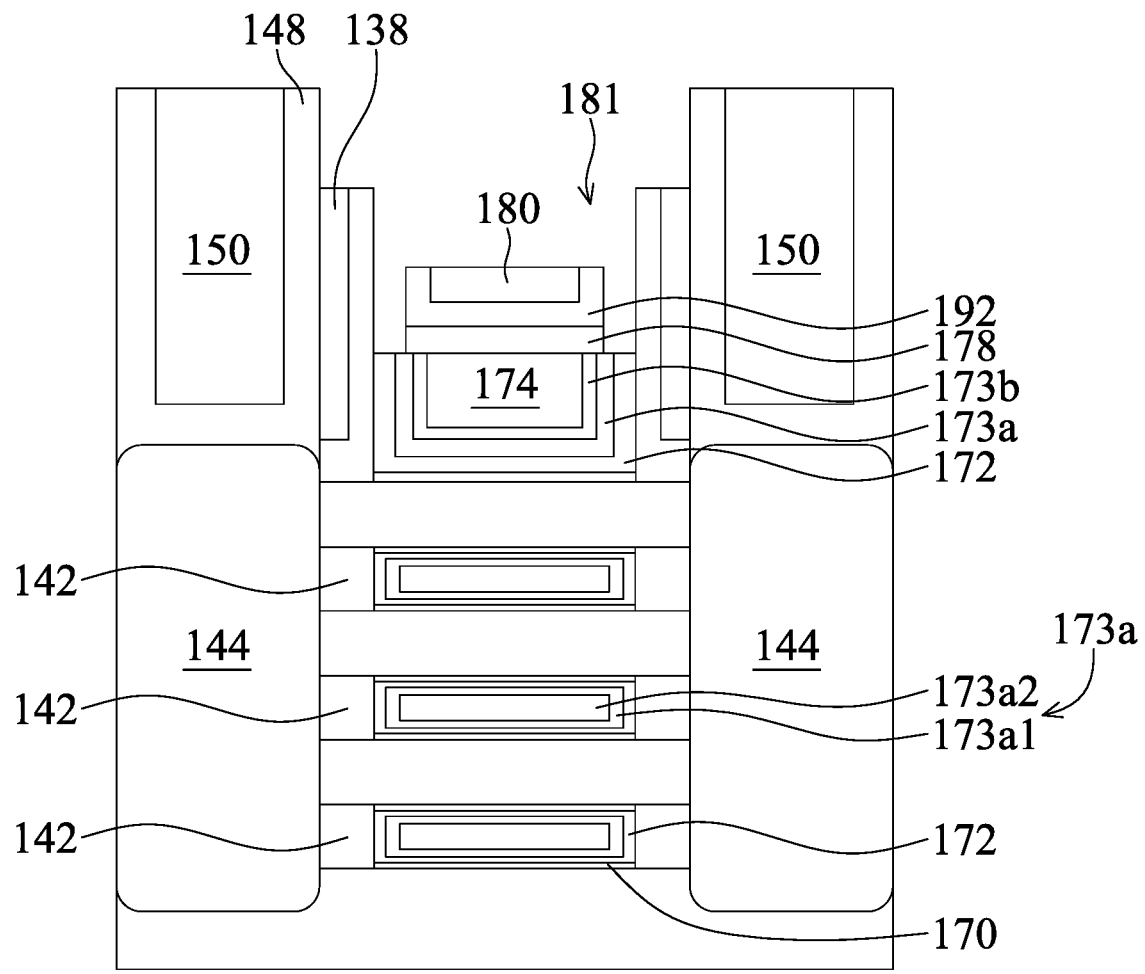
Figure 5C:
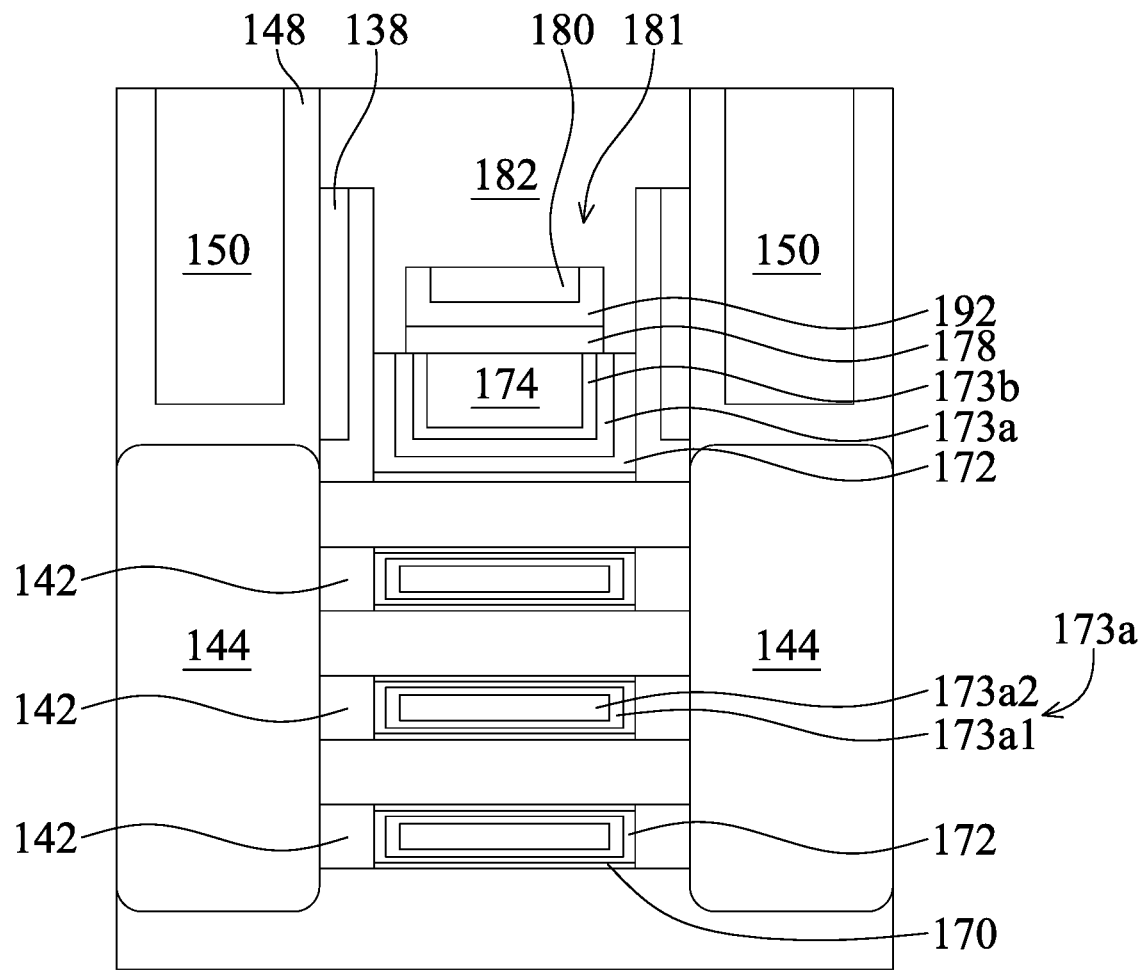

Next, the first metal layer 178 formed over opposite sides of the second metal layer 180 and the third metal layer 192 is selectively etched, as shown in FIG. 5B in accordance with some embodiments. In some embodiments, an inverted T-shape gate structure 168 with a gate electrode layer 181 is formed after the etching process. In some embodiments, the gate electrode layer 181 includes the third metal layer 192 surrounding the second metal layer 181 formed over the first metal layer 178.

After the etching process, the top surfaces of the third metal layer 192 and the second metal layer 180 may be exposed. In addition, the sidewalls of the first metal layer 178 and the third metal layer 192 may be also exposed. The inverted T-shape gate structure 168 with an extra third metal layer 192 may provide flexibility to modify the gate resistance. The source/drain contact structure 186 is formed after forming the cap layer 182, as shown in FIG. 5D in accordance with some embodiments.

Figure 5D:
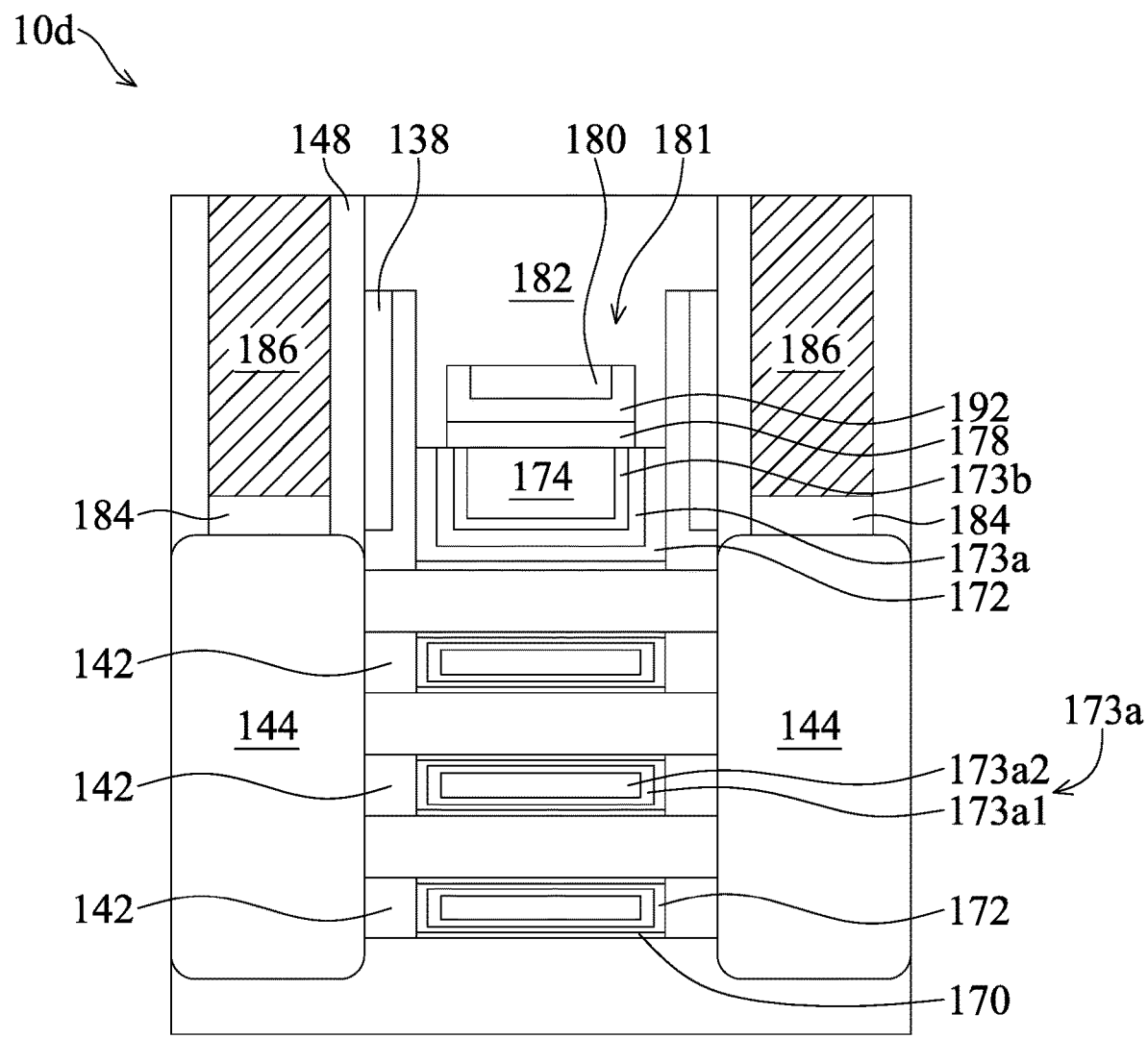

It should be noted that, the number of the metal layers 178/192/180 of the gate electrode layer 181 of the inverted T-shape gate structure 168 shown in FIG. 5D is merely an example, and the number of the metal layers of the inverted T-shape gate structure 168 is not limited herein, depending on the demands. The combination of different metal layers 178/192/180 may result in different gate resistance.

By forming an inverted T-shape gate structure 168, the cap layer 182 may extend into a space between the gate structure 168 and the spacer layers 138. Therefore, the parasitic capacitance between the gate structure 168 and the source/drain contact structure 186 may be reduced. The inverted T-shape gate structure 168 may be achieved by depositing different metal layers with different etching selectivity, which is compatible with current process. The gate electrode layer 181 of the inverted T-shape gate structure 168 with multi-layers such as the first metal layer 178, the second metal layer 180, and the third metal layer 192 may provide flexibility to modify the gate resistance.

Figure 6A:
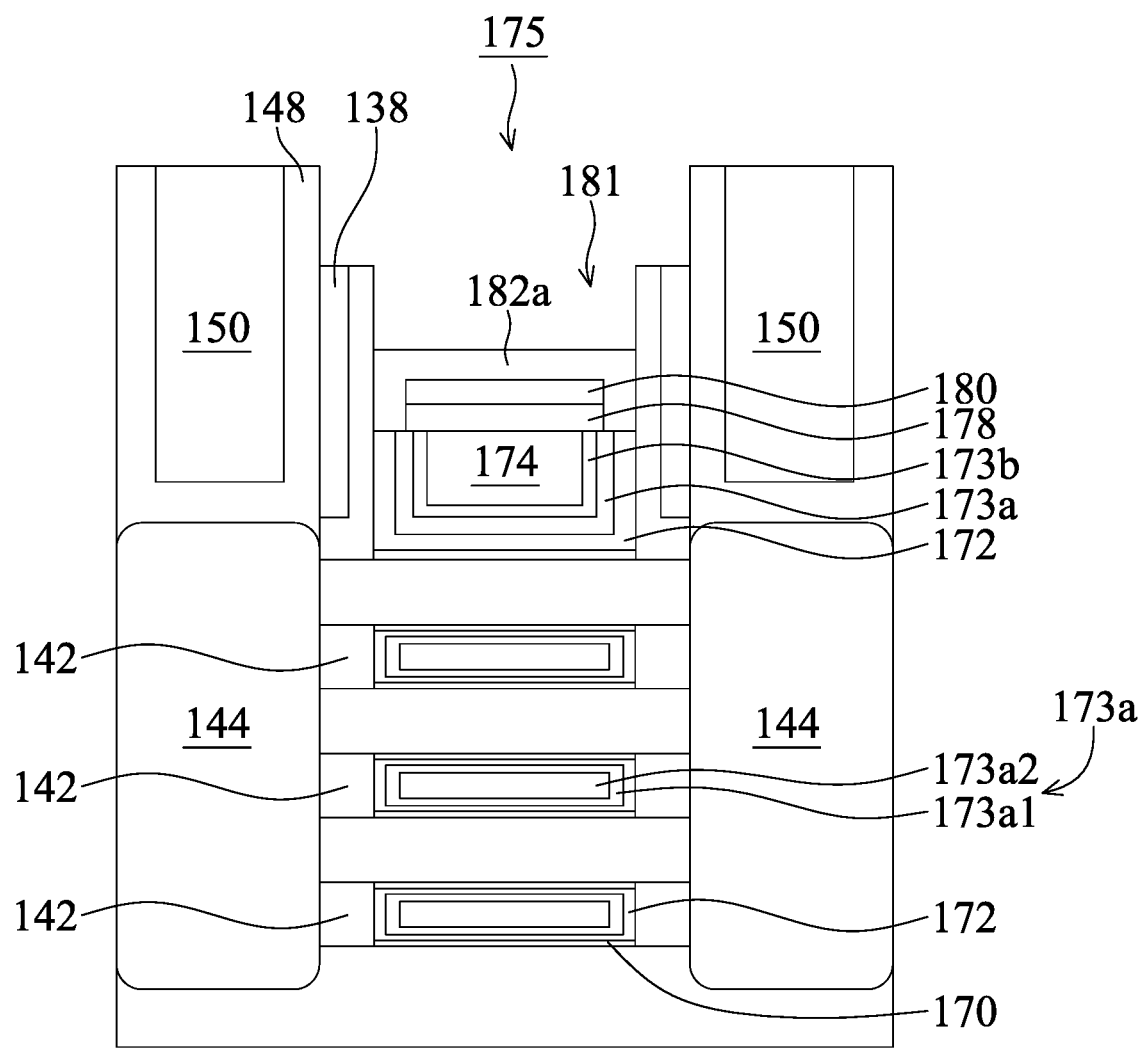
FIGS. 6A-6C are perspective representations of various stages of forming a semiconductor device structure, in accordance with some embodiments of the disclosure.
Figure 6B:
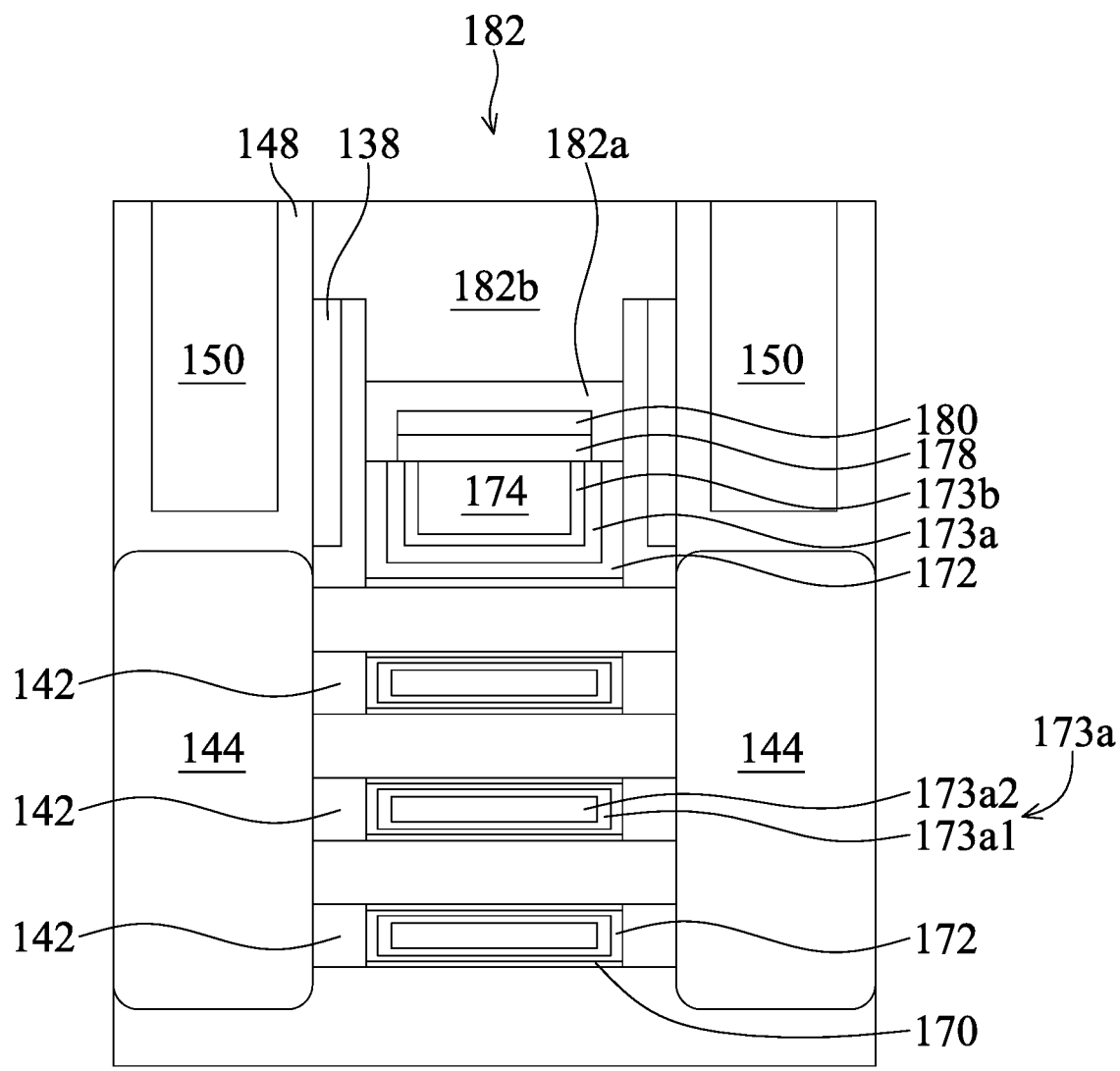
Figure 6C:
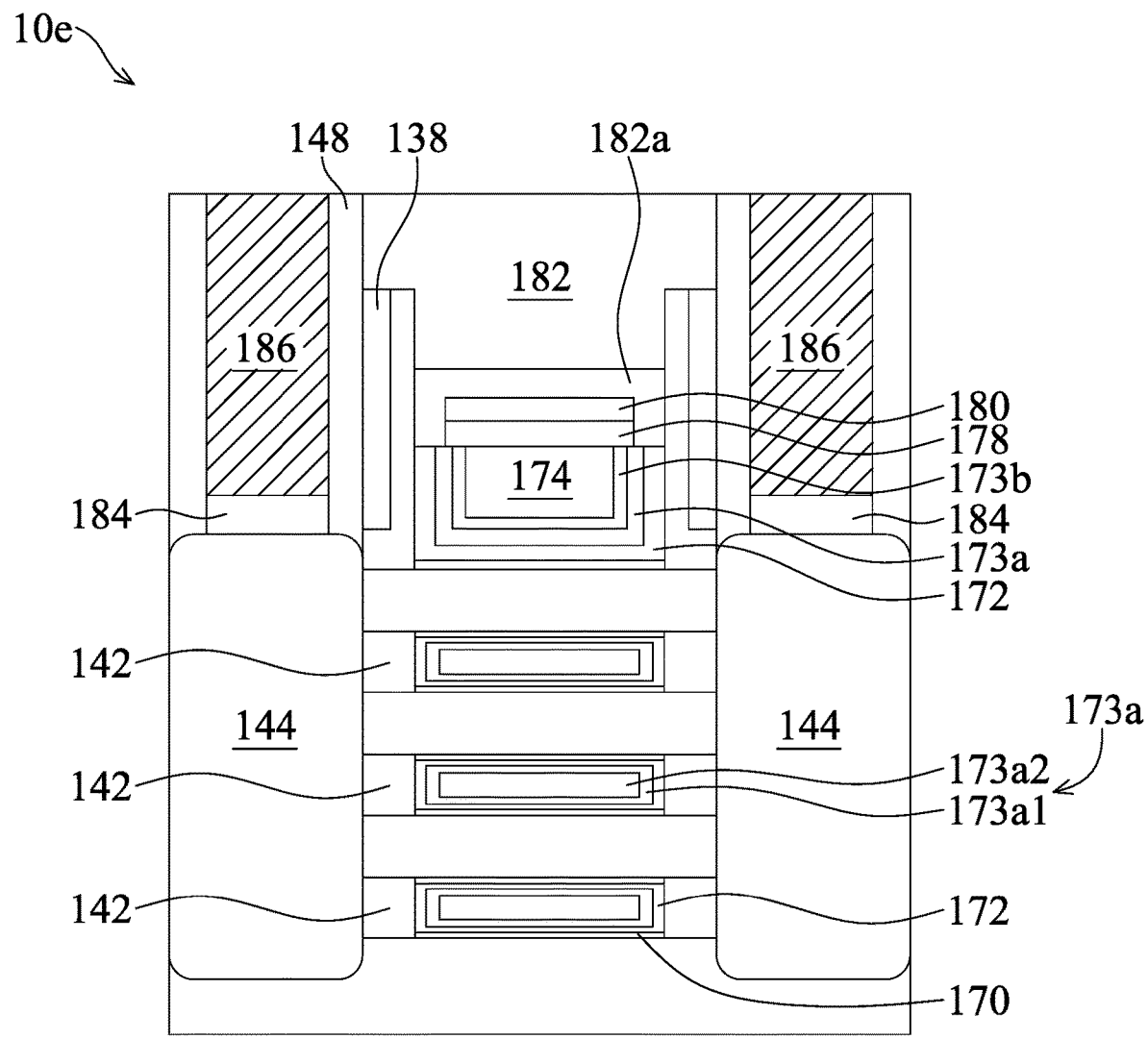

Many variations and/or modifications may be made to the embodiments of the disclosure. FIGS. 6A-6C are cross-sectional representations of various stages of forming a semiconductor device structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A in accordance with some embodiments, the first cap layer 182a only partially fill the recess 175 between the spacer layers 138.

In some embodiments as shown in FIG. 6A, the first cap layer 182a fills up the space between the first metal layer 178 of the gate electrode layer 181 and the spacer layers 138. In some embodiments, the top surface of the first cap layer 182a is lower than the top surface of the spacer layers 138. The first cap layer 182a may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The first cap layer 182a may be deposited in the recess 175 by CVD (such as HDP-CVD, PECVD, or HARP), ALD, another suitable method, and/or a combination thereof.

Next, a second cap layer 182b is formed over the first cap layer 182a in the recess 175 between the spacer layers 138, as shown in FIG. 6B in accordance with some embodiments. In some embodiments, the first cap layer 182a and the second cap layer 182b are made of different materials. The cap layer structure 182 is a multi-layer structure including the first cap layer 182a and the second cap layer 182b. The multi-layer cap layer structure 182 may provide flexibility to modify the parasitic capacitance. The source/drain contact structure 186 is formed after forming the cap layer 182, as shown in FIG. 6C in accordance with some embodiments.

It should be noted that, the number of the cap layers 182a and 182b of the shown in FIG. 6C is merely an example, and the number of the cap layers is not limited herein, depending on the demands. The combination of different cap layers 182a and 182b may result in different capacitance.

By forming an inverted T-shape gate structure 168, the cap layer 182 may extend into a space between the gate structure 168 and the spacer layers 138. Therefore, the parasitic capacitance between the gate structure 168 and the source/drain contact structure 186 may be reduced. The inverted T-shape gate structure 168 may be achieved by depositing different metal layers with different etching selectivity, which is compatible with current process. The multilayer cap layer structure 182a and 182b may provide flexibility to modify the parasitic capacitance.

As described previously, an inverted T-shape gate structure 168 is formed by forming gate electrode layer 181 with different metal layers with etching selectivity. The cap layer 182 may be formed between the inverted T-shape gate structure 168 and the source/drain contact structures 186. Therefore, the parasitic capacitance may be reduced and the device performance may be enhanced. In some embodiments as shown in FIG. 3E, the gate electrode layer 181 of the inverted T-shape gate structure 168 have curved top surfaces. In some embodiments as shown in FIG. 4B, an air gap 190 is formed between the inverted T-shape gate structure 168 and the source/drain contact structures 186. The parasitic capacitance is further reduced with the air gap 190. In some embodiments as shown in FIG. 5D, multiple metal layers 178, 180, and 192 are formed in the gate electrode layer 181 of the inverted T-shape gate structure 168. With more metal layers formed in the gate electrode layer 181 of the inverted T-shape gate structure 168, there is more flexibility to modify the gate resistance. In some embodiments as shown in FIG. 6C, multiple cap layers 182a and 182b cover the inverted T-shape gate structure 168. With multiple cap layers 182a and 182b formed over the inverted T-shape gate structure 168, the there is more flexibility to modify the parasitic capacitance.

Embodiments of a semiconductor device structure and a method for forming the same are provided. By depositing metal layers with different etching selectivity, an inverted T-shape gate structure is formed after a selective etching process. The cap layer may extend in the space between the inverted T-shape gate structure and the source/drain contact structure. The parasitic capacitance may be reduced and the device performance may be enhanced.

In some embodiments, a method for forming a semiconductor device structure is provided. The method for forming a semiconductor device structure includes forming nanostructures over a substrate. The method for forming a semiconductor device structure also includes forming a work function layer surrounding the nanostructures. The method for forming a semiconductor device structure also includes forming spacers over opposite sides of the work function layer. The method for forming a semiconductor device structure also includes forming a first metal layer over the work function layer and sidewalls of the spacers. The method for forming a semiconductor device structure also includes forming a second metal layer surrounded by the first metal layer. The method for forming a semiconductor device structure also includes etching the first metal layer over opposite sides of the second metal layer. The method for forming a semiconductor device structure also includes forming a cap layer over the top surface and sidewall of the second metal layer.

In some embodiments, a method for forming a semiconductor device structure is provided. The method for forming a semiconductor device structure includes forming a fin structure with alternating stacked first semiconductor layers and second semiconductor layers over a substrate. The method for forming a semiconductor device structure also includes removing the first semiconductor layers to form a gate opening between the second semiconductor layers. The method for forming a semiconductor device structure also includes depositing a work function layer in the gate opening surrounding the second semiconductor layers. The method for forming a semiconductor device structure also includes forming a first metal layer with a recess over the work function layer. The method for forming a semiconductor device structure also includes forming a second metal layer in the recess. The method for forming a semiconductor device structure also includes removing the first metal layer over opposite sides of the second metal layer. The method for forming a semiconductor device structure also includes forming a cap layer covering the first metal layer and the second metal layer.

In some embodiments, a semiconductor device structure is provided. The semiconductor device structure includes nanostructures formed over a substrate. The semiconductor device structure also includes a gate structure surrounding the nanostructures. The semiconductor device structure also includes spacers formed over opposite sides of the gate structure over the nanostructures. The semiconductor device structure also includes a first metal layer formed over the gate structure. The semiconductor device structure also includes a second metal layer formed over the first metal layer. The semiconductor device structure also includes a first cap layer formed over the second metal layer. The first cap layer has an extending portion between the second metal layer and the spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming nanostructures over a substrate;
    forming spacers over the nanostructures;
    forming a work function layer surrounding the nanostructures;
    forming a first metal layer over the work function layer and sidewalls of the spacers;
    forming a second metal layer surrounded by the first metal layer;
    etching the first metal layer over opposite sides of the second metal layer; and
    forming a cap layer over a top surface and a sidewall of the second metal layer, wherein a bottom surface of the cap layer is lower a bottom surface of the second metal layer.

2. The method for forming the semiconductor device structure as claimed in claim 1, wherein the first metal layer has a different etching selectivity than the second metal layer.

3. The method for forming the semiconductor device structure as claimed in claim 1, wherein a top surface of the work function layer is exposed after etching the first metal layer.

4. The method for forming the semiconductor device structure as claimed in claim 1, wherein the cap layer is in contact with a top surface of the work function layer.

5. The method for forming the semiconductor device structure as claimed in claim 1, wherein the top surface of the cap layer is lower than a top surface of the spacers.

6. The method for forming the semiconductor device structure as claimed in claim 5, further comprising:
    forming a second cap layer over the first-cap layer,
    wherein the cap layer and the second cap layer are made of different materials.

7. The method for forming the semiconductor device structure as claimed in claim 1, wherein the cap layer covers a top surface of the spacers.

8. The method for forming the semiconductor device structure as claimed in claim 1, wherein the cap layer is in contact with an interface between the first metal layer and the second metal layer.

9. The method for forming the semiconductor device structure as claimed in claim 1, wherein the bottom surface of the cap layer is lower than an interface between the first metal layer and the second metal layer.

10. A method for forming a semiconductor device structure, comprising:
    forming a fin structure with alternating stacked first semiconductor layers and second semiconductor layers over a substrate;
    removing the first semiconductor layers to form a gate opening between the second semiconductor layers;
    depositing a work function layer in the gate opening surrounding the second semiconductor layers;
    forming a first metal layer with a recess over the work function layer;
    forming a second metal layer in the recess;
    removing the first metal layer over opposite sides of the second metal layer; and
    forming a cap layer covering the first metal layer and the second metal layer, wherein a bottom surface of the cap layer is lower than top surface of the first metal layer.

11. The method for forming the semiconductor device structure as claimed in claim 10, further comprising:
    forming a third metal layer in the recess;
    wherein the second metal layer is surrounded by the third metal layer.

12. The method for forming the semiconductor device structure as claimed in claim 11, further comprising:
    etching back the first metal layer, the second metal layer, and the third metal layer.

13. The method for forming the semiconductor device structure as claimed in claim 10, wherein the cap layer is in contact with a portion of the sidewall of the second metal layer.

14. A method for forming a semiconductor device structure, comprising:
    forming nanostructures over a substrate;
    forming spacers over the nanostructures;
    forming a work function layer between the spacers;
    depositing a first metal layer over the work function layer;
    depositing a second metal layer over the first metal layer; and
    forming a cap layer covering the second metal layer and having an extending portion between the second metal layer and the spacers, wherein the cap layer has a first bottom surface in contact with the work function layer and a second bottom surface in contact with the second metal layer, and the first bottom surface is lower than the second bottom surface.

15. The method for forming the semiconductor device structure as claimed in claim 14, further comprising:
    partially removing the first metal layer so that a sidewall of the first metal layer is substantially aligned with a sidewall of the second metal layer.

16. The method for forming the semiconductor device structure as claimed in claim 14, wherein the first metal layer and the second metal layer have curved top surfaces.

17. The method for forming the semiconductor device structure as claimed in claim 14, further comprising:
   forming an air gap formed between the extending portion of the cap layer and the work function layer.

18. The method for forming the semiconductor device structure as claimed in claim 14, further comprising:
   forming a third metal layer after forming the first metal layer and before forming the second metal layer; and
   partially removing the first metal layer so that a sidewall of the first metal layer is substantially aligned with a sidewall of the second metal layer and substantially aligned with a sidewall of the third metal layer.

19. The method for forming the semiconductor device structure as claimed in claim 18, wherein the third metal layer is separated from the spacers by the extending portion of the cap layer.

20. The method for forming the semiconductor device structure as claimed in claim 14, further comprising:
   forming a second cap layer over the cap layer and covering the spacers.

* * * * *